United States Patent
Park

(10) Patent No.: US 7,126,180 B2
(45) Date of Patent: Oct. 24, 2006

(54) SEMICONDUCTOR DEVICE INCLUDING A CAPACITOR HAVING IMPROVED STRUCTURAL STABILITY AND ENHANCED CAPACITANCE, AND METHOD OF MANUFACTURING THE SEMICONDUCTOR DEVICE

(75) Inventor: Je-Min Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/916,672

(22) Filed: Aug. 11, 2004

(65) Prior Publication Data

US 2005/0040448 A1 Feb. 24, 2005

(30) Foreign Application Priority Data

Aug. 18, 2003 (KR) ............... 10-2003-0056959

(51) Int. Cl.
*H01L 27/108* (2006.01)
(52) U.S. Cl. ............... 257/303; 257/296; 257/311; 257/E27.086
(58) Field of Classification Search ............... 257/296, 257/303, 311, E27.086
See application file for complete search history.

(56) References Cited

U.S. PATENT DOCUMENTS

| | | | |
|---|---|---|---|
| 6,150,690 A | 11/2000 | Ishibashi et al. | |
| 6,162,670 A | 12/2000 | Wu et al. | |
| 6,251,770 B1 | 6/2001 | Uglow et al. | |
| 6,303,956 B1 * | 10/2001 | Sandhu et al. | 257/306 |
| 6,395,600 B1 * | 5/2002 | Durcan et al. | 438/253 |
| 6,403,418 B1 * | 6/2002 | Wang et al. | 438/253 |
| 6,403,442 B1 * | 6/2002 | Reinberg | 438/396 |
| 6,489,195 B1 * | 12/2002 | Hwang et al. | 438/238 |
| 6,617,222 B1 * | 9/2003 | Coursey | 438/398 |
| 6,667,502 B1 * | 12/2003 | Agarwal et al. | 257/296 |
| 6,822,280 B1 * | 11/2004 | Ito et al. | 257/296 |
| 2002/0047201 A1 | 4/2002 | Suzuki | |
| 2003/0085420 A1 | 5/2003 | Ito et al. | |
| 2003/0136996 A1 | 7/2003 | Park | |

FOREIGN PATENT DOCUMENTS

| | | |
|---|---|---|
| JP | 10-144883 | 2/2000 |
| KR | 2001-0069118 | 7/2001 |
| KR | 2002-0085223 | 11/2002 |

OTHER PUBLICATIONS

English Language Abstract of Japan Publication No: 10-144883.
English Language Abstract of Korean Publication No: 2002-0085223.
English language abstract of Korean Publication No. 2001-0069118.

* cited by examiner

*Primary Examiner*—Eugene Lee
(74) *Attorney, Agent, or Firm*—Marger, Johnson, & McCollom, P.C.

(57) ABSTRACT

In a method of manufacturing a semiconductor device including a capacitor having improved structural stability and enhanced capacitance, a contact region is formed on a surface portion of a semiconductor substrate. After a mold layer is formed on the substrate, a stabilizing member is formed to encompass a storage electrode. A contact hole is formed through the mold layer to expose a sidewall of the stabilizing member and the contact region. The storage electrode is formed on the exposed contact region and on the exposed sidewall of the stabilizing member. A dielectric layer and a plate electrode are successively formed on the storage electrode. The capacitor including the storage electrode and the stabilizing member will have improved structural stability that resists mechanical collapse even when the capacitor has an extremely high aspect ratio.

17 Claims, 43 Drawing Sheets

US 7,126,180 B2

SEMICONDUCTOR DEVICE INCLUDING A CAPACITOR HAVING IMPROVED STRUCTURAL STABILITY AND ENHANCED CAPACITANCE, AND METHOD OF MANUFACTURING THE SEMICONDUCTOR DEVICE

CROSS REFERENCE TO RELATED APPLICATION

This application claims priority under 35 USC § 119 to Korean Patent Application No. 2003-56959 filed on Aug. 18, 2003, the content of which is incorporated herein by reference in its entirety.

BACKGROUND OF THE INVENTION

1. Field of the Invention

The present invention relates to a semiconductor device and a method of manufacturing the semiconductor device. More particularly, the present invention relates to a semiconductor device including an improved structural stability and an enhanced capacitance, and a method of manufacturing the semiconductor device.

2. Description of the Related Art

In general, semiconductor memory devices such as dynamic random access memory (DRAM) devices or static random access memory (SRAM) devices can store data or information therein. The data or information is stored in the semiconductor memory devices, and also the data or information is read from the semiconductor memory devices. A typical single unit memory cell of the semiconductor memory device includes one capacitor and one transistor. The capacitor of the semiconductor memory device generally has a storage electrode, a dielectric layer, and a plate electrode. To improve the storage capacity of the semiconductor memory device, the capacitor needs a large capacitance.

As the degree of integration of the semiconductor memory device has increased, the unit memory cell of the semiconductor memory device has continuously decreased in area. To ensure a sufficient storage capacitance of the semiconductor memory device, the capacitor may have various shapes such as a box, a fin, a crown, a cylinder, etc. However, due to design constraints of the semiconductor memory device that include size decreases, the capacitor should have an increasingly large aspect ratio, defined as the ratio between the height and width of the capacitor. Thus the capacitor may have sufficient capacitance when formed in a limited unit area of the semiconductor memory device. As a result, however, the capacitors having a high aspect ratio may mechanically collapse so that a so-called two-bit failure may occur between adjacent capacitors.

A conventional capacitor includes a cylindrical storage electrode connected to a contact pad formed on a semiconductor substrate. The cylindrical storage electrode is electrically connected to the contact pad through a contact plug formed in an insulation layer that covers the semiconductor substrate. To increase the storage capacitance of the semiconductor memory device, the cylindrical storage electrode of the capacitor has a greatly increased height. When the cylindrical storage electrode has this greatly increased height, the cylindrical storage electrode may collapse toward an adjacent cylindrical electrode so that adjacent capacitors may be inadvertently connected to each other. The collapse of the cylindrical storage electrode is referred to as a two-bit failure. When the two-bit failure occurs in the semiconductor memory device, the semiconductor memory device may not properly operate.

Accordingly, U.S. Patent Application Publication No. 2003/85420 discloses a semiconductor device including a beam-shaped insulating member between capacitors of the semiconductor device to improve the mechanical strength of the capacitor.

FIG. 1 is a cross-sectional view illustrating the semiconductor device including the beam-shaped insulating member, and FIG. 2 is a plan view illustrating the semiconductor device in FIG. 1.

Referring to FIGS. 1 and 2, after a semiconductor substrate 40 is divided into an active region and a field region by forming an isolation layer 45 on the semiconductor substrate 40, gate structures 60 are formed in the active region of the semiconductor substrate 40. Each of the gate structures 60 includes a gate oxide layer pattern, a gate electrode and a mask pattern.

Impurities are implanted into portions of the semiconductor substrate 40 by an ion implantation process using the gate structures 60 as masks, thereby forming source/drain regions 50 and 55 at the portions of the substrate 40 between the gate structures 60. Thus, metal oxide semiconductor (MOS) transistors are formed on the semiconductor substrate 40.

After a first insulating interlayer 80 is formed on the substrate 40 to cover the MOS transistors, capacitor plugs 63 and a bit line plug 65 are formed through the first insulating interlayer 80. The capacitor plugs 63 and the bit line plug 65 are connected to the source/drain regions 50 and 55, respectively.

After a second insulating interlayer 85 is formed on the first insulating interlayer 80, the second insulating interlayer 85 is partially etched to form a bit line contact plug 70 making contact with the bit line plug 65.

A third insulating interlayer 90 is formed on the second insulating interlayer 85. The third and second insulating interlayers 90 and 85 are successively etched to form capacitor contact plugs 75 making contact with the capacitor plugs 63, respectively.

After an etch stop layer 95 is formed on the third insulating interlayer 90 and the capacitor contact plugs 75, holes 100 exposing the capacitor contact plugs 75 are formed through the etch stop layer 95. Cylindrical bottom electrodes 105 making contact with the capacitor contact plugs 75 are formed in the holes 100, respectively. Here, the cylindrical bottom electrodes 105 are electrically connected to the source/drain regions 50 and 55 through the capacitor contact plugs 75 and the capacitor plugs 63.

After beam-shaped insulating members 130 are formed between sidewalls of adjacent bottom electrodes 105, dielectric layers 110 and top electrodes 115 are successively formed on the bottom electrodes 105 to thereby form capacitors 120 on the semiconductor substrate 40.

An additional insulation layer 125 is formed over the substrate 40 to cover the capacitors 120. Since the beam-shaped insulating members 130 are formed between the sidewalls of the adjacent bottom electrodes 105, the mechanical strength of the capacitor 120 may be improved.

However, in the above-described semiconductor device, processes for manufacturing the semiconductor device are complicated because at least four beam-shaped insulating members 130 should be formed between the adjacent bottom electrodes 105 in order to improve the mechanical strength of the capacitor 120. Thus, manufacturing cost and manufacturing time for the semiconductor device is increased. Additionally, the manufacturing processes are more complicated because the capacitor 120 has a complex structure including the bottom electrode 105, the beam-shaped insulating members 130, the dielectric layer 110 and the top electrode 115 as shown in FIGS. 1 and 2. Further, the additional insulation layer 125 may not be precisely formed between the capacitors 120 having the complex structure so that the capacitors 120 may be inadvertently electrically connected to an upper wiring formed on the capacitors 120. As a result, the processes for manufacturing the semiconductor device including the capacitor 120 having the complex structure may have poor throughput.

SUMMARY OF THE INVENTION

The present invention provides a capacitor, and a method of forming the capacitor, having an improved structural stability and an enhanced capacitance in accordance with a simple stabilizing member and an extended effective area thereof.

The present invention also provides a semiconductor device, and a method of manufacturing the semiconductor device, that includes a capacitor having an improved structural stability and an enhanced capacitance.

In the present invention, since stabilizing members are provided to greatly improve structural stability of the capacitors, the capacitors may have very high height without collapse. In other words, the capacitors may have an extremely high aspect ratio. Therefore, the capacitors may have greatly enhanced capacitance in comparison with a conventional capacitor.

In accordance with one embodiment of the present invention, a capacitor includes a storage electrode, a dielectric layer formed on the storage electrode, a plate electrode formed on the dielectric layer, and a stabilizing member fixed to the storage electrode for structurally stabilizing the storage electrode. Here, the stabilizing member and an adjacent stabilizing member are connected to each other along a diagonal direction relative to a direction where the storage electrode and an adjacent electrode are arranged. The stabilizing member having an upper portion wider than a lower portion is fixed at an upper portion of the storage electrode. For example, the stabilizing member has a ring shape or a bowl shape including an opened bottom portion.

In accordance with another embodiment of the present invention, the storage electrode includes polysilicon doped with P type first impurities and the stabilizing member includes polysilicon doped with N type second impurities. Here, the stabilizing member may have a relatively high resistance to (or excellent endurance with respect to) an LAL solution.

In accordance with another embodiment of the present invention, a protecting member enclosing the stabilizing member is provided. The protecting member includes a material such as tantalum oxide that is chemically resistant to an LAL solution.

In accordance with another embodiment of the present invention, a capacitor includes a cylindrical storage electrode, a dielectric layer formed on the storage electrode, a plate electrode formed on the dielectric layer, and a ring-shaped structure fixed to an upper portion of the storage electrode. Preferably, an additional ring-shaped structure is formed to encompass the original ring-shaped structure.

In accordance with another embodiment of the present invention, there is provided a method of manufacturing a capacitor. In the method, a contact region is formed on a surface portion of a semiconductor substrate, and then a mold layer is formed on the substrate. After a stabilizing member is formed at a portion of the mold layer to structurally stabilize a storage electrode, a contact hole is formed through the mold layer to expose a sidewall of the stabilizing member and the contact region. The storage electrode is formed on the contact region and on the sidewall of the stabilizing member. A dielectric layer and a plate electrode are successively formed on the storage electrode. Before forming the contact hole, a mask layer is formed on the mold layer, and then a mask pattern is formed on the mold layer by etching the mask layer. A first opening is formed at an upper portion of the mold layer by partially etching the mold layer using the mask pattern. Here, the first opening has a first width and a first depth. A second opening is formed at the upper portion of the mold layer by partially etching the mold layer. The second opening has a second width wider than the first width, and a second depth deeper than the first depth. The mold layer is preferably removed using an LAL solution before forming the dielectric layer.

In accordance with another embodiment of the present invention, the stabilizing member is formed by forming an insulation layer on a sidewall and a bottom of the second opening and on the mask pattern, by forming an insulation layer pattern on the sidewall and the bottom of the second opening by partially etching the insulation layer, and by removing a portion of the insulation layer pattern on the bottom of the second opening. The contact hole is advantageously extended by a cleaning process using a cleaning solution including at least two of deionized water, ammonia solution and sulfuric acid. Here, the storage electrode is formed by forming a conductive layer on the sidewall of the stabilizing member, on a sidewall of the extended contact hole and on the mask pattern, and by removing a portion of the conductive layer and the mask pattern until the stabilizing member is exposed.

Alternatively, the stabilizing member is formed by forming a polysilicon layer doped with first impurities on a sidewall and a bottom of the second opening and on the mask pattern. Then a polysilicon layer pattern is formed on the sidewall and the bottom of the second opening by partially etching the polysilicon layer that is doped with the first impurities. Finally a portion of the polysilicon layer pattern on the bottom of the second opening is removed. Here, the storage electrode is formed by forming a polysilicon layer doped with second impurities on the sidewall of the stabilizing member, on a sidewall of the extended contact hole, and on the mask pattern, and by removing a portion of the polysilicon layer doped with second impurities and the mask pattern until the stabilizing member is exposed.

The stabilizing member is formed by successively forming a metal oxide layer and an insulation layer on a sidewall and a bottom of the second opening and on the mask pattern, then by forming a metal oxide layer pattern and an insulation layer pattern on the sidewall and the bottom of the second opening by partially etching the metal oxide layer and the insulation layer, and finally by simultaneously forming a protecting member and the stabilizing member in accordance with the removal of portions of the metal oxide layer pattern and the insulation layer pattern on the bottom of the second opening.

In accordance with another embodiment of the present invention, a semiconductor device includes gate structures formed on a semiconductor substrate, a first contact region and a contact region formed at portions of the substrate between the gate structures, respectively, a first pad making contact with the first contact region, a second pad making contact with the second contact region, a bit line making contact with the second pad, a storage electrode making contact with the first pad, a stabilizing member enclosing an upper portion of the storage electrode to structurally stabilizing the storage electrode, a dielectric layer formed on the storage electrode and on the stabilizing member, and a plate electrode formed on the dielectric layer.

In accordance with another embodiment of the present invention, a semiconductor device includes word lines formed on a semiconductor substrate, first contact regions and contact regions formed at portions of the substrate between the word lines, respectively, first pads making contact with the first contact regions, second pads making contact with the second contact regions, bit lines making contact with the second pads, cylindrical storage electrodes making contact with the first pads, at least one ring-shaped structure enclosing upper portions of the storage electrodes to structurally stabilizing the storage electrodes, dielectric layers formed on the storage electrodes and on the ring-shaped structure, and plate electrodes formed on the dielectric layers.

In accordance with another embodiment of the present invention, there is provided a method of forming a semiconductor device. In the method, after gate structures are formed on a semiconductor substrate, first contact regions and second contact regions are formed at portions of the substrate between the gate structures, respectively. First pads are formed to make contact with the first contact regions, and second pads are formed to make contact with the second contact regions. Bit lines are formed to make contact with the second pads. A mold layer is formed on the substrate to cover the bit lines. Stabilizing members are formed at portions of the mold layer where the first pads are positioned. Contact holes are formed through the mold layer to expose sidewalls of the stabilizing members and the first pads. Storage electrodes are formed on the sidewalls of the stabilizing members, on the first pads, and on sidewalls of the contact holes. Dielectric layers and plate electrodes are successively formed on the storage electrodes and on the stabilizing members.

According to the present invention, the stabilizing members are formed to encompass the upper portions of the cylindrical storage electrodes so that the storage electrodes of a unit memory cell are supported by one another. Thus, the capacitors including the storage electrode and the stabilizing members may have improved structural stability even when the capacitors have an extremely high aspect ratio. As a result, a semiconductor device including the capacitors may have improved reliability and the throughput of a semiconductor manufacturing process may be increased. Meanwhile, since the stabilizing members are formed using material that is highly resistant to the LAL solution, or the protecting members enclosing the stabilizing members are formed using metal oxide that is highly resistant to the LAL solution, the storage electrodes may more stably support one another by interposing the stabilizing members, thereby greatly increasing the structural stability of the capacitors. In addition, the capacitors may have primarily improved capacitance because the stabilizing members having extended bowl structures or ring structures may enlarge the area of the storage electrodes. Furthermore, the storage electrodes are formed on sidewalls of the contact holes having an extended area by the cleaning process so that the storage electrodes have a secondarily enlarged area. As a result, the capacitors including the storage electrodes may have greatly improved capacitance.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE PREFERRED EMBODIMENTS

Figure 1:
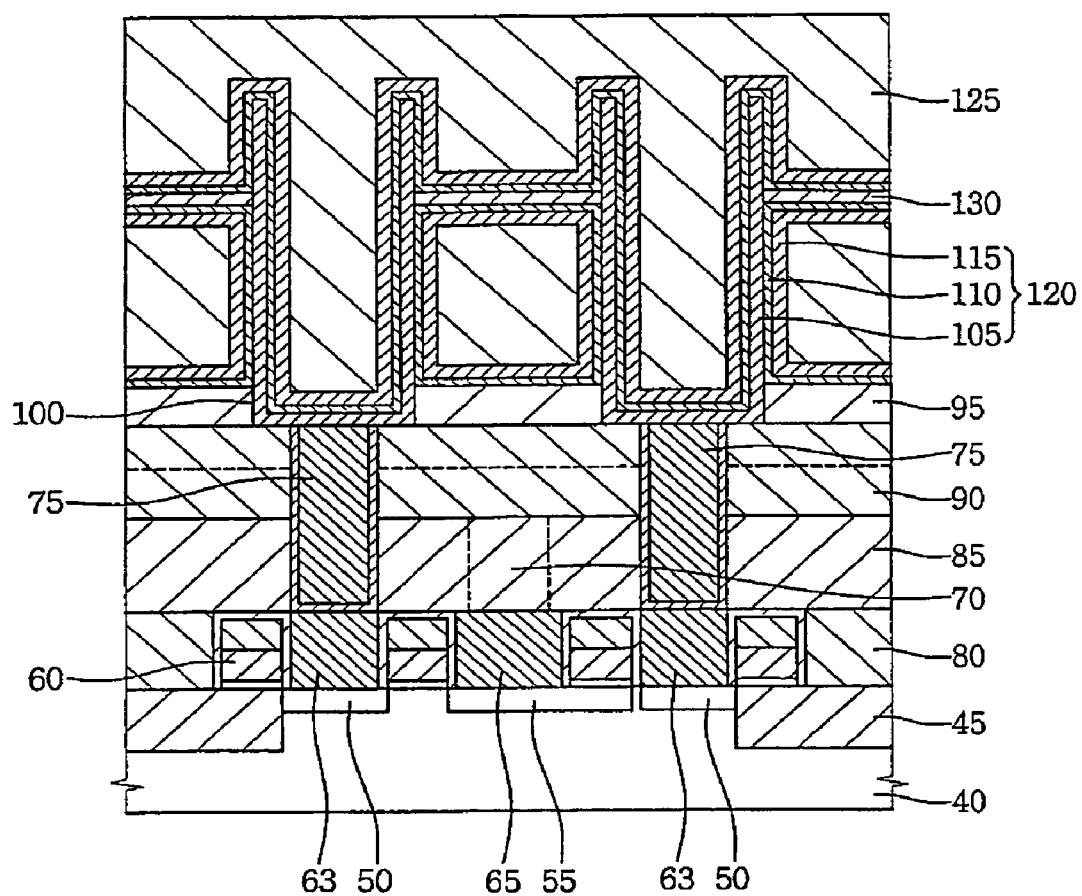
FIG. 1 is a cross-sectional view illustrating a conventional semiconductor device including a beam-shaped insulating member.
Figure 2:
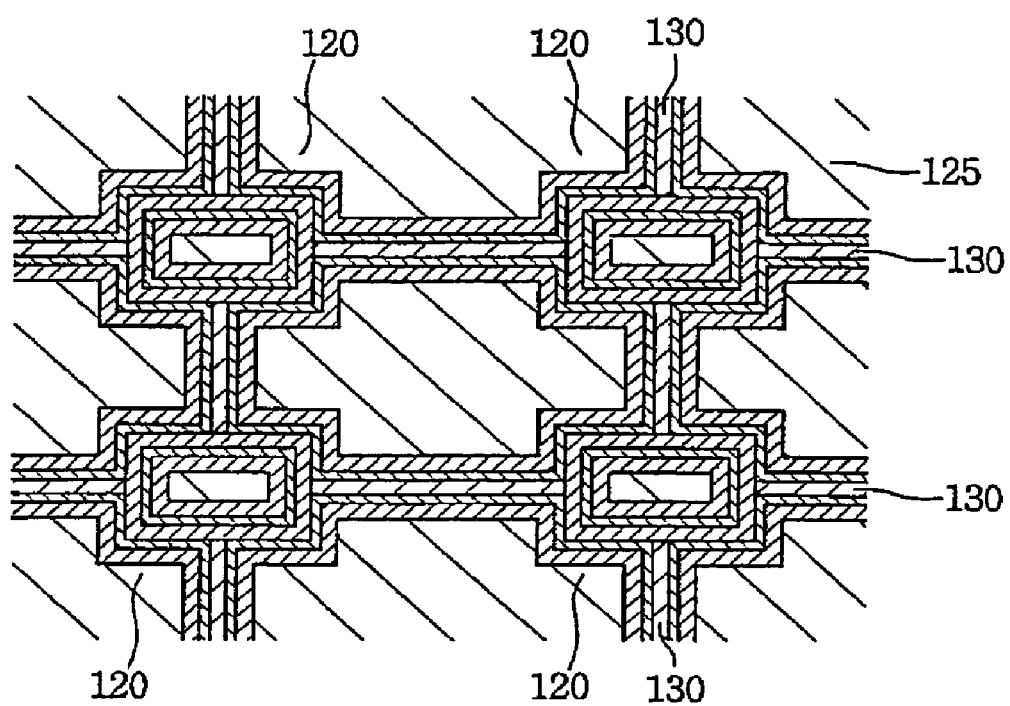
FIG. 2 is a plan view illustrating the semiconductor device in FIG. 1.

The present invention now will be described more fully hereinafter with reference to the accompanying drawings, in which embodiments of the invention are shown In the drawings, the thickness of layers and regions are exaggerated for clarity. Like reference numerals refer to similar or identical elements throughout. It will be understood that when an element such as a layer, a region or a substrate is referred to as being "on" or "onto" another element, it can be directly on the other element or intervening elements may also be present.

Figure 3:
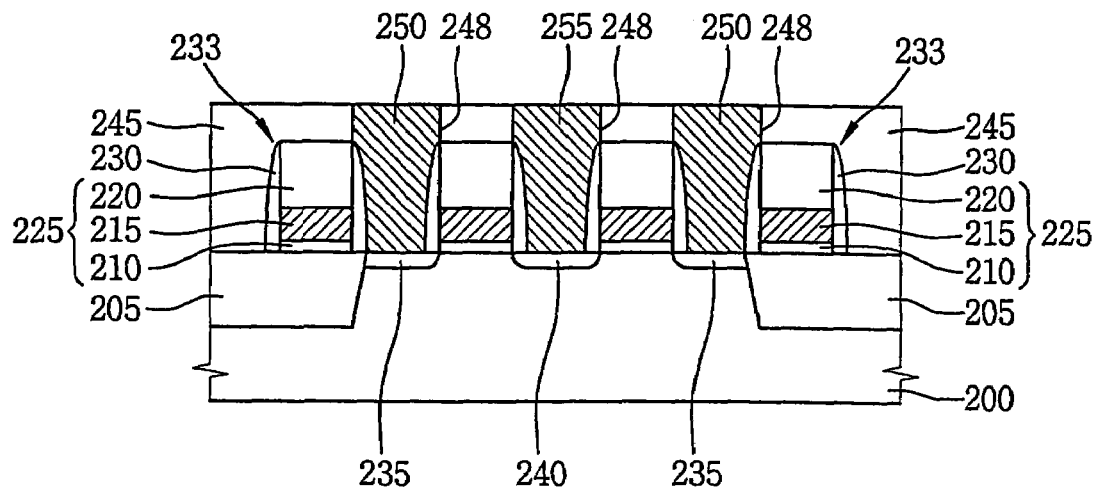
FIGS. 3, 5, 7, 9, 12, 15, 18, 21, 23, 25 and 30 are cross-sectional views illustrating embodiments of a semiconductor device along a line parallel to bit lines.
Figure 4:
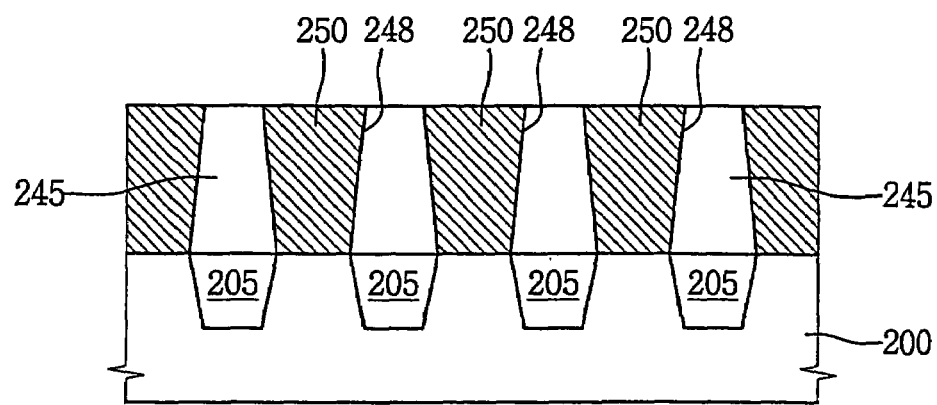
FIGS. 4, 6, 8, 10, 13, 16, 19, 22, 24, 26 and 31 are cross-sectional views illustrating embodiments of a semiconductor device along a line parallel to word lines.

FIGS. 3 and 4 are cross-sectional views illustrating steps for forming first pads 250 and second pads 255 on a semiconductor substrate 200 including word lines 233.

Referring to FIGS. 3 and 4, the semiconductor substrate 200 is divided into an active region and a field region by forming an isolation layer 205 at surface portions of the semiconductor substrate 200. The isolation layer 205 may be formed by a shallow trench isolation (STI) process or a local oxidation of silicon (LOCOS) process.

A thin gate oxide layer (not shown) is formed on the semiconductor substrate 200 by a thermal oxidation process or a chemical vapor deposition (CVD) process.

A first conductive layer (not shown) and a first mask layer (not shown) are successively formed on the gate oxide layer. The first conductive layer and the first mask layer correspond to a gate conductive layer and a gate mask layer, respectively. The first conductive layer may include polysilicon doped with impurities. The first conductive layer will be patterned to form the gate conductive pattern 215. Alternatively, the first conductive layer has a polycide structure that includes a doped polysilicon film and a metal silicide film formed on the doped polysilicon film. The first mask layer is formed using a material that has an etching selectivity relative to the first insulating interlayer 245. For example, the first mask layer is formed using nitride such as silicon nitride when the first insulating interlayer 245 includes oxide. The first mask layer will be patterned to form a gate mask pattern 220.

After a first photoresist film (not shown) is formed on the first mask layer, the first photoresist film is exposed and developed to form a first photoresist pattern (not shown) on the first mask layer. The first mask layer, the first conductive layer and the gate oxide layer are partially etched using the first photoresist pattern as an etching mask to thereby form gate structures 225 on the semiconductor substrate 200. Each of the gate structures 225 includes a gate oxide pattern 210, the gate conductive pattern 215 and the gate mask pattern 220. That is, the first mask layer, the first conductive layer and the gate oxide layer are successively etched, thereby forming the gate structures 225 on the semiconductor substrate 200.

In one embodiment of the present invention, the first mask layer is etched using the photoresist pattern as an etching mask so that the gate mask pattern 220 is formed on the first conductive layer. After the first photoresist pattern is removed from the gate mask pattern 220 by an ashing and stripping process, the first conductive layer and the gate oxide layer are successively etched using the gate mask pattern 220 as an etching mask. As a result, the gate structures 225, including the gate oxide patterns 210, the gate conductive patterns 215, and the gate mask patterns 220, are formed on the semiconductor substrate 200.

A first insulation layer is formed on the semiconductor substrate 200 to cover the gate structures 225. The first insulation layer may be formed using nitride such as silicon nitride. The first insulation layer is anisotropically etched to form first spacers 230 on sidewalls of the gate structures 225, respectively. The first spacers 230 correspond to gate spacers.

Impurities are implanted into surface portions of the semiconductor substrate 200 that are exposed between the gate structures 225 that have the first spacers 230 by using the gate structures 225, including the first spacers 230, as masks by an ion implantation process. Afterwards, the implanted impurities are thermally treated to thereby form first contact regions 235 and second contact regions 240 at the exposed portion of the semiconductor substrate 200. The first and second contact regions 235 and 240 correspond to source/drain regions of transistors, respectively. As a result, a plurality of word lines 233 is formed on the semiconductor substrate 200. The word lines 233 include MOS transistors having the gate structures 225 and the first and second contact regions 235 and 240. Here, adjacent word lines 233 are electrically separated by the first spacers 230 and the gate mask patterns 220 thereof. The first and second contact regions 235 and 240 also correspond to capacitor contact regions and bit line contact regions, respectively. Capacitors 380 (see FIG. 30) are electrically connected to the capacitor contact regions, whereas bit lines 280 (see FIG. 6) are electrically connected to the bit line contact regions. For example, the first contact regions 235 may be the capacitor contact regions with which the first pads 250 make contact, whereas the second contact regions 240 may be the bit line contact regions with which the second pads 255 make contact.

In one embodiment of the present invention, before forming the first spacers 230 on the sidewalls of the gate structures 225, first impurities of relatively low concentration are primarily implanted into the exposed portions of the substrate 200 between the gate structures 225. Then, second impurities of relative high concentration are secondarily implanted into the exposed portion of the substrate 200 after forming the first spacers 230. As a result, the first and second contact regions 235 and 240 having lightly doped drain (LDD) structures are formed at the exposed portion of the substrate 200.

Referring to FIGS. 3 and 4, the first insulating interlayer 245 is formed on the semiconductor substrate 200 to cover the word lines 233. The first insulating interlayer 245 may include oxide such as boro-phosphor silicate glass (BPSG), phosphor silicate glass (PSG), undoped silicate glass (USG), spin on glass (SOG), tetraethylorthosilicate (TEOS), high density plasma-chemical vapor deposition (HDP-CVD) oxide, etc.

The first insulating interlayer 245 is planarized by a chemical mechanical polishing (CMP) process, an etch back process, or a combination process of CMP and etch back. Here, the planarized first insulating interlayer 245 has a predetermined thickness on upper faces of the word lines 233. Alternatively, the first insulating interlayer 245 is etched until the upper faces of the word lines 233 are exposed.

After a second photoresist film (not shown) is coated on the planarized first insulating interlayer 245, the second photoresist film is exposed and developed to form a second photoresist pattern (not shown) on the first insulating interlayer 245.

Using the second photoresist patterns as an etching mask, the first insulating interlayer 245 is partially etched to form first contact holes 248 exposing the first and second contact regions 235 and 240, respectively. Preferably, the first insulating interlayer 245 of oxide is etched using an etching gas that has an etching selectivity relative to the gate mask pattern 220 of nitride. Hence, the first contact holes 248 are formed through the first insulating interlayer 245 by a self-alignment process. That is, the first contact holes 248 are self-aligned relative to the word lines 233 including the first spacers 230. Here, some first contact holes 248 expose the first contact regions 235 corresponding to the capacitor contact regions, and other first contact holes 248 expose the second contact regions 240 corresponding to the bit line contact regions.

After removing the second photoresist pattern by an ashing and stripping process, a second conductive layer (not shown) is formed on the first insulating layer 245 to fill the first contact holes 248. The second conductive layer may be formed using conductive material such as doped polysilicon or metal.

The second conductive layer is etched by a CMP process, an etch back process, or a combination process of CMP and etch back until the first insulating interlayer 245 is exposed. Thus, the first and second pads 250 and 255 filling the first contact holes 248 are formed on the first and second contact regions 235 and 240, respectively. Each of the first pads 250 corresponds to a first storage node contact pad, and each of the second pads 255 corresponds to a first bit line contact pad. Since the first contact holes 248 are formed by the self-alignment process, the first and second pads 250 and 255 correspond to self-aligned contact (SAC) pads. As described above, the first pads 250 make contact with the first contact regions 235 corresponding to the capacitor contact region, and the second pads 255 make contact with the second contact regions 240 corresponding to the bit line contact regions.

In one embodiment of the present invention, when the first insulating interlayer 245 is planarized until the upper faces of the word lines 233 are exposed, the second conductive layer is etched until the upper faces of the word lines 233 are exposed so that the first and second pads 250 and 255 are formed in the first contact holes 248. Here, the first and second pads 250 and 255 have heights that are substantially the same as those of the word lines 233.

Figure 5:
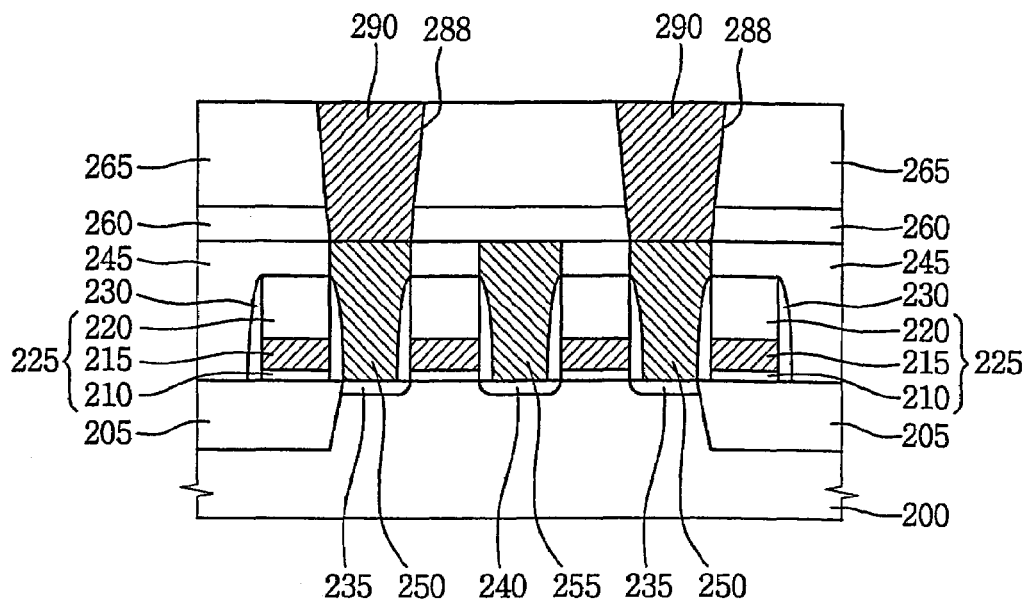
Figure 6:
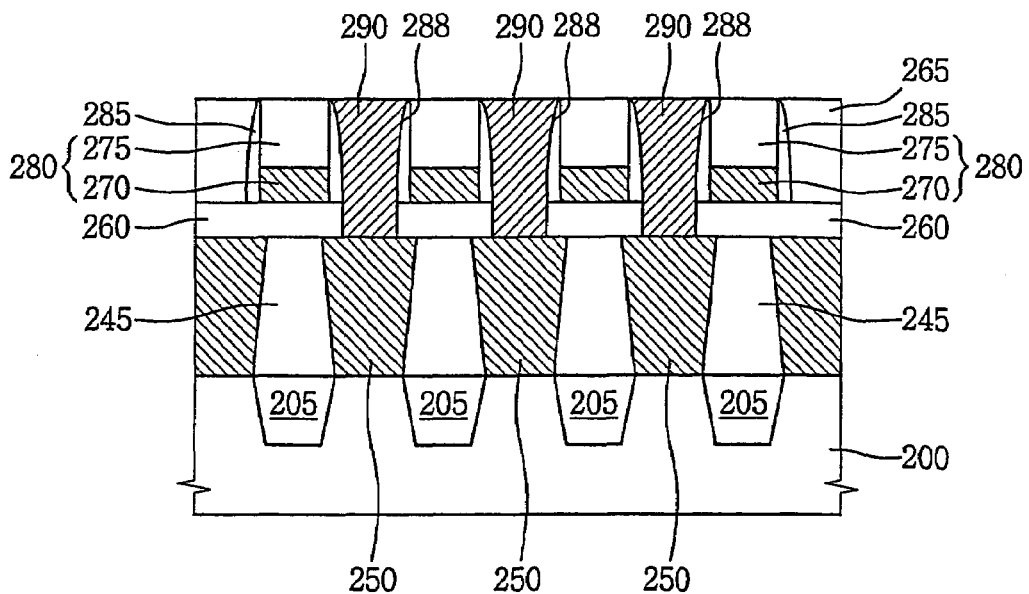

FIGS. 5 and 6 are cross sectional views illustrating steps for forming bit lines 280 and fourth pads 290.

Referring to FIGS. 5 and 6, a second insulating interlayer 260 is formed on the first insulating interlayer 245, including the first and second pads 250 and 255. The second insulating interlayer 260 electrically isolates the first pads 250 from the bit lines 280 that are successively formed on the second insulating interlayer 260. The second insulating interlayer 260 may be formed using BPSG, PSG, SOG, USG, TEOS, HDP-CVD oxide, etc. Note that the second insulating interlayer 260 may be formed using one of BPSG, PSG, SOG, USG, TEOS and HDP-CVD, either identical to, or different from, that of the first insulating interlayer 245.

The second insulating interlayer 260 is planarized by a CMP process, an etch back process, or a combination process of CMP and etch back so as to ensure process margin of a subsequent photolithography process.

After a third photoresist film (not shown) is formed on the planarized second insulating interlayer 260, the third photoresist film is exposed and developed to form a third photoresist pattern (not shown) on the second insulating interlayer 260.

The second insulating layer 260 is partially etched using the third photoresist pattern as an etching mask to form second contact holes (not shown) that expose the second pads 255 corresponding to the first bit line contact pads. The second contact holes correspond to bit line contact holes that electrically connect the second pads 255 to the bit lines 280, respectively.

In one embodiment of the present invention, a first anti-reflective layer (ARL) is additionally formed between the second insulating interlayer 260 and the third photoresist film to efficiently ensure the process margin of the photolithography process. The first ARL may be formed using silicon oxide, silicon nitride or silicon oxynitride. Then, the photolithography process may be carried out to form the second contact holes through the second insulating interlayer 260.

Referring to FIGS. 5 and 6, after removing the third photoresist pattern by an ashing and stripping process, a third conductive layer (not shown) and a second mask layer (not shown) are successively formed on the second insulating interlayer 260. Here, the second contact holes are filled with the third conductive layer. The third conductive layer and the second mask layer are patterned to form bit line conductive patterns 270 and bit line mask patterns 275, respectively.

After a fourth photoresist film (not shown) is coated on the second mask layer, the fourth photoresist film is exposed and developed to form a fourth photoresist pattern (not shown) on the second mask layer. Using the fourth photoresist pattern as an etching mask, the second mask layer and the third conductive layer are subsequently etched to form the bit lines 280 on the second insulating interlayer 260. Here, third pads filling up the second contact holes are simultaneously formed. Each of the bit lines 280 includes the bit line mask pattern 275 and the bit line conductive pattern 270. The third pads correspond to second bit line contact pads that electrically connect the second pads 255 to the bit lines 280. Additionally, the third pads correspond to bit line contact plugs.

Each of the bit line conductive patterns 270 may include a first film along with a second film that is formed on the first film. The first film may include a metal and metal compound such as titanium/titanium nitride (Ti/TiN), and the second film may include metal such as tungsten (W).

Figure 19:
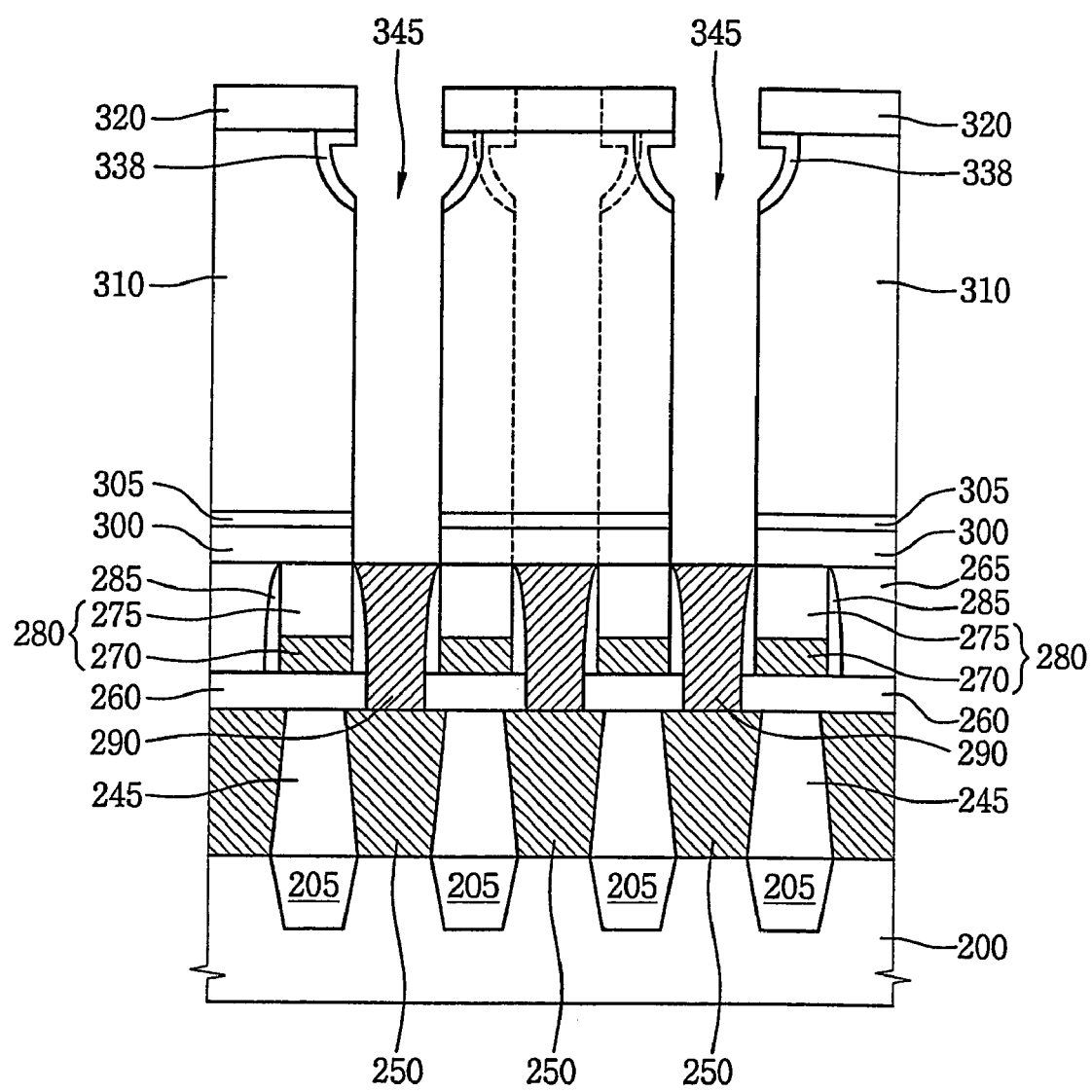

Each of the bit line mask patterns 275 protects the bit line conductive patterns 270 in an etching process for forming a fourth contact hole 345 (see FIG. 19). The bit line mask pattern 275 is formed using material that has an etching selectivity relative to oxide included in a fourth insulating interlayer 300 and a mold layer 310 (see FIG. 7). For example, the bit line mask pattern 275 is formed using nitride such as silicon nitride.

In one embodiment of the present invention, the second mask layer is patterned using the fourth photoresist pattern as an etching mask to form the bit line mask patterns 275 on the third conductive layer. Then, after removing the fourth photoresist pattern, the third conductive layer is patterned using the bit line mask patterns 275 as etching masks to thereby form the bit line conductive patterns 270 on the second insulating interlayer 260. Here, the third pads are simultaneously formed in the second contact holes to electrically connect the bit line conductive patterns 270 to the second pads 255, respectively.

In one embodiment of the present invention, after an additional conductive layer is formed on the second insulating interlayer 260 to fill the second contact holes, the additional conductive layer is etched until the second insulating interlayer 260 is exposed. Hence, the third pads making contact with the second pads 255 are formed in the second contact holes. Subsequently, the third conductive layer and the second mask layer are formed on the second insulating interlayer 260 including the third pads. The third conductive layer and the second mask layer are patterned to form the bit lines 280 as described above. In particular, a barrier metal layer and a metal layer are successively formed on the second insulating interlayer 260 to fill the second contact holes. The barrier metal layer may be formed using titanium/titanium nitride, and the metal layer may be formed using tungsten. The metal and barrier metal layers are etched by a CMP process, an etch back process, or a combination process of CMP and etch back until the second insulating interlayer 260 is exposed. Thus, the third pads are formed in the second contact holes. After the third conductive layer and the second mask layer are formed on the second insulating interlayer 260 and on the third pads, the third conductive layer and the second mask layer are patterned to form the bit lines 280 including the bit line conductive patterns 270 and the bit line mask patterns 275. Here, each of the bit line conductive patterns 270 includes one metal layer of tungsten.

Referring to FIGS. 5 and 6, a second insulation layer (not shown) is formed on the second insulating interlayer 260 to cover the bit lines 280. The second insulation layer is anisotropically etched to form second spacers 285 on sidewalls of the bit lines 280. The second spacers 285 correspond to bit line spacers. The second spacers 285 protect the bit lines 280 in a subsequent etching process for forming the fourth pads 290 that correspond to second storage node contact pads. The second spacers 285 may include material that has etching selectivity relative to the second insulating interlayer 260 and a third insulating interlayer 265 that is successively formed. For example, the second spacers 285 may include nitride such as silicon nitride.

The third insulating interlayer 265 is formed on the second insulating interlayer 260 to cover the bit lines 280 including the second spacers 285. The third insulating interlayer 265 may be formed using BPSG, PSG, TEOS, USG, SOG, HDP-CVD oxide, etc. As described-above, the third insulating interlayer 265 may be formed using material identical to that of the second insulating interlayer 260 and/or that of the first insulating interlayer 245. Alternatively, the third insulating interlayer 265 may include material different from that of the second insulating interlayer 260 and/or the first insulating interlayer 245. Preferably, the insulating interlayer 265 may be formed using HDP-CVD oxide that may advantageously fill gaps between the bit lines 280 without voids therein and may be formed at a low temperature.

The third insulating interlayer 265 is etched by a CMP process, an etch back process or a combination process of CMP and etch back until the upper faces of the bit lines 280 are exposed, thereby planarizing the third insulating interlayer 265.

In one embodiment of the present invention, the third insulating interlayer 265 may be planarized without exposure of the bit lines 280. Here, the third insulating interlayer 265 has a predetermined height relative to the upper faces of the bit lines 280.

In one embodiment of the present invention, to prevent generation of voids in the third insulating interlayer 265 between adjacent bit lines 280, an additional insulation layer may be formed on the second insulating interlayer 260 including the bit lines 280. Then, the third insulating interlayer 265 is formed on the additional insulation layer. Here, the additional insulation layer may have a thickness of about 50 to about 200 Å. The additional insulation layer may be formed using nitride.

After a fifth photoresist film (not shown) is formed on the planarized third insulating interlayer 265, the fifth photoresist film is exposed and developed to form a fifth photoresist pattern (not shown) on the third insulating interlayer 265.

The third insulating interlayer 265 and the second insulating interlayer 260 are partially etched using the fifth photoresist pattern as an etching mask. Third contact holes 288 are formed through the third insulating interlayer 265 and the second insulating interlayer 260. The third contact holes 288 expose the first pads 250 corresponding to the first storage node contact pads. The third contact holes 288 correspond to first storage node contact holes. Here, the third contact holes 288 are self-aligned relative to the second spacers 285 positioned on the sidewalls of the bit lines 280.

In one embodiment of the present invention, a second ARL layer may be additionally formed on the third insulating interlayer 265 to ensure a process margin of a subsequent photolithography process.

In another embodiment of the present invention, after forming the third contact holes 288 corresponding to the first storage node contact holes, an additional cleaning process may be performed on the semiconductor substrate 200 including the resultant structure. As a result, a native oxide layer or various particles existing on the first pads 250 may be removed from the first pads 250.

After a fourth conductive layer (not shown) is formed on the third insulating interlayer 265 to fill the third contact holes 288, the fourth conductive layer is etched by a CMP process, an etch back process or a combination process of CMP and etch back. Thus, the fourth pads 290 filling the third contact holes 288 are formed. The fourth pads 290 correspond to second storage node contact pads. The fourth pads 290 are generally formed using doped polysilicon.

Each of the fourth pads 290 electrically connects the first pad 250 to a storage electrode 360 (see FIGS. 25 and 26) successively formed on the fourth pad 290. Hence, the storage electrodes 360 are electrically connected to the first pads 250 through the fourth pads 290.

Figure 7:
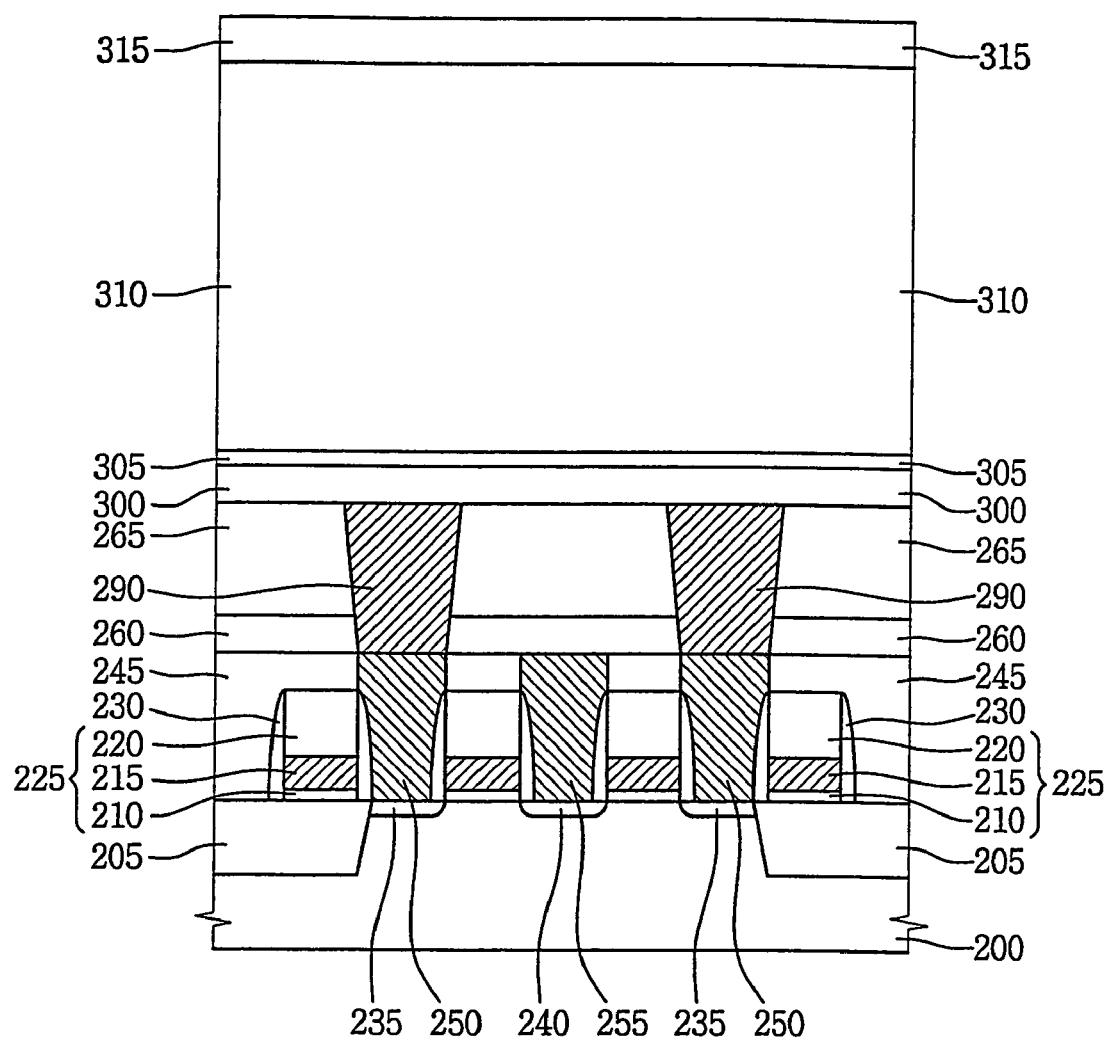
Figure 8:
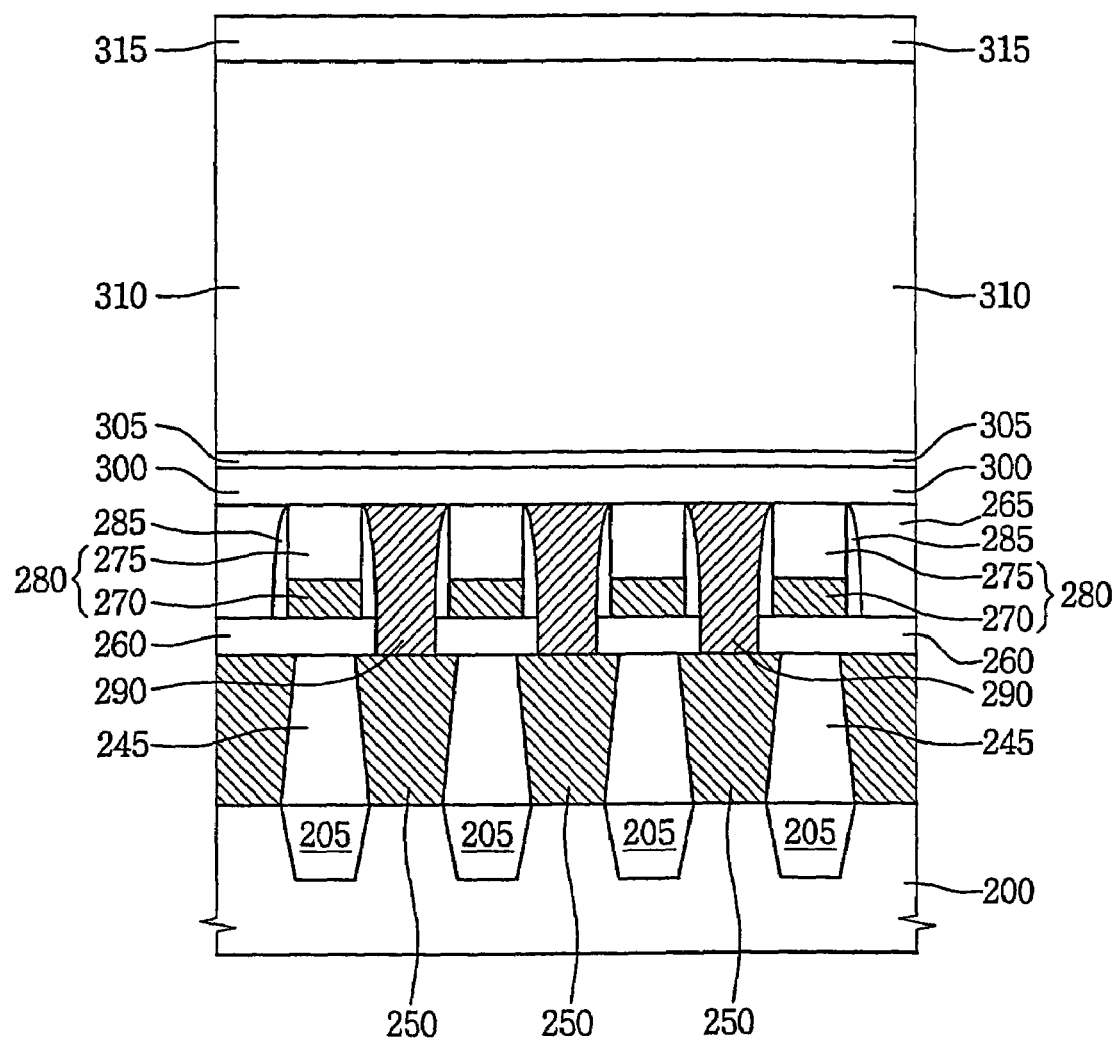

FIGS. 7 and 8 are cross sectional views illustrating steps for forming a fourth insulating interlayer 300, an etching stop layer 305, a mold layer 310 and a third mask layer 315.

Figure 26:
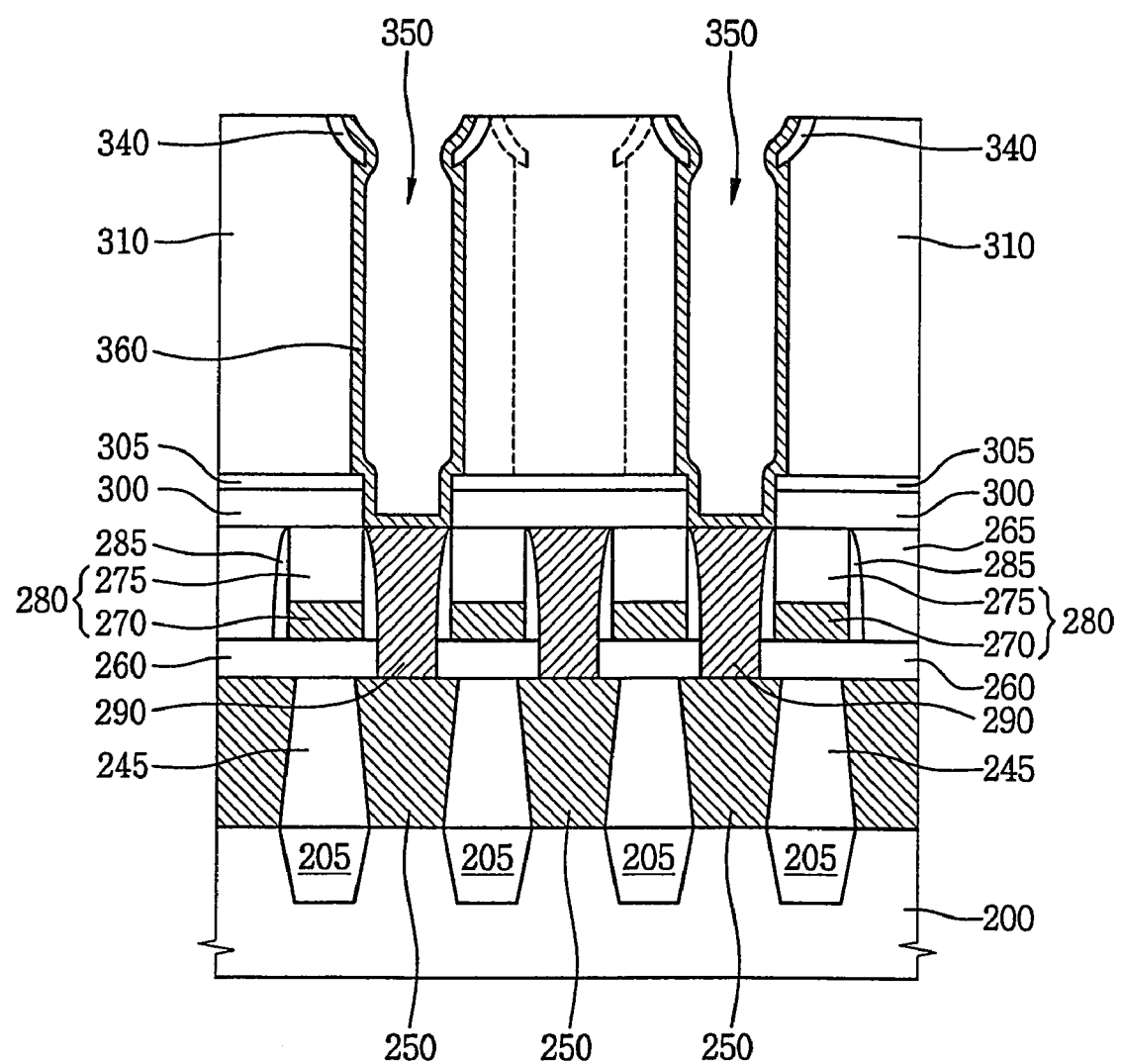

Referring to FIGS. 7 and 8, the fourth insulating interlayer 300 is formed on the third insulating interlayer 265 and on the fourth pads 290. The fourth insulating interlayer 300 may be formed using BPSG, PSG, SOG, USG, TEOS, HDP-CVD oxide, etc. The fourth insulating interlayer 300 electrically isolates the bit lines 280 from the storage electrodes 360 as can be seen in FIG. 26. As described above, the fourth insulating interlayer 300 may be formed using material substantially identical to that of the third insulating interlayer 265 and/or that of the second insulating interlayer 260. In addition, the fourth insulating interlayer 300 may be formed using material different from that of the third insulating interlayer 265 and/or that of the second insulating interlayer 260.

The etching stop layer 305 is formed on the fourth insulating interlayer 300. The etching stop layer 305 may be formed using material that has an etching selectivity relative to the fourth insulating interlayer 300 and the mold layer 310. For example, the etching stop layer 305 includes nitride such as silicon nitride. The fourth insulating interlayer 300 may be planarized by a CMP process, an etch back process, or a combination process of CMP and etch back. After this planarizing process the etching stop layer 305 may be formed on the planarized fourth insulating interlayer 300.

The mold layer 310 is formed on the etching stop layer 305. The mold layer 310 is provided to form stabilizing members 340 and the storage electrodes 360 (see FIGS. 25 and 26). The mold layer 310 may be formed using HDP-CVD oxide, plasma enhanced TEOS (PE-TEOS), USG, BPSG, PSG, etc. The mold layer 310 has a thickness of about 5,000 to about 50,000 Å measured from the upper face of the etching stop layer 305. According to the present invention, the thickness of the mold layer 310 may vary in accordance with desired capacitance of capacitors 380 (see FIG. 30). That is, because the capacitors 380 have a height in proportion to the thickness of the mold layer 310, the thickness of the mold layer 310 may be advantageously adjusted so as to control the capacitance of the capacitors 380.

In the present invention, since the stabilizing members 340 are provided to greatly improve structural stability of the capacitors 380, the capacitors 380 may have very high height without collapse. In other words, although the capacitors 380 of the present invention may have extremely high aspect ratio, the capacitors 380 may not mechanically collapse toward each other because the stabilizing members 340 are positioned at upper potions of the capacitors 380, respectively. Therefore, each of the capacitors 380 may have greatly enhanced capacitance in comparison with a conventional capacitor. The stabilizing members 340 will be described in detail.

Referring to FIGS. 7 and 8, the third mask layer 315 is formed on the mold layer 310. The third mask layer 315 may be formed using material that has an etching selectivity relative to the mold layer 310. For example, the third mask layer 315 may include polysilicon or nitride such as silicon nitride. The third mask layer 315 has a thickness of about 100 to about 6,000 Å measured from the upper face of the mold layer 310. Hence, the ratio of the thickness of the mold layer 310 relative to that of the third mask layer 315 may be in a range of about 8:1 to about 50:1. However, the thickness ratio between the mold layer 310 and the third mask layer 315 may vary in accordance with the capacitance of the capacitors 380.

In one embodiment of the present invention, after the mold layer 310 is planarized by a CMP process, an etch back process or a combination process of CMP and etch back, the third mask layer 315 may be formed on the planarized mold layer 310.

Figure 9:
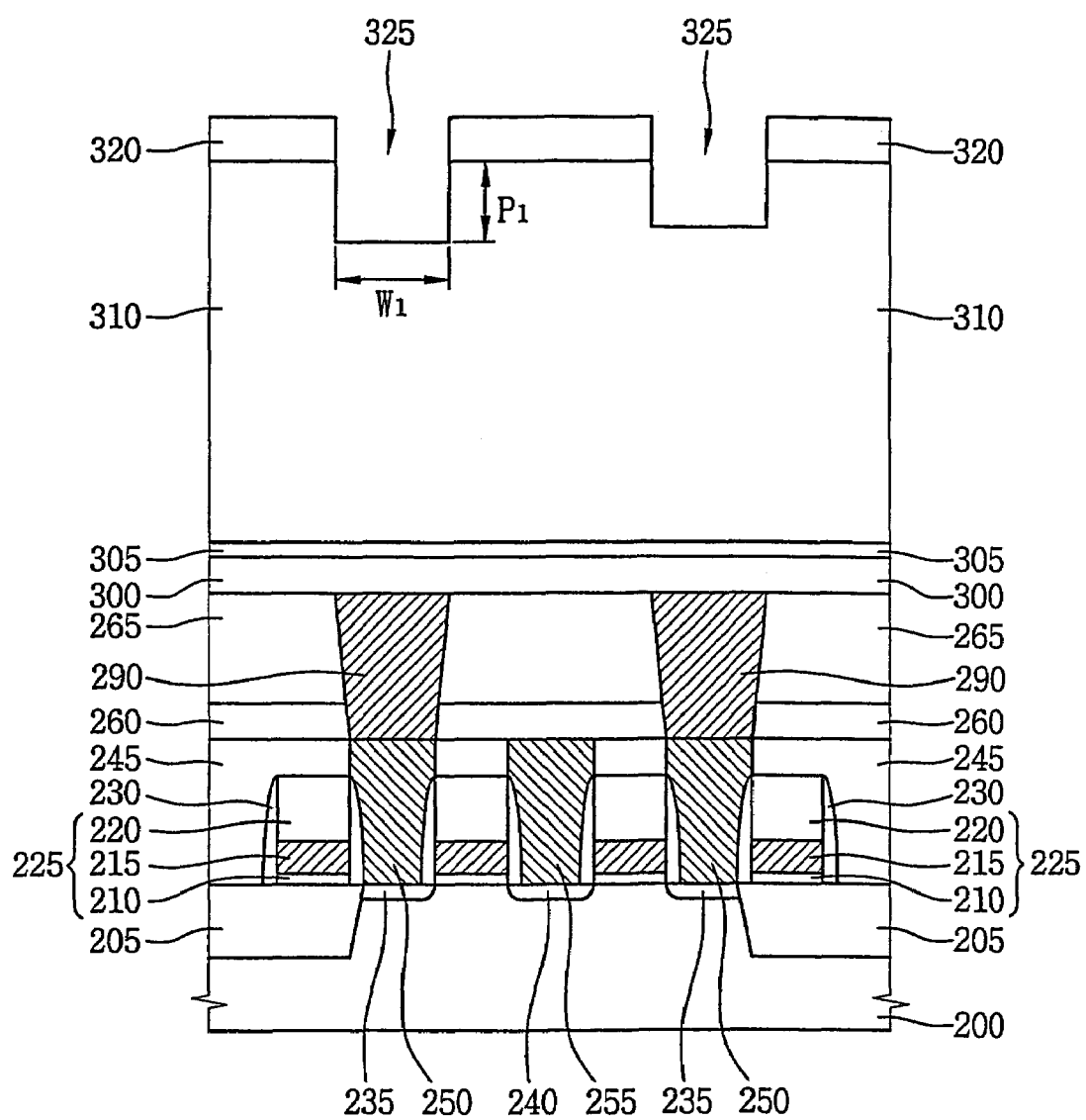
Figure 10:
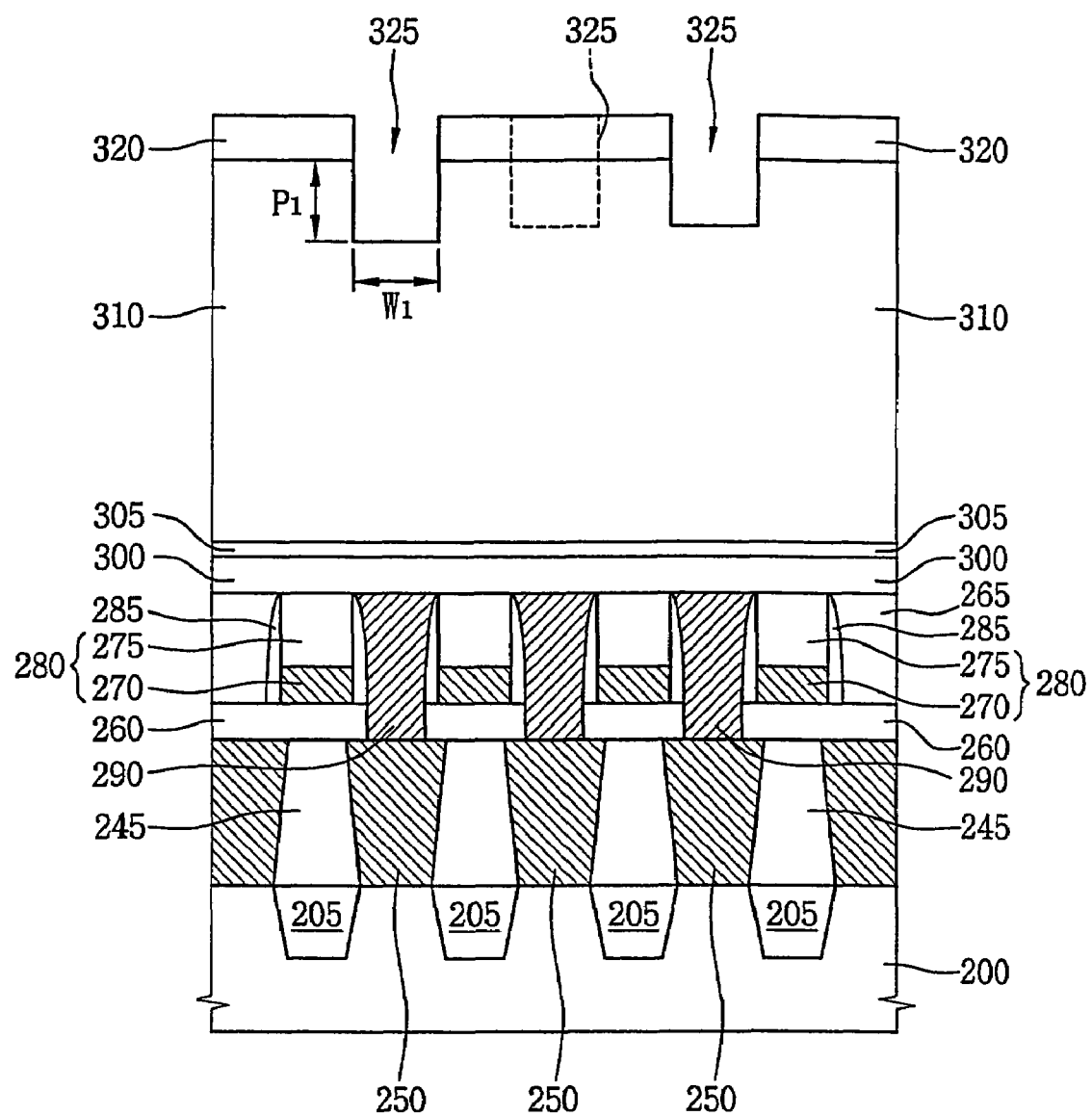
Figure 11:
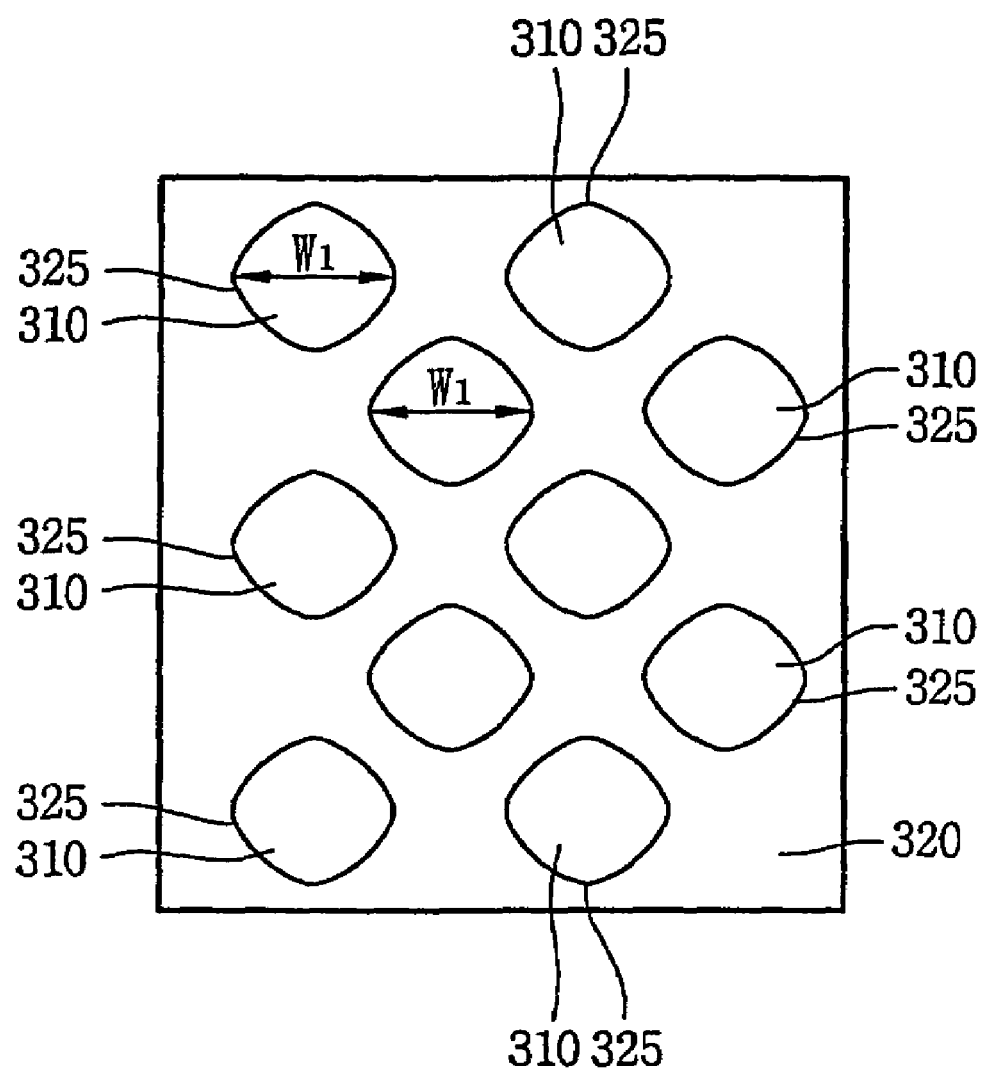
FIGS. 11, 14, 17, 20 and 27 are plan views illustrating embodiments of the semiconductor device in FIGS. 10, 13, 16, 19 and 26, respectively.

FIGS. 9 and 10 are cross sectional views illustrating steps for forming a storage mask pattern 320 and first openings 325, and FIG. 11 is a plan view illustrating the semiconductor device in FIG. 10.

Referring to FIGS. 9 to 11, after a sixth photoresist film (not shown) is formed on the third mask layer 315, the sixth photoresist film is exposed and developed to form a sixth photoresist pattern (not shown) on the third mask layer 315.

The third mask layer 315 is patterned using the sixth photoresist pattern as an etching mask, thereby forming the storage node mask pattern 320 on the mold layer 310. Then, the sixth photoresist pattern is removed by an ashing and stripping process.

In one embodiment, the sixth photoresist pattern may instead be removed during an etching process for forming the first openings 325 at upper portions of the mold layer 310 without performing the ashing and stripping process.

Further, to ensure process margin of a subsequent photolithography process, a third ARL may be formed on the third mask layer 315, and then the photolithography process may be performed to form the storage node mask pattern 320.

A first etching process is performed on the upper portions of the mold layer 310 using the storage node mask pattern 320 as an etching mask to thereby form the first openings 325 at the upper portions of the mold layer 310. The first etching process is anisotropic. Each of the first openings 325 has a first width $W_1$ and a first depth $P_1$. The first openings 325 are positioned over the fourth pads 290 and the first pads 250.

As shown in FIG. 11, the first openings 325 having the first width W1 are separated from one another in a first direction by predetermined equal intervals. The first openings 325 are also separated from one another in a second direction by predetermined equal intervals. That is, the first openings 325 do not make contact with one another, and are located along the first direction substantially parallel to the bit lines 280. The first openings 325 are also arranged in the second direction substantially parallel to the word lines 233. Here, the first direction is substantially perpendicular to the second direction.

Figure 12:
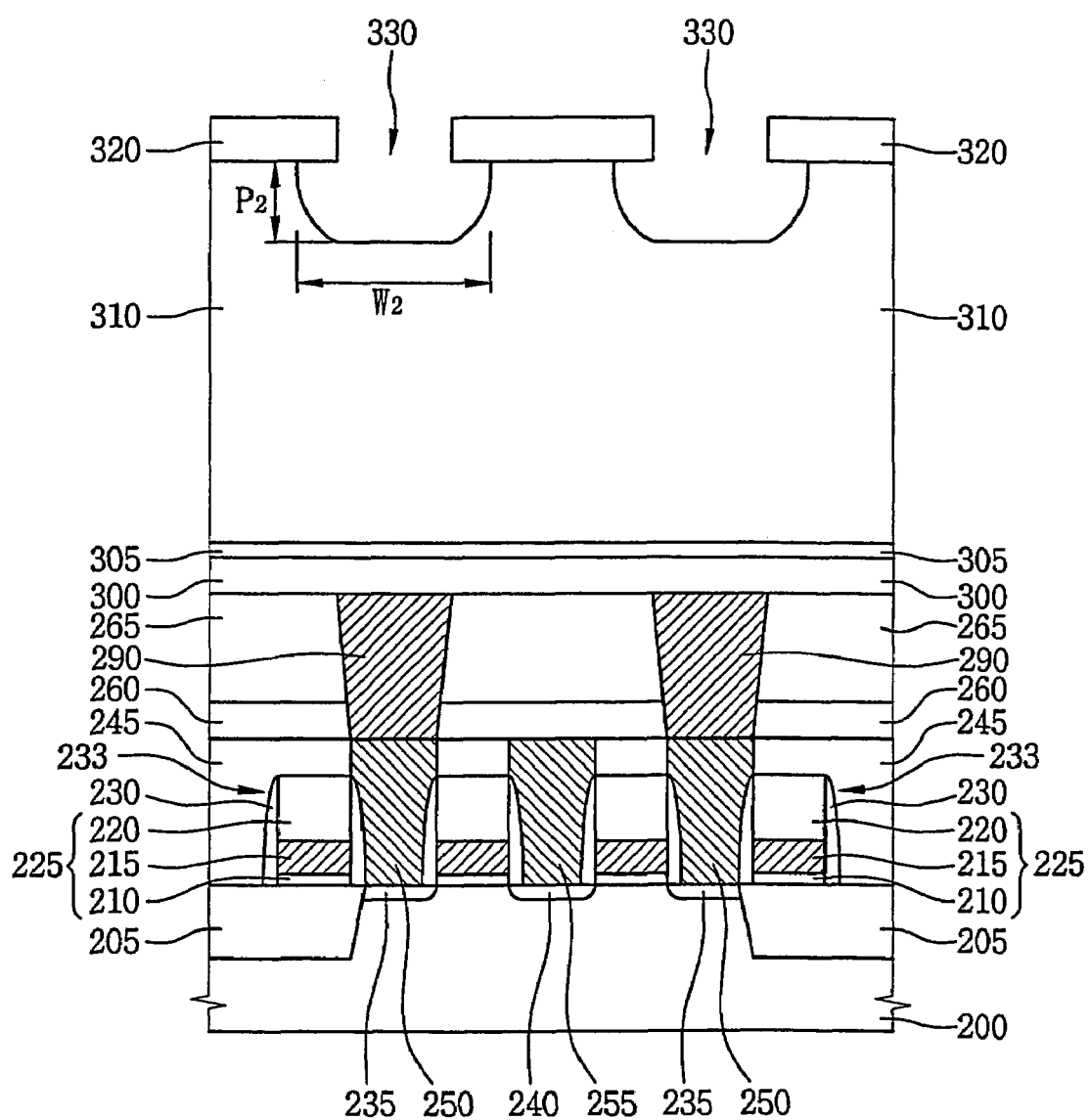
Figure 13:
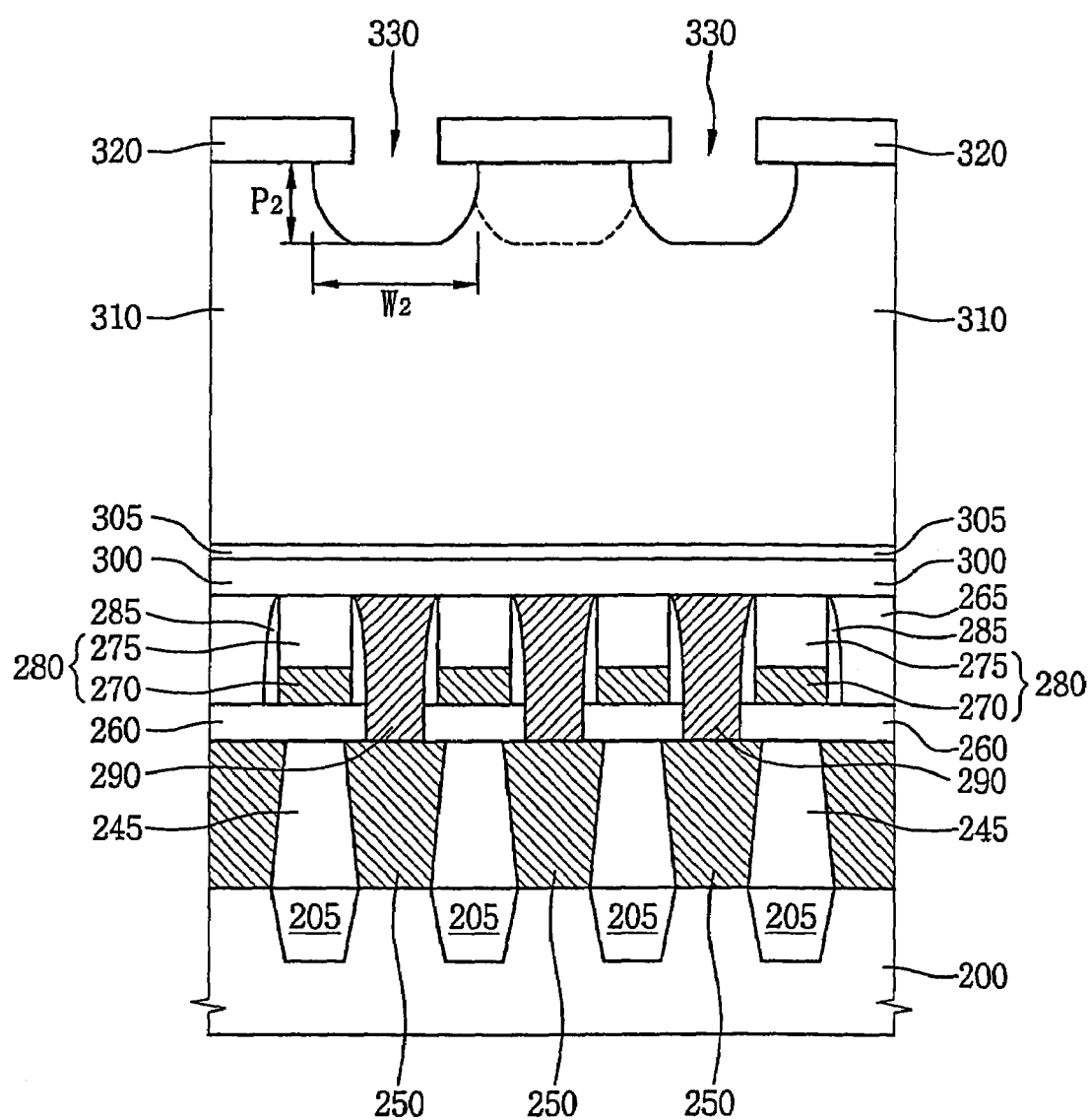
Figure 14:
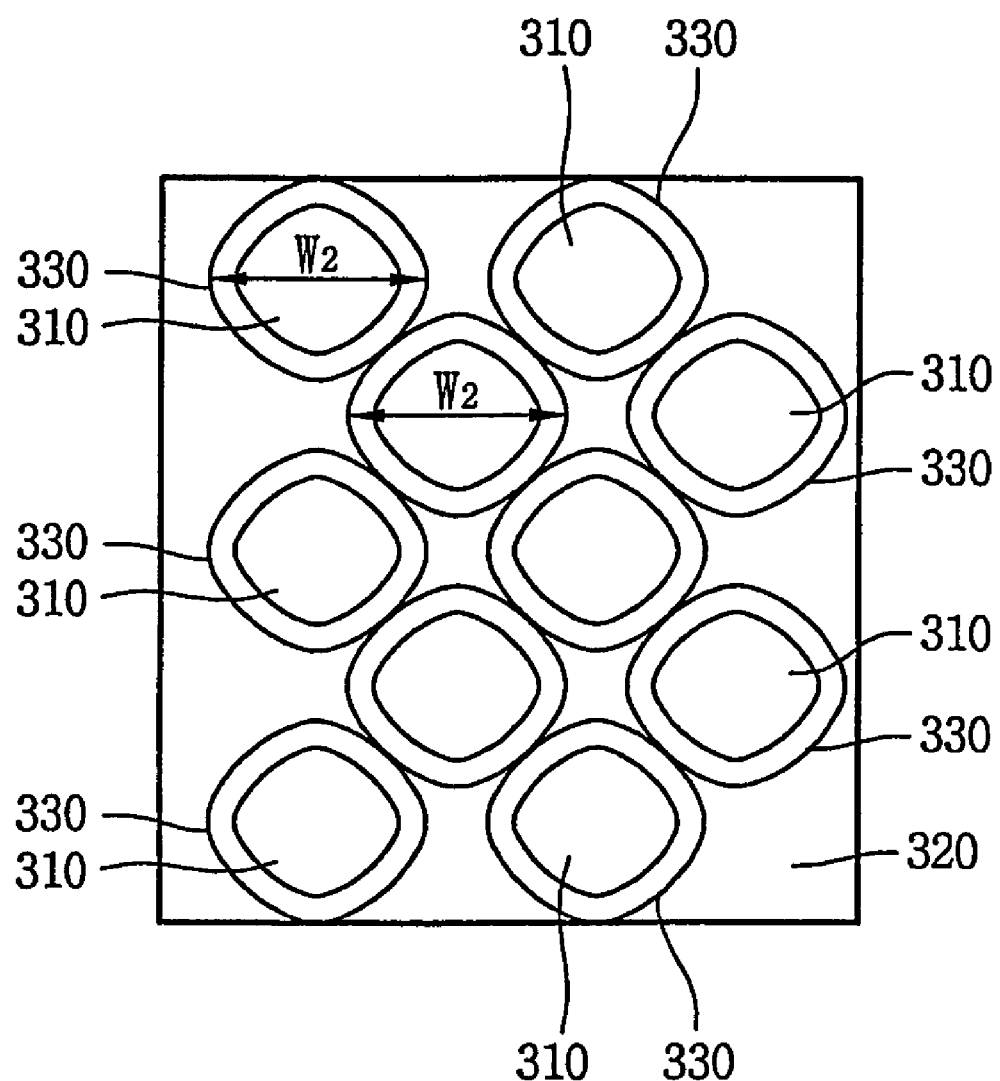

FIGS. 12 and 13 are cross sectional views illustrating a step for forming second openings 330, and FIG. 14 is a plan view illustrating the semiconductor device in FIG. 13.

Referring to FIGS. 12 to 14, using the storage node mask pattern 320 as an etching mask, the mold layer 310 including the first openings 325 is partially etched by a second etching process to form the second openings 330 at the upper portions of the mold layer 310. The second etching process corresponds to an isotropic etching process such as a wet etching process, dry etching process or a plasma etching process. After performing the second etching process, the first openings 325 are etched to thereby form the second openings 330 having extended dimensions. That is, because sidewalls and bottoms of the first openings 325 are etched in the second etching process, each of the second openings 330 has a second width of $W_2$ wider than the first width $W_1$, and a second depth $P_2$ deeper than the first depth $P_1$. Here, the second openings 330 have rounded sidewalls having predetermined curvatures in accordance with the isotropic etching process.

As shown in FIG. 14, since the second openings 330 have the extended second width $W_2$, the second openings 330 are separated from one another by predetermined identical intervals along the first direction that is substantially parallel to the bit lines 280 and the second direction that is substantially parallel to the word lines 233. However, the adjacent second openings 330 partially contact each other along a left diagonal direction and a right diagonal direction relative to the first and second directions. Therefore, all of the second openings 330 formed at the upper portions of the mold layer 310 are partially connected to each other as just described. In other words, all of the second openings 330 are partially overlapped along the left diagonal and the right diagonal directions with respect to the directions of the bit lines 280 and the word lines 233.

Figure 15:
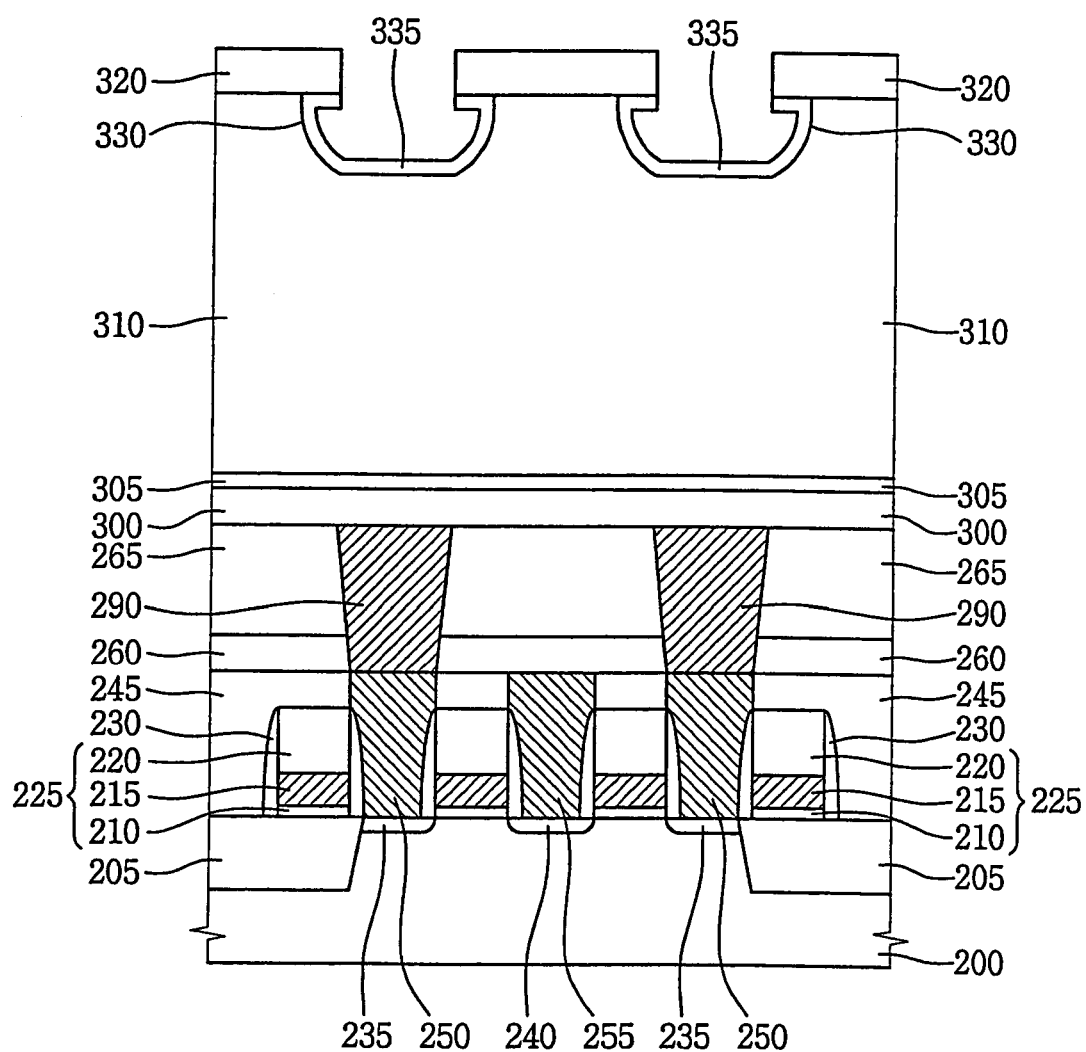
Figure 16:
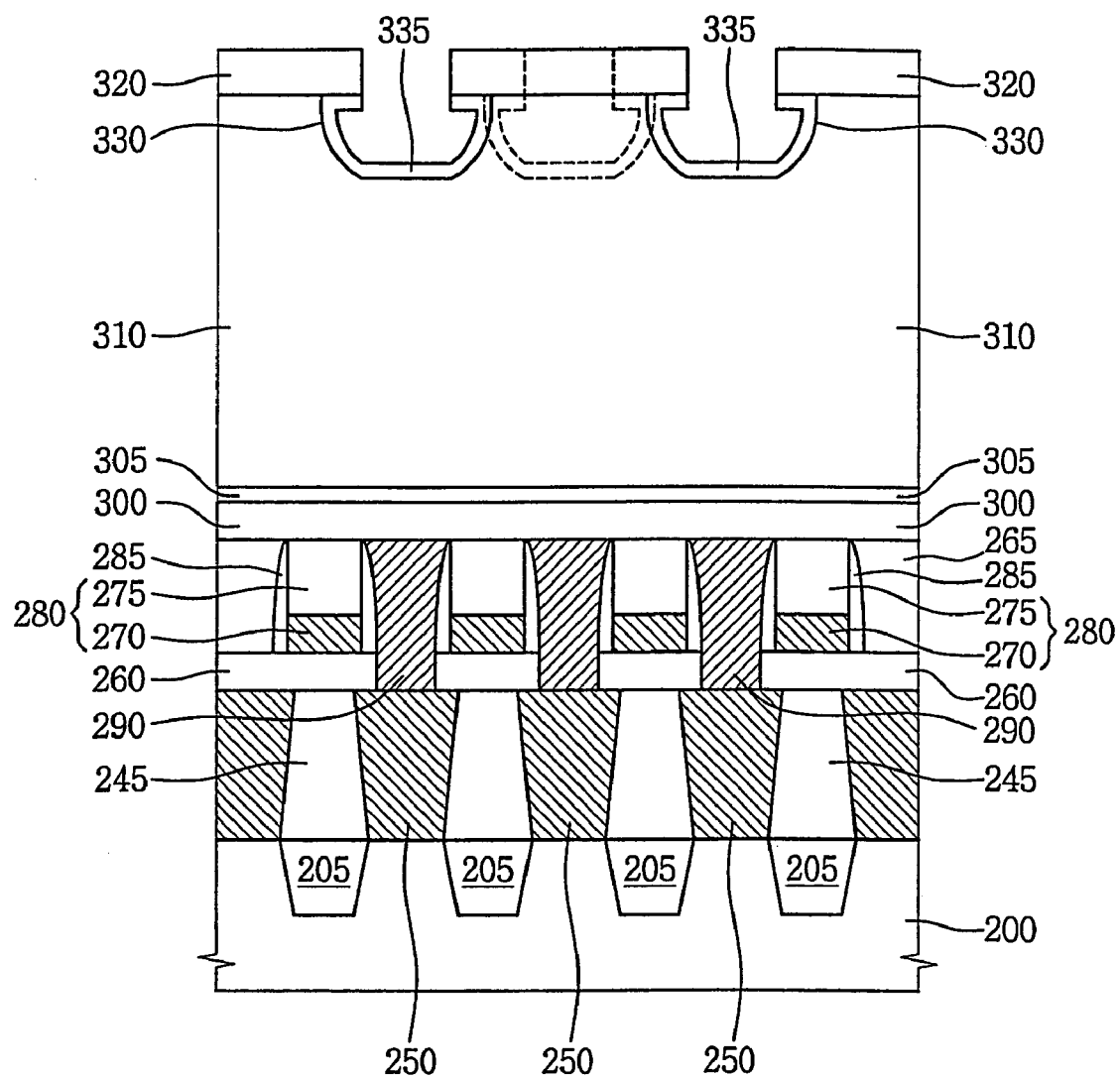
Figure 17:
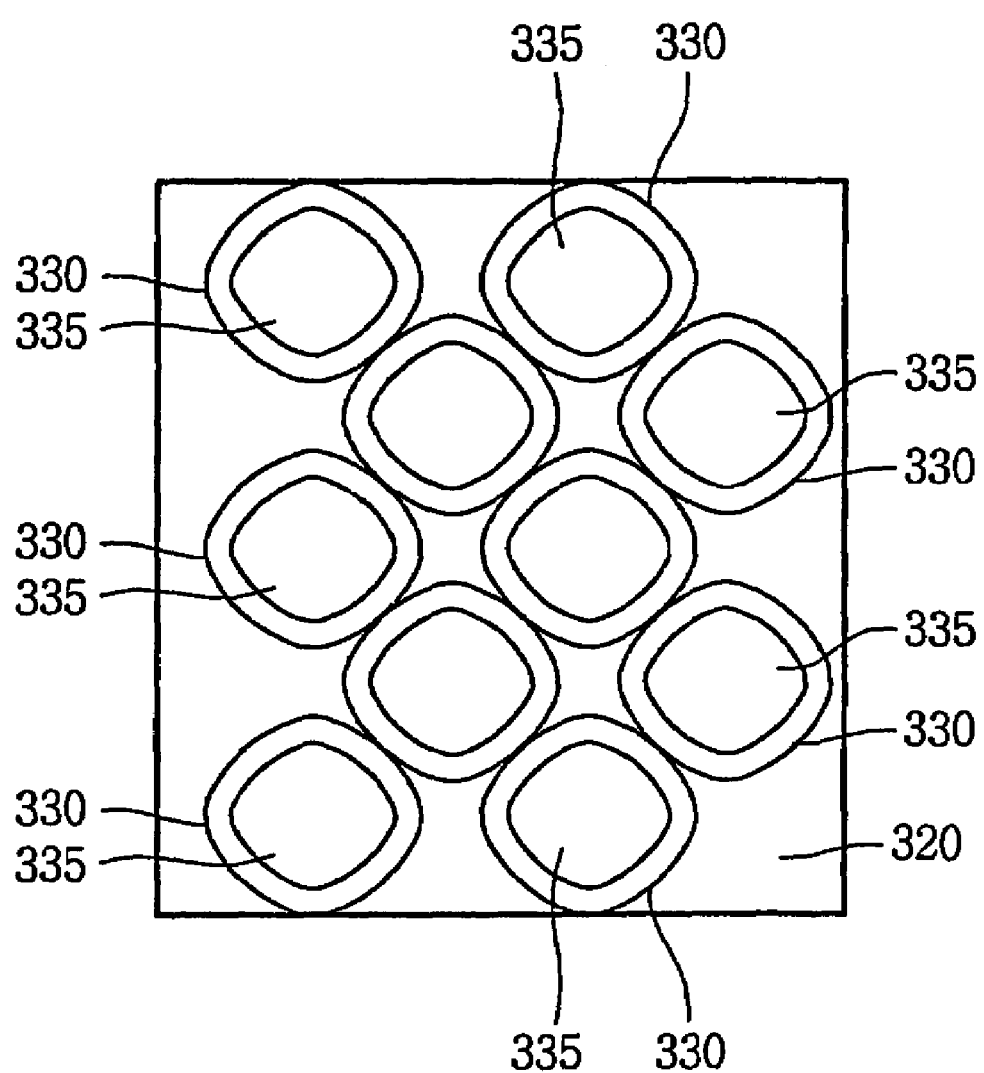

FIGS. 15 and 16 are cross sectional views illustrating a step for forming first insulation layer patterns 335, and FIG. 17 is a plan view illustrating the semiconductor device in FIG. 16.

Referring to FIGS. 15 to 17, a third insulation layer (not shown) is formed on bottoms and sidewalls of the second openings 330 and on the storage node mask pattern 320. When the second openings 330 are formed by the second etching process, bottom portions of the storage node mask pattern 320 are partially exposed. The third insulation layer is formed beneath the exposed bottom portions of the storage node mask pattern 320. The third insulation layer may be formed using insulating material that has an etching selectivity relative to the mold layer 310 and storage electrode 360. For example, the third insulation layer is formed using nitride such as silicon nitride or oxynitride such as silicon oxynitride.

The third insulation layer is etched by a CMP process, an etch back process or a combination process of CMP and etch back until the storage node mask pattern 320 is exposed. Hence, the first insulation layer patterns 335 are formed on the bottoms and sidewalls of the second openings 330, respectively. The first insulation layer patterns 335 are also formed beneath the exposed bottom portions of the storage node mask pattern 320. Each of the first insulation layer patterns 335 substantially has a ring shape cross-section (in a plan view) over the semiconductor substrate 200. Here, upper portions of the first insulation layer patterns 335 are wider than lower portions of the first insulation layer patterns 335 because the second openings 330 have the rounded sidewalls. In addition, since the first insulation layer patterns 335 are formed beneath the exposed bottom portions of the storage node mask pattern 320, the upper portions of the first insulation layer patterns 335 are inwardly bent. That is, the first insulation layer patterns 335 have bowl structures that include the horizontally bent upper portions. Because the second openings 330 have rounded sidewalls by the predetermined curvatures, the first insulation layer patterns 335 have rounded sidewalls by the predetermined curvatures.

As shown in FIG. 17, because the first insulation layer patterns 335 are positioned in the second openings 330 partially connected to each other along the left diagonal and the right diagonal directions relative to the first and second directions, adjacent first insulation layer patterns 335 are also partially connected with each other in the same left diagonal and right diagonal directions. In other words, all the first insulation layer patterns 335 partially make contact with one another along the left and right diagonal directions relative to the bit lines 280 and the word lines 233.

Figure 18:
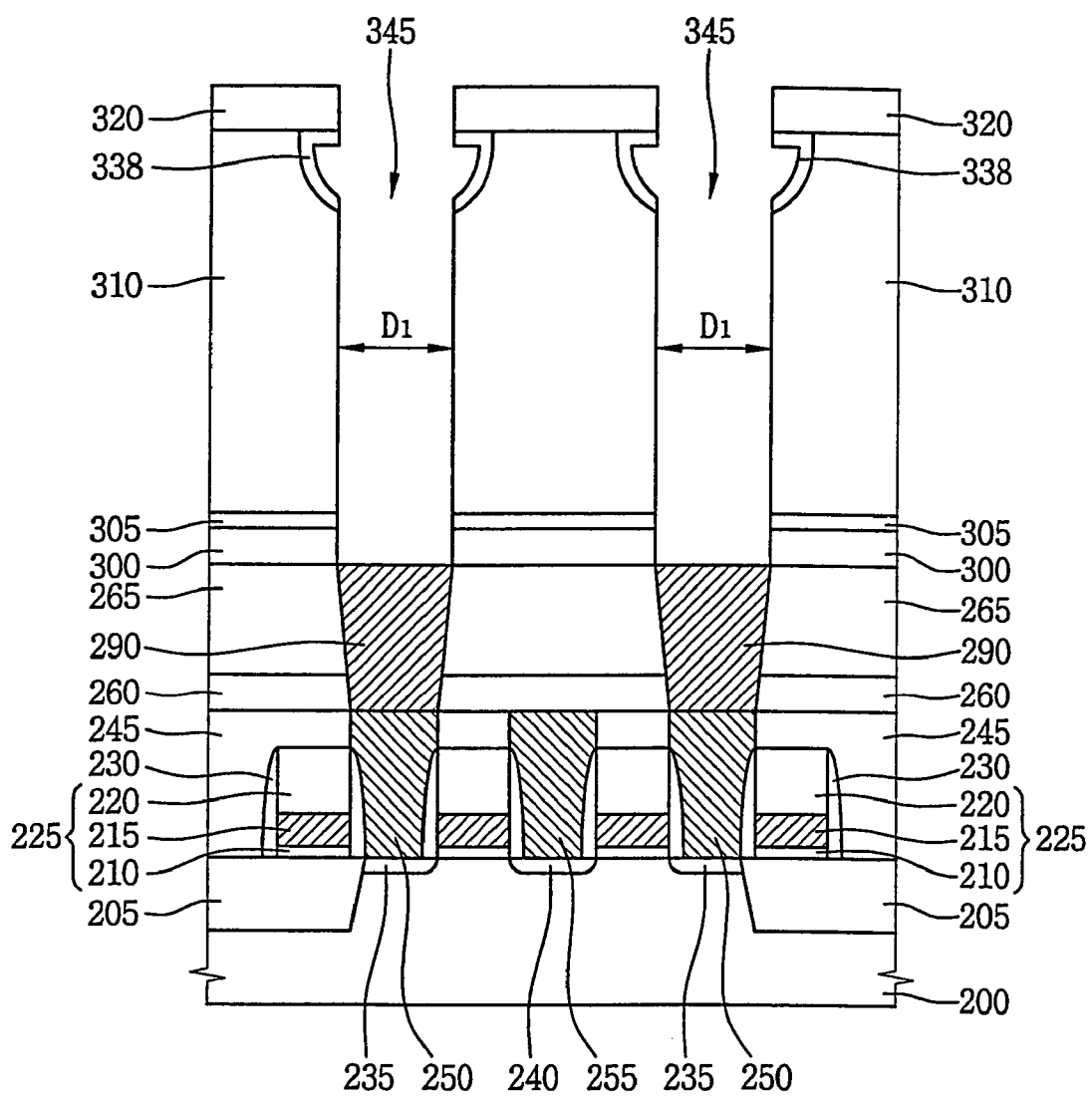
Figure 20:
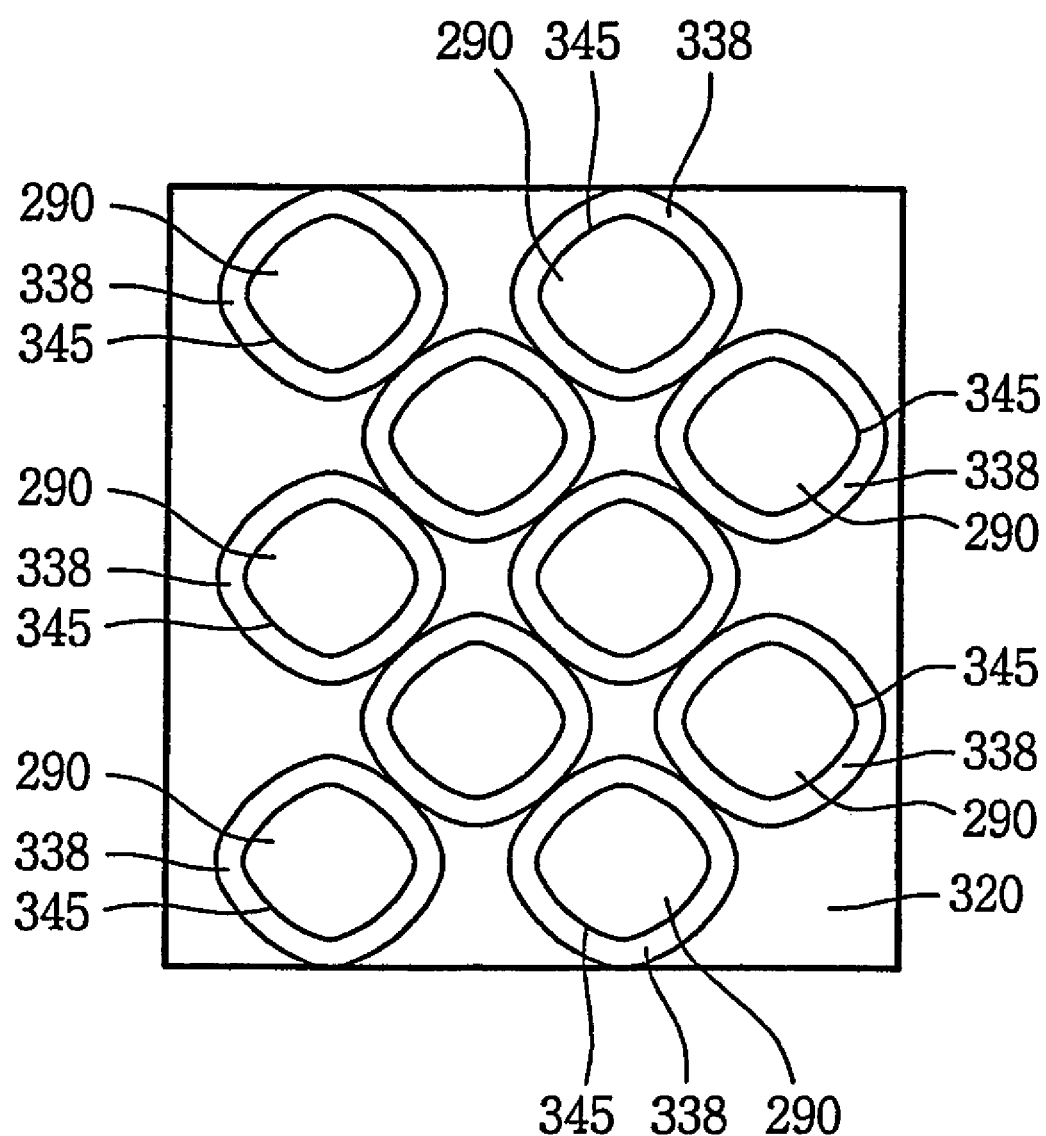

FIGS. 18 and 19 are cross sectional views illustrating a step for forming fourth contact holes 345, and FIG. 20 is a plan view illustrating the semiconductor device in FIG. 19.

Referring to FIGS. 18 to 20, continuously using the storage node mask pattern 320 as an etching mask, the first insulation layer patterns 335 and the mold layer 310 are partially etched until the etching stop layer 305 is exposed. Here, bottom portions of the first insulation layer patterns 335 are etched to form second insulation layer patterns 338. Therefore, the fourth contact holes 345 corresponding to second storage node contact holes are formed through the mold layer 310. Simultaneously, the second insulation layer patterns 338 are formed at upper sidewalls of the fourth contact holes 345, respectively.

The etching stop layer 305 and the fourth insulating interlayer 300 are partially etched to complete the fourth contact holes 345 that expose the fourth pads 290, respectively. Each of the fourth contact holes 345 has a first diameter $D_1$.

In one embodiment, the mold layer 310, the etching stop layer 305 and the fourth insulating interlayer 300 may be successively etched to form the fourth contact holes 345 exposing the fourth pads 290. Alternatively, the mold layer 310 and the fourth insulating interlayer 300 are partially etched to thereby form the fourth contact holes 345 without formation of the etching stop layer 305.

The bottom portions of the first insulation layer patterns 335 are etched to form the second insulation layer patterns 338 having opened bottom portions. The second insulation layer patterns 338 are positioned at the upper sidewalls of the fourth contact holes 345 having the first diameter $D_1$. After an etching process for forming the fourth contact holes 345 is carried out, the second insulation layer patterns 338 have ring shape cross sections and bowl structure having opened bottom portions. The second insulation layer patterns 338 also have rounded sidewalls substantially identical to those of the first insulation layer patterns 335. Because upper portions of the second insulation layer patterns 338 are horizontally bent toward the fourth contact holes 345, the second insulation layer patterns 338 entirely have the bowl structures that have opened bottom portions and horizontally bent upper portions.

Figure 21:
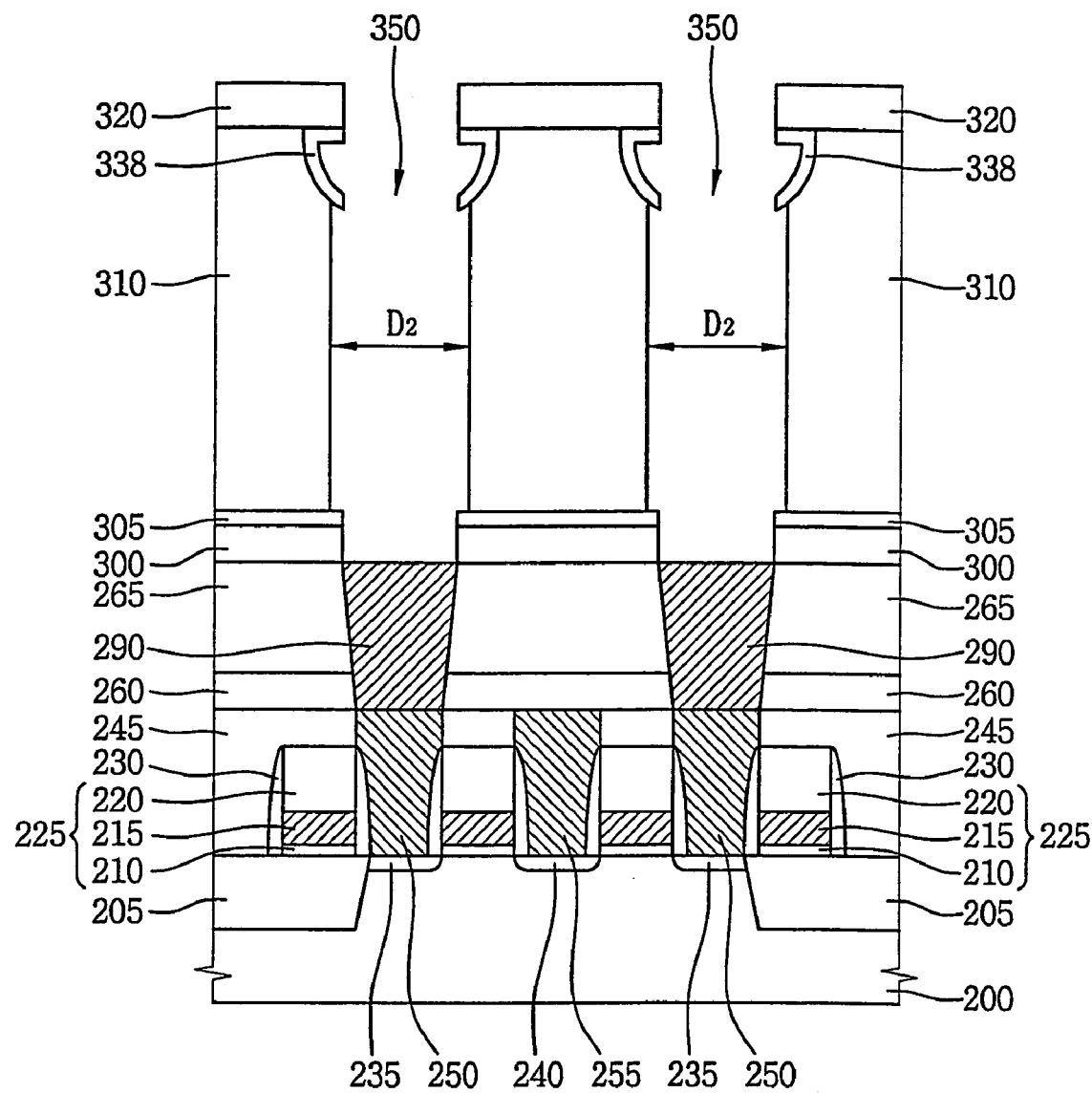
Figure 22:
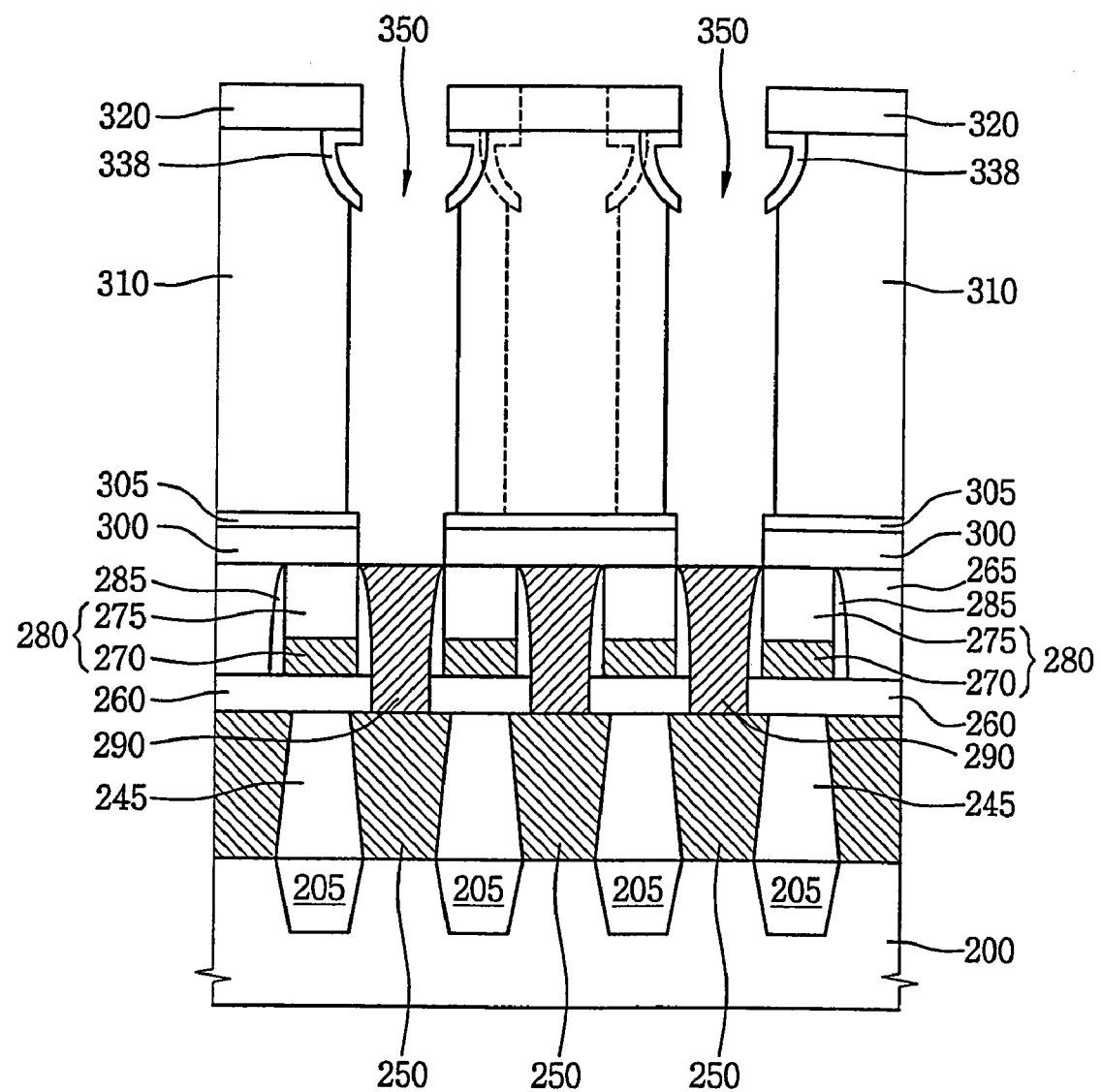

FIGS. 21 and 22 are cross sectional views illustrating a step for forming fifth contact holes 350.

Referring to FIGS. 21 and 22, a cleaning process is performed on the semiconductor substrate 200 including the mold layer 310. After the cleaning process is carried out, the fourth contact holes 345 of the first diameter $D_1$ are extended to thereby form the fifth contact holes 350 having a second diameter $D_2$ because the mold layer 310 is slightly etched in the cleaning process. The fifth contact holes 350 correspond to third storage node contact holes. The cleaning process may be performed using a cleaning solution that includes at least two of deionized water, ammonia solution and sulfuric acid. The cleaning process may be performed for about 5 to about 20 minutes.

According to the present invention, the fifth contact hole 350 has an area wider than that of the fourth contact hole 345 by about 50 to about 100 percent. Namely, the second diameter $D_2$ of the fifth contact hole 350 is wider than the first diameter $D_1$ of the fourth contact hole 345 by about 50 to about 100 nm. For example, in a semiconductor device having a storage capacity of several giga-bites, a contact hole for forming a capacitor generally has a diameter of about 100 to about 200 nm. In the present invention, an interval between adjacent fifth contact holes 350 may be about 160 to about 200 nm along the first direction substantially parallel to the bit lines 280. Additionally, an interval between adjacent fifth contact holes 350 may be about 130 to about 170 nm along the second direction substantially parallel to the word lines 233. Furthermore, an interval between adjacent fifth contact holes 350 may be about 60 to about 100 nm along the left and right diagonal directions relative to the first and second directions. As shown FIGS. 18 and 21, the fourth contact hole 345 of the first diameter $D_1$ is etched by the cleaning process to thereby form the fifth contact hole 350 having the extended second diameter $D_2$. Thus, the fifth contact hole 350 has the extended area wider than that of the fourth hole 345 by about 50 to about 100 percent. Because the capacitor 380 is formed on the basis of the fifth contact hole 350, the capacitor 380 also has an extended area wider than that of the conventional capacitor by about 50 to about 100 percent. As a result, the capacitor 380 has a greatly improved capacitance in accordance with the cleaning process.

When the fifth contact holes 350 are formed through the mold layer 310, lower portions of the second insulation layer patterns 338 are partially or entirely exposed through the fifth contact holes 350 since the second insulation layer patterns 338 may not etched by the cleaning process. The exposed lower portions of the second insulation layer patterns 338 are supported by the storage electrode 360 that will be formed on the exposed portions of the second insulation layer patterns 338.

Figure 23:
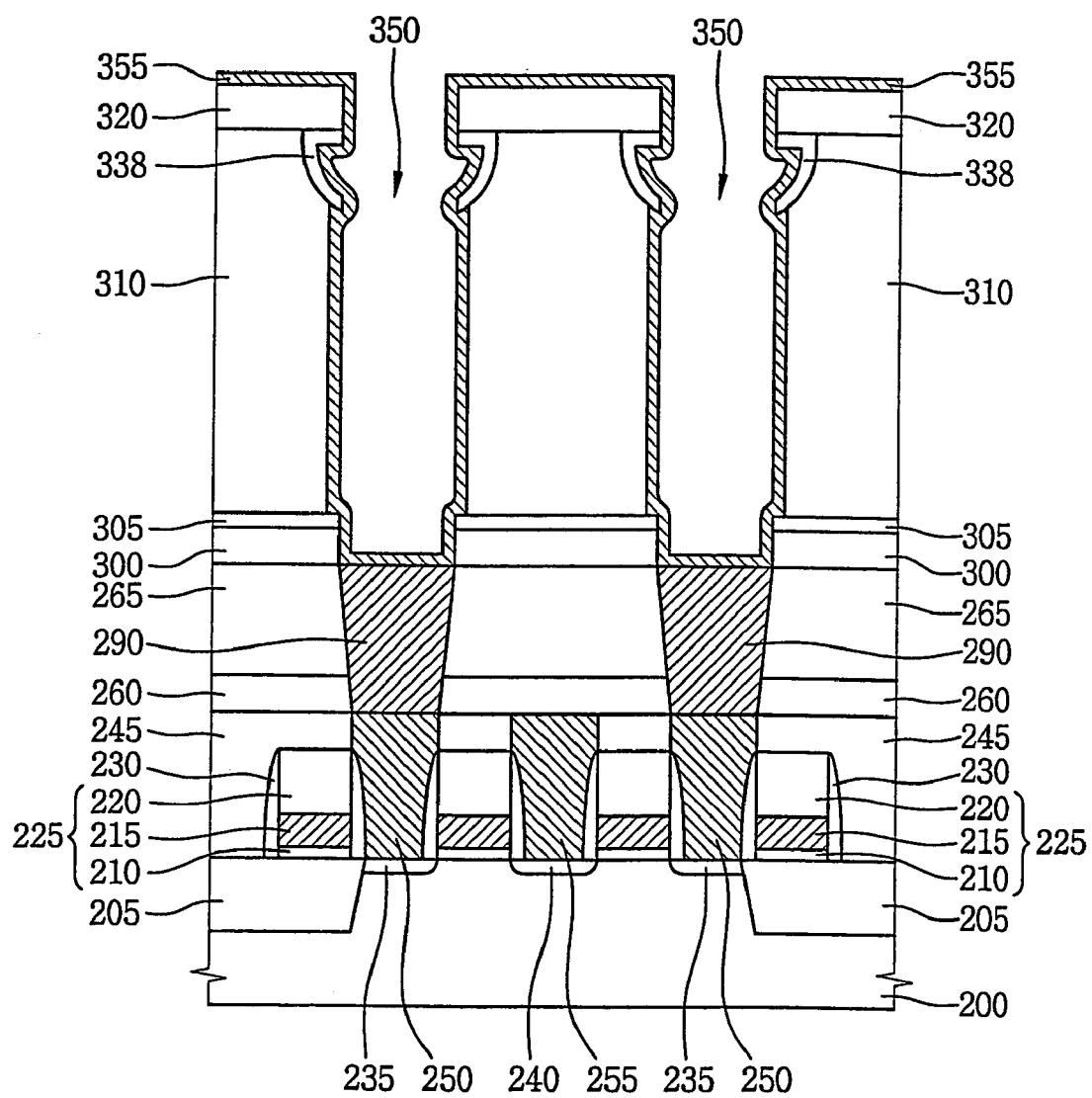
Figure 24:
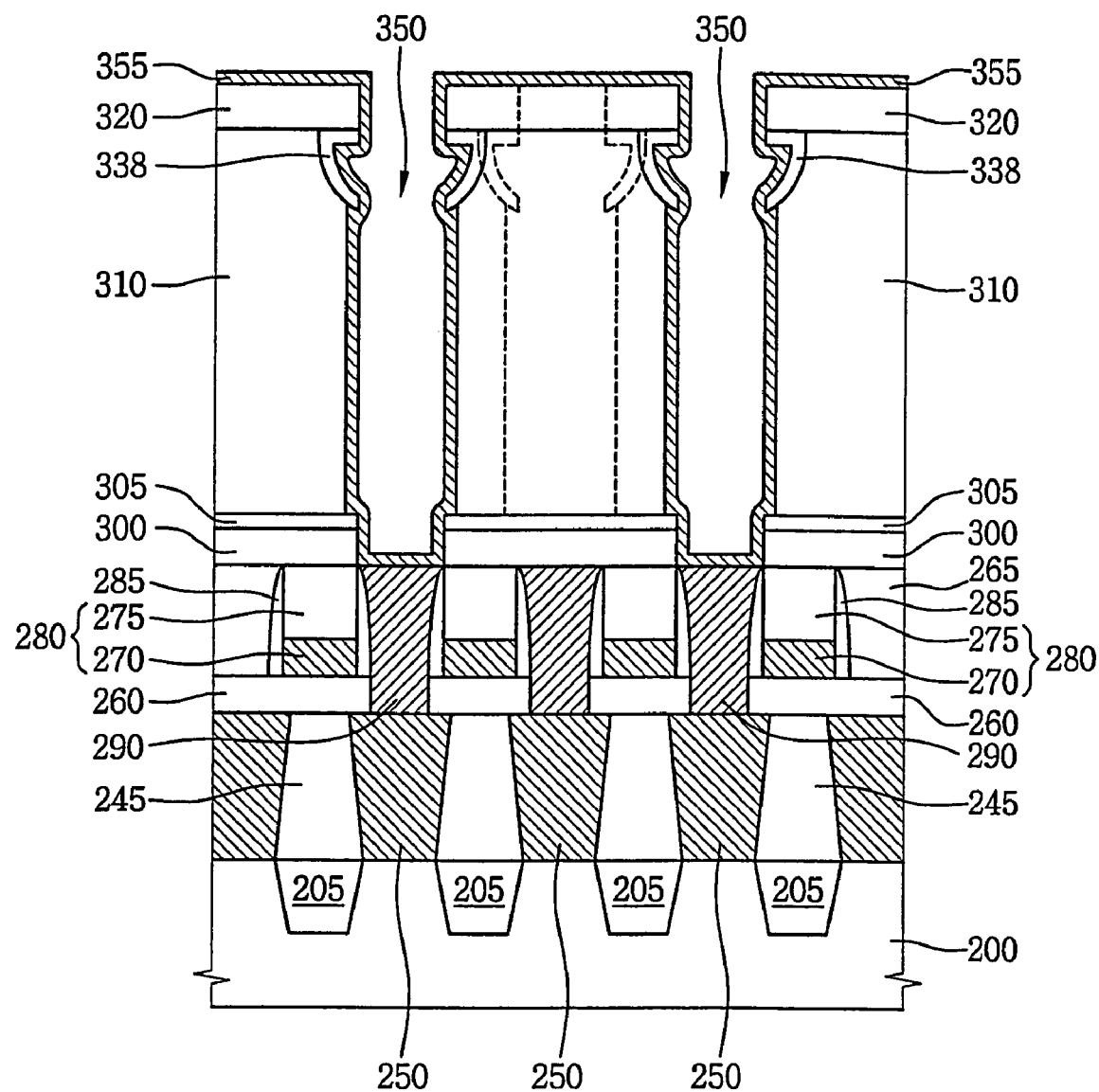

FIGS. 23 and 24 are cross sectional views illustrating a step of forming a fifth conductive layer 355.

Referring to FIGS. 23 and 24, the fifth conductive layer 355 is formed on the exposed fourth pads 290, on the sidewall of the extended fifth contact holes 350, on insides of the second insulation layer patterns 338, and on the storage node mask pattern 320. The fifth conductive layer 355 may be formed using conductive material such as doped polysilicon, titanium/titanium nitride, copper, etc. The fifth conductive layer 355 is attached to the insides of the second insulation layer patterns 338, and is formed beneath the exposed lower portions of the second insulation layer patterns 338. Therefore, the second insulation layer patterns 338 are stably supported by the fifth conductive layer 355.

Figure 25:
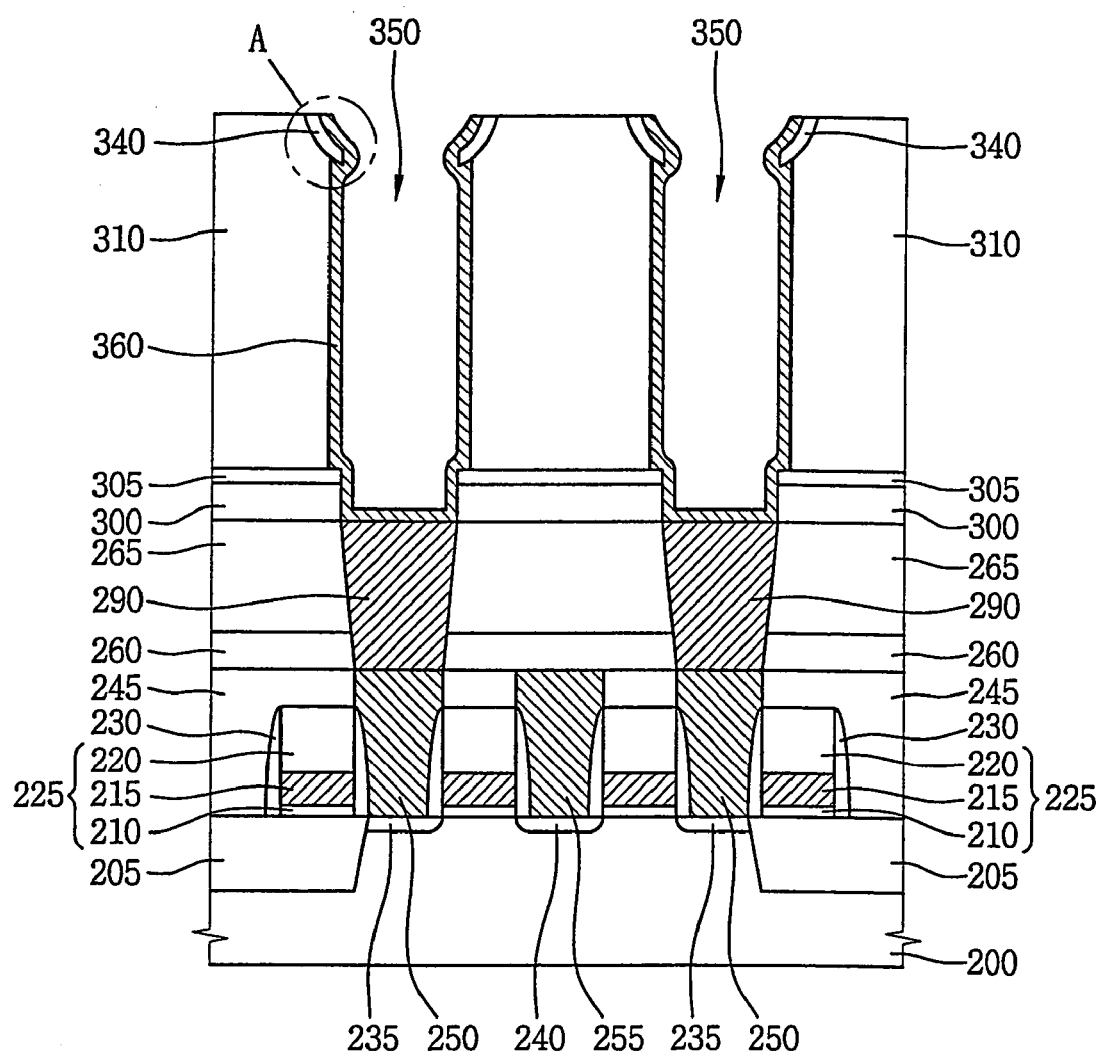
Figure 27:
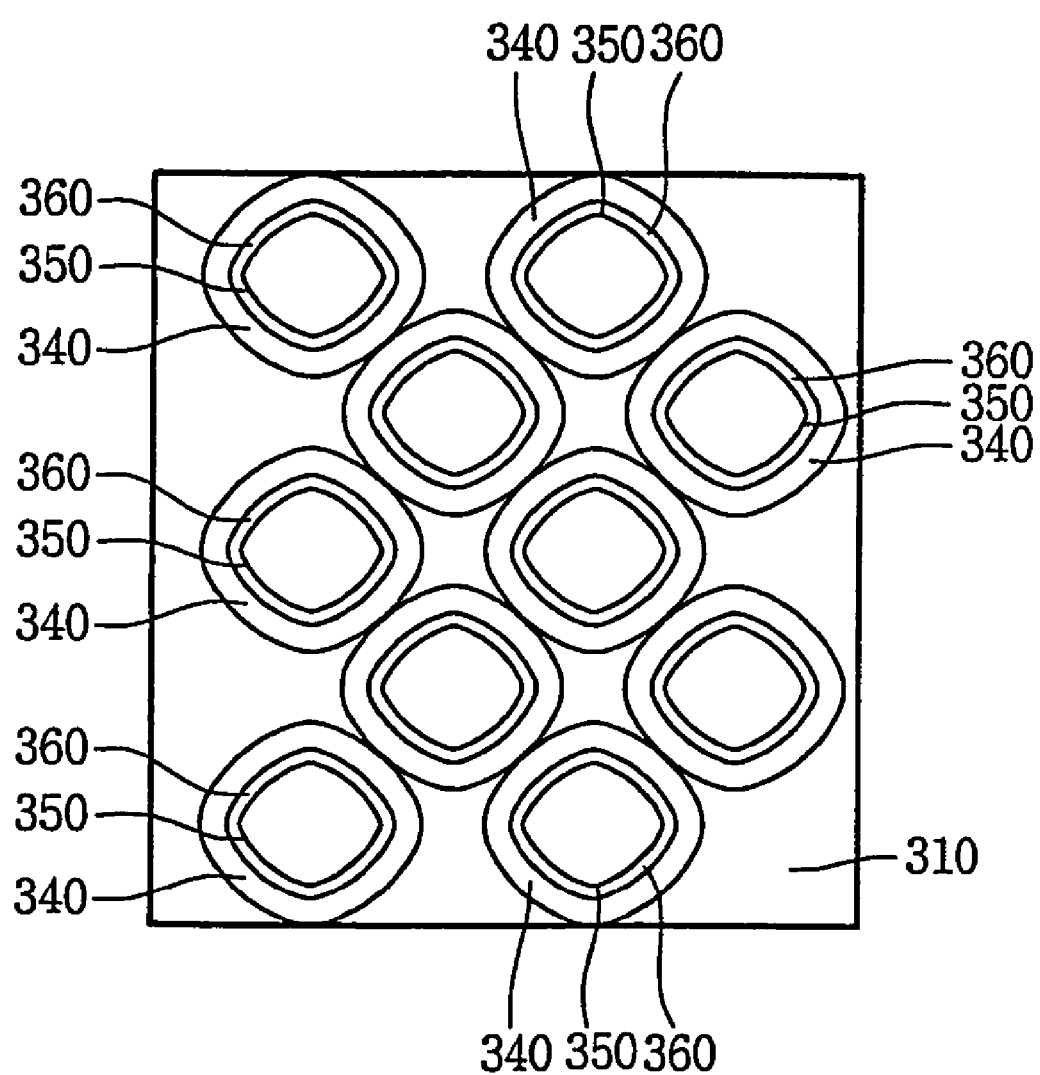

FIGS. 25 and 26 are cross sectional views illustrating the steps for forming the storage electrodes 360 and the stabilizing members 340, and FIG. 27 is a plan view illustrating the semiconductor device in FIG. 26.

Referring to FIGS. 25 to 27, using a CMP process, an etch back process or a combination process of CMP and etch back, the fifth conductive layer 355, the storage node mask pattern 320 and the second insulation layer patterns 338 are etched until the mold layer 310 is exposed. As a result, the storage electrodes 360 and the stabilizing members 340 are simultaneously formed in the fifth contact holes 350. The stabilizing members 340 encompass upper portions of the storage electrodes 360 substantially having cylindrical shapes, respectively. The stabilizing members 340 have ring-shaped cross sections (in a plan view), as did the second insulation layer patterns 338. The stabilizing members 340 also have rounded sidewalls by the predetermined curvatures. The stabilizing members 340 have ring-shaped structures that encompass the upper portions of the storage electrodes 360. Here, the upper portion of the stabilizing members 340 have a diameter wider than those of the lower portion of the stabilizing members 340. That is, the stabilizing members 340 have bowl structures that include opened bottom portions. Because each of the stabilizing members 340 encompass the upper portion of the storage electrode 360, adjacent storage electrodes 360 are supporting each other by interposing the stabilizing members 340 along the left and right diagonal directions relative to the first and second directions. In other words, all of the storage electrodes 360 support one another by interposing the stabilizing members 340 along the left and right directions relative to the bit lines 280 and the word lines 233.

Figure 28:
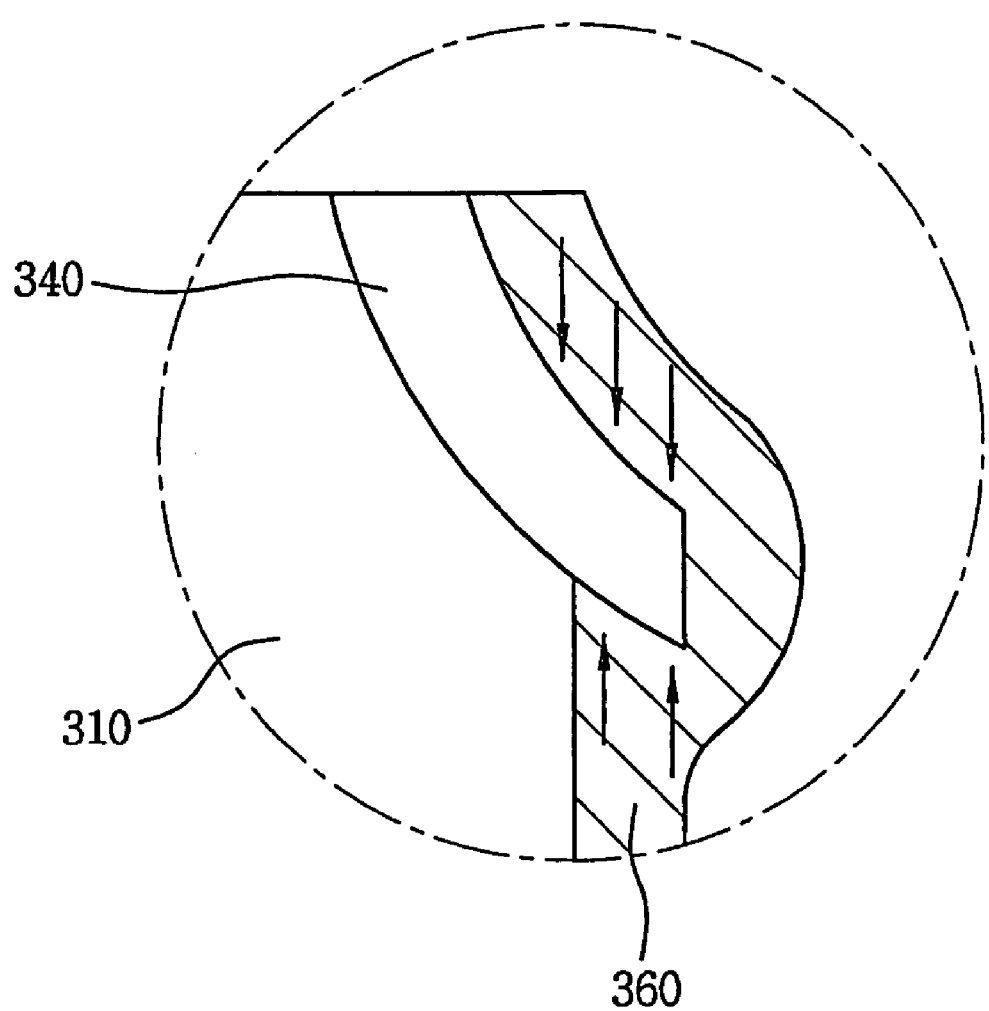
FIG. 28 is an enlarged cross-sectional view illustrating "A" in FIG. 25.
Figure 29:
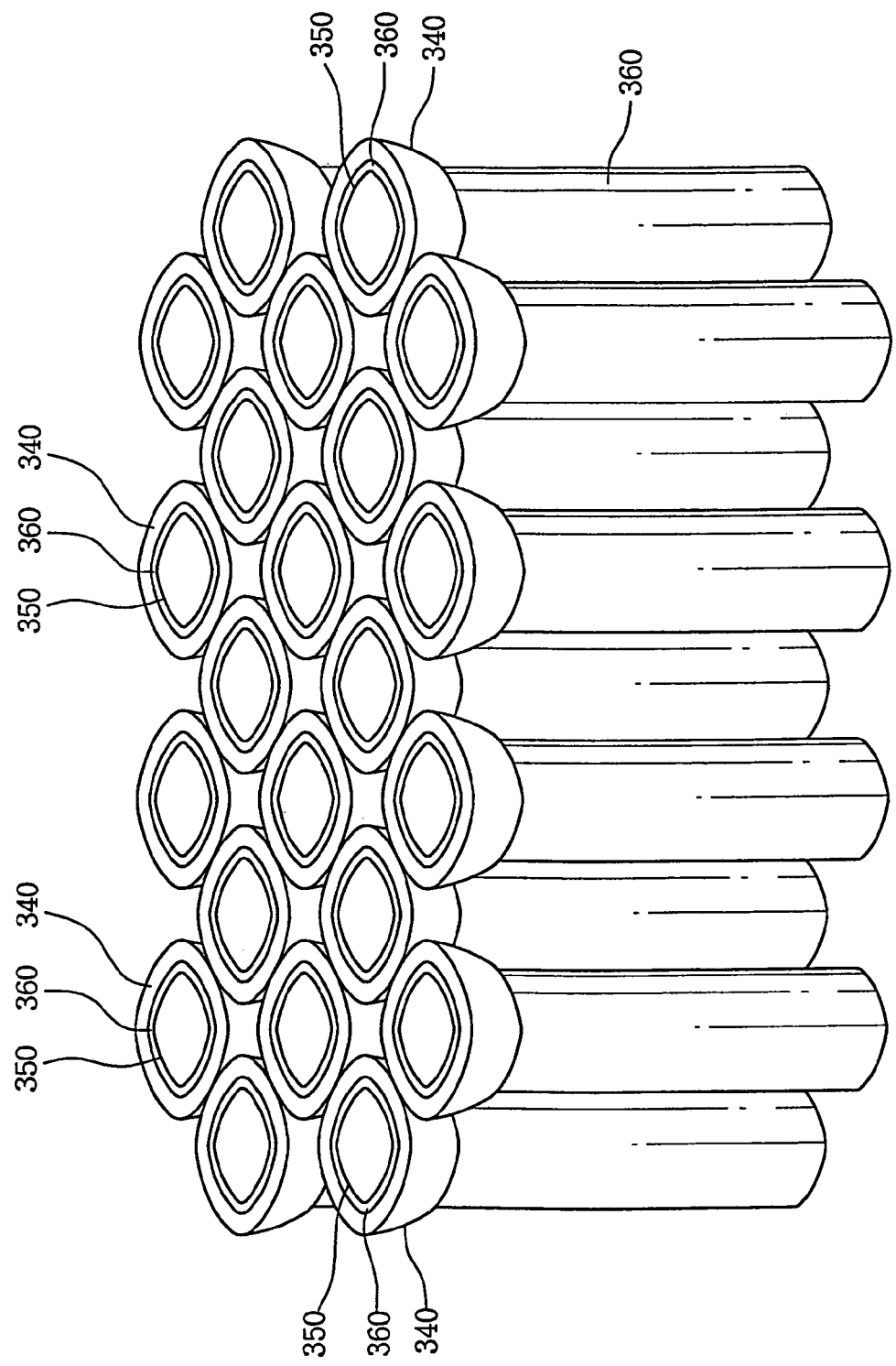
FIG. 29 is a perspective view illustrating the semiconductor device in FIG. 27.

FIG. 28 is an enlarged cross sectional view illustrating a portion "A" in FIG. 25, and FIG. 29 is a schematic perspective view illustrating the storage electrodes 360 and the stabilizing members 340 of the semiconductor device in FIG. 25.

Referring to FIGS. 25, 28 and 29, the storage electrode 360 is continuously formed from a sidewall of the stabilizing member 340 to a bottom portion of the stabilizing member 340. Thus, the stabilizing member 340 is firmly fixed to the storage electrode 360 because the stabilizing member 340 is partially embedded within the storage electrode 360. In other words, in a mechanical fashion, the storage electrode 360 partially embeds the stabilizing member 340, thus firmly supporting the bottom portion of the stabilizing member 340 as shown by the arrows in FIG. 28. Also, the upper portion of the stabilizing member 340 encompasses an upper portion of the storage electrode 360.

The stabilizing members 340 are connected to one another along the left and right diagonal directions relative to the first and second directions so that storage electrodes 360 do not collapse in subsequent semiconductor manufacturing processes including an etching process for forming the storage electrodes 360, although the storage electrodes 360 have a very high aspect ratio (to improve the capacitance of the capacitors 380).

In addition, the storage electrodes 360 are formed in the extended fifth contact holes 350 so that the storage electrodes 360 have enlarged areas to further improve the capacitance of the capacitors 380. Further, since the stabilizing members 340 have bowl structures that include lower portions and upper portions wider than the lower portions, the upper portions of the storage electrodes 360 have substantially identical structures of those of the stabilizing members 340. Hence, the storage electrodes 360 have extended upper portions in accordance with the stabilizing members 340. Namely, the area of the storage electrode 360 is primarily extended in accordance with formation of the fifth contact hole 350, and then is secondarily extended in accordance with formation of the stabilizing member 340. As a result of this total increased area, the capacitors 380, including the storage electrodes 360, have a greatly improved capacitance when the capacitors 380 are formed in a semiconductor memory cell.

Figure 30:
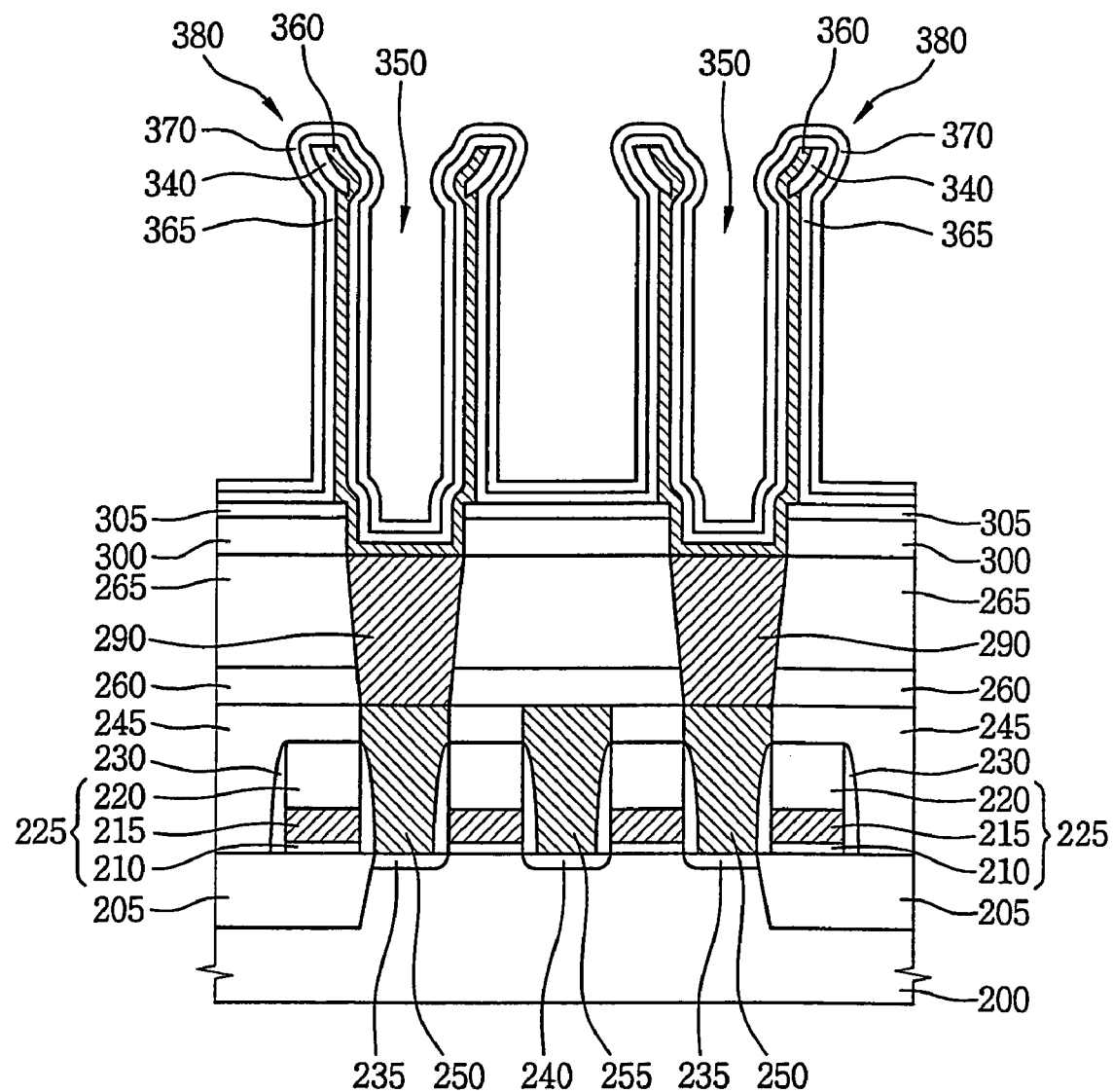
Figure 31:
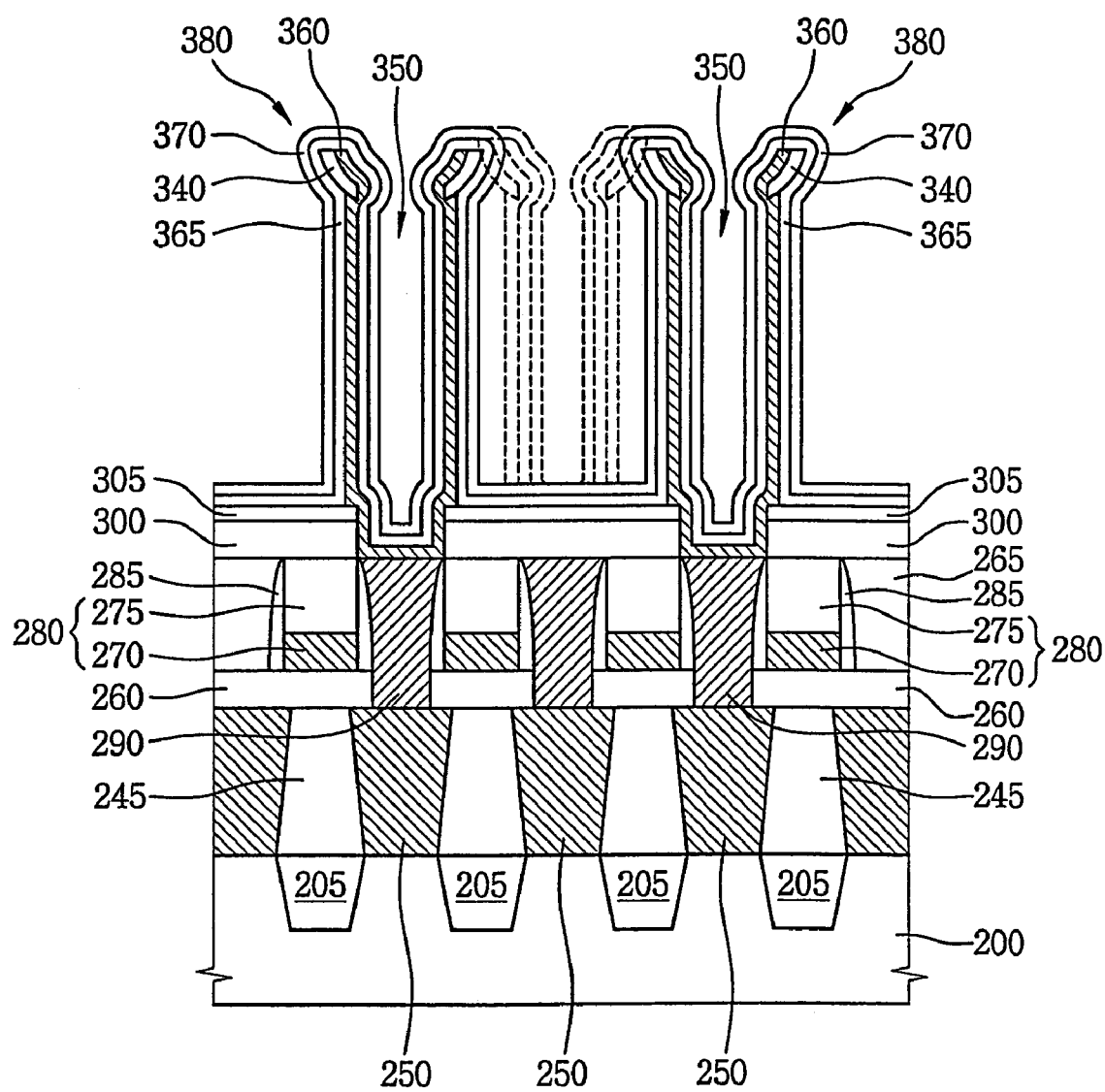

FIGS. 30 and 31 are cross sectional views illustrating steps for forming the capacitors 380.

Referring to FIGS. 30 and 31, after the mold layer 310 is removed by a dry or wet etching process, dielectric layers 365 and plate electrodes 370 are successively formed on the storage electrodes 360 when the stabilizing members 340 are fixed to the storage electrodes 360, thereby forming the capacitors 380 over the semiconductor substrate 200.

A fifth insulating interlayer (not shown) is formed on the capacitors 380 to electrically isolate the capacitors 380 from upper wiring (not shown) successively formed thereon. When the upper wiring is formed on the fifth insulating interlayer, the semiconductor device including the capacitors 380 is completed.

According to the present invention, the storage electrodes 360 are formed using doped polysilicon or metal such that the capacitors 380 including the storage electrodes 360 may be advantageously employed for a silicon-insulator-silicon (SIS) structure, metal-insulator-metal (MIM) structure, metal-insulator-silicon (MIS) structure, etc.

In one embodiment of the present invention, the stabilizing members 340 are formed using polysilicon doped with first impurities, whereas the storage electrodes 360 are formed using polysilicon with second impurities. For example, the first impurities include phosphorus (P) or arsenic (As) so that the stabilizing members 340 include polysilicon doped with P type impurities. In additionally, the second impurities include boron (B) or gallium (Ga) such that the storage electrodes 360 include polysilicon doped with N type impurities. When the mold layer 310 is removed by the wet etching process using LAL solution as an etching solution, the stabilizing members 340 including P type polysilicon may have an efficient resistance with respect to the LAL solution than relative to nitride or oxynitride. Thus, the stabilizing members 340 effectively protect the storage electrodes 360 in the wet etching process for removing the mold layer 310. When the stabilizing members 340 mainly include nitride or oxynitride, because nitride or oxynitride may not have resistance with respect to the LAL solution, nitride layer or oxynitride layer may be removed in the wet etching process for removing the mold layer 310 so that the storage electrodes 360 may not be protected by the stabilizing members 340. However, when the stabilizing members 340 include polysilicon doped with the first impurities, the stabilizing members 340 may not be etched by the LAL solution in the wet etching process used for removing the mold layer 310 because the P type polysilicon has a high resistance (excellent endurance) relative to the LAL solution. Otherwise this etching would be performed so that the storage electrodes 360 are effectively protected by the stabilizing members 340 of P type polysilicon.

When the stabilizing members 340 include P type polysilicon and the storage electrodes 360 include N type polysilicon, a P-N junction is generated between the stabilizing member 340 and storage electrode 360 so that charges may not flow from the storage electrode 360 to the stabilizing member 340. Therefore, the stabilizing members 340 electrically isolate one storage electrode 360 from adjacent storage electrode 360 because the storage electrode 360 includes N type polysilicon, whereas the stabilizing member 340 includes P type polysilicon.

Figure 32:
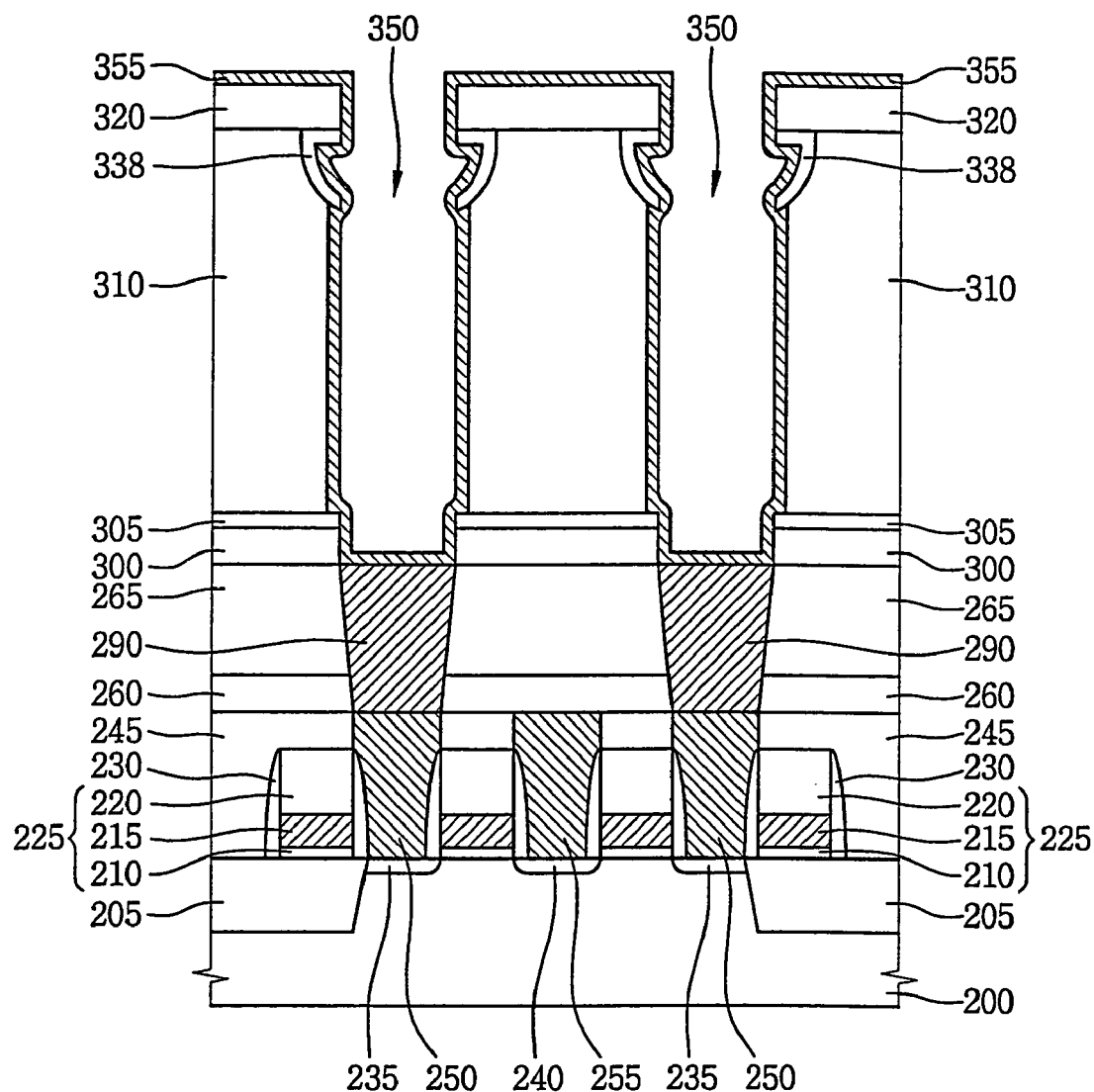
FIGS. 32 to 37 are cross-sectional views illustrating a method of a semiconductor device including capacitors in accordance with another embodiment of the present invention.
Figure 33:
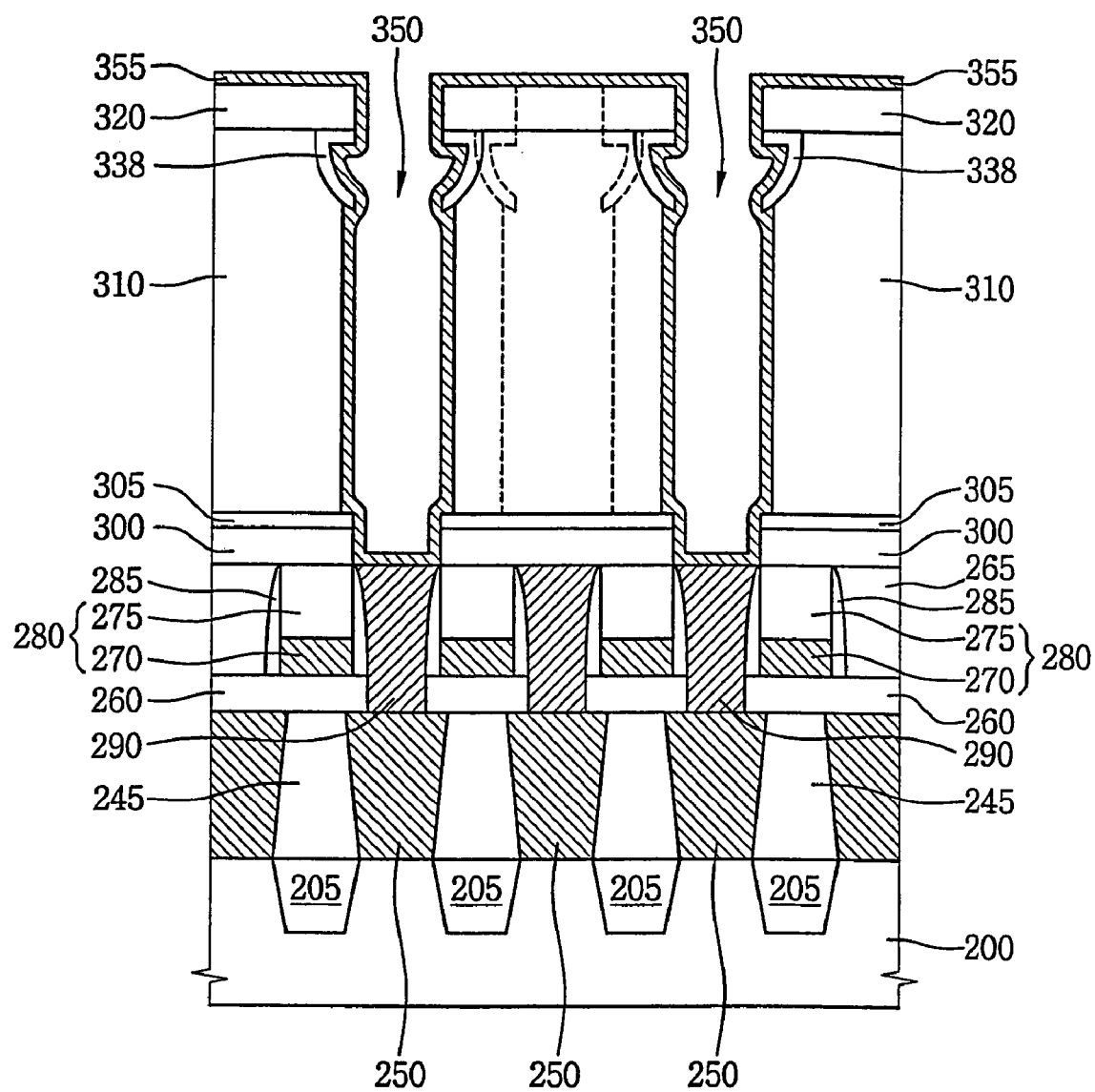
Figure 34:
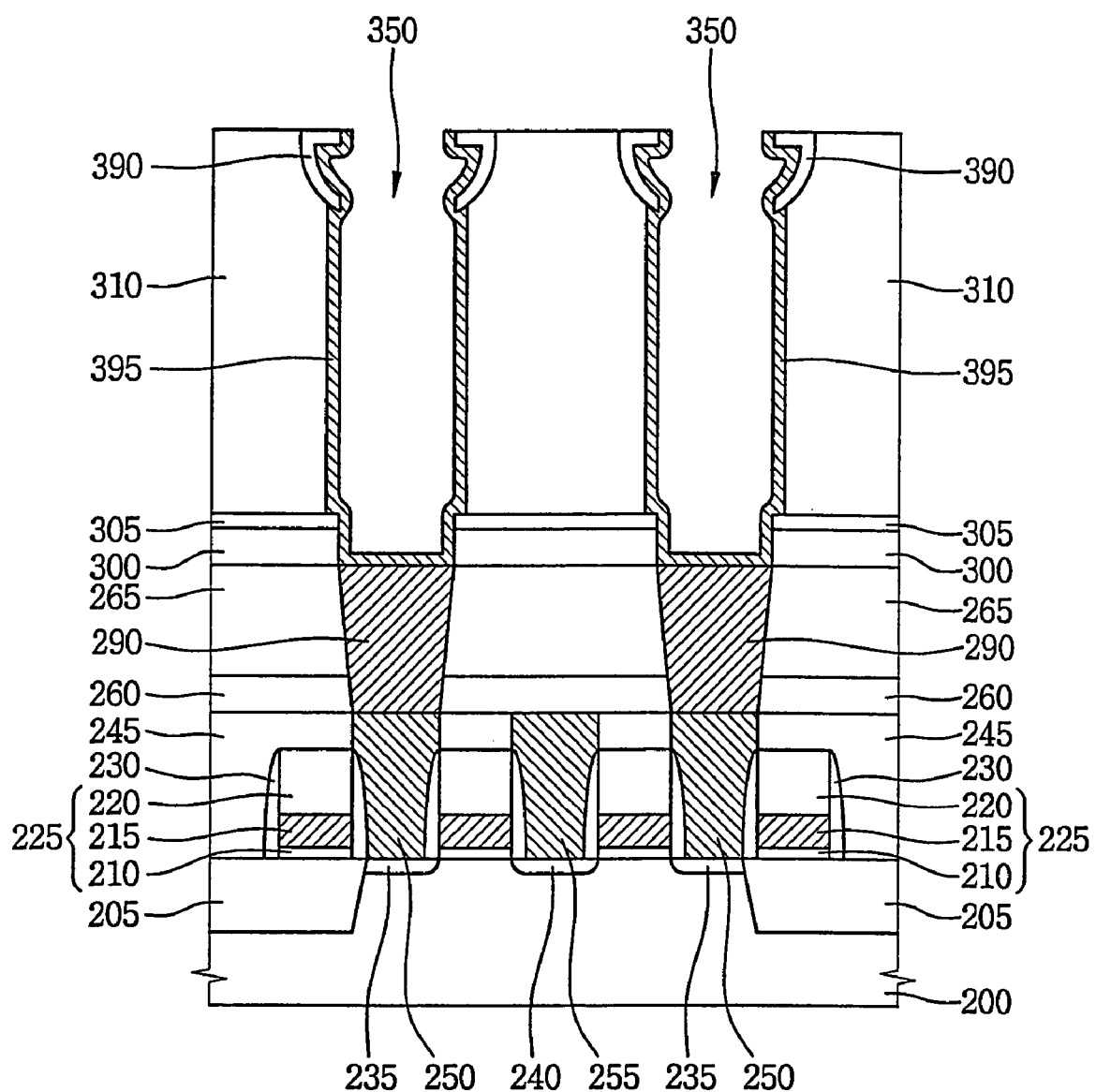
Figure 35:
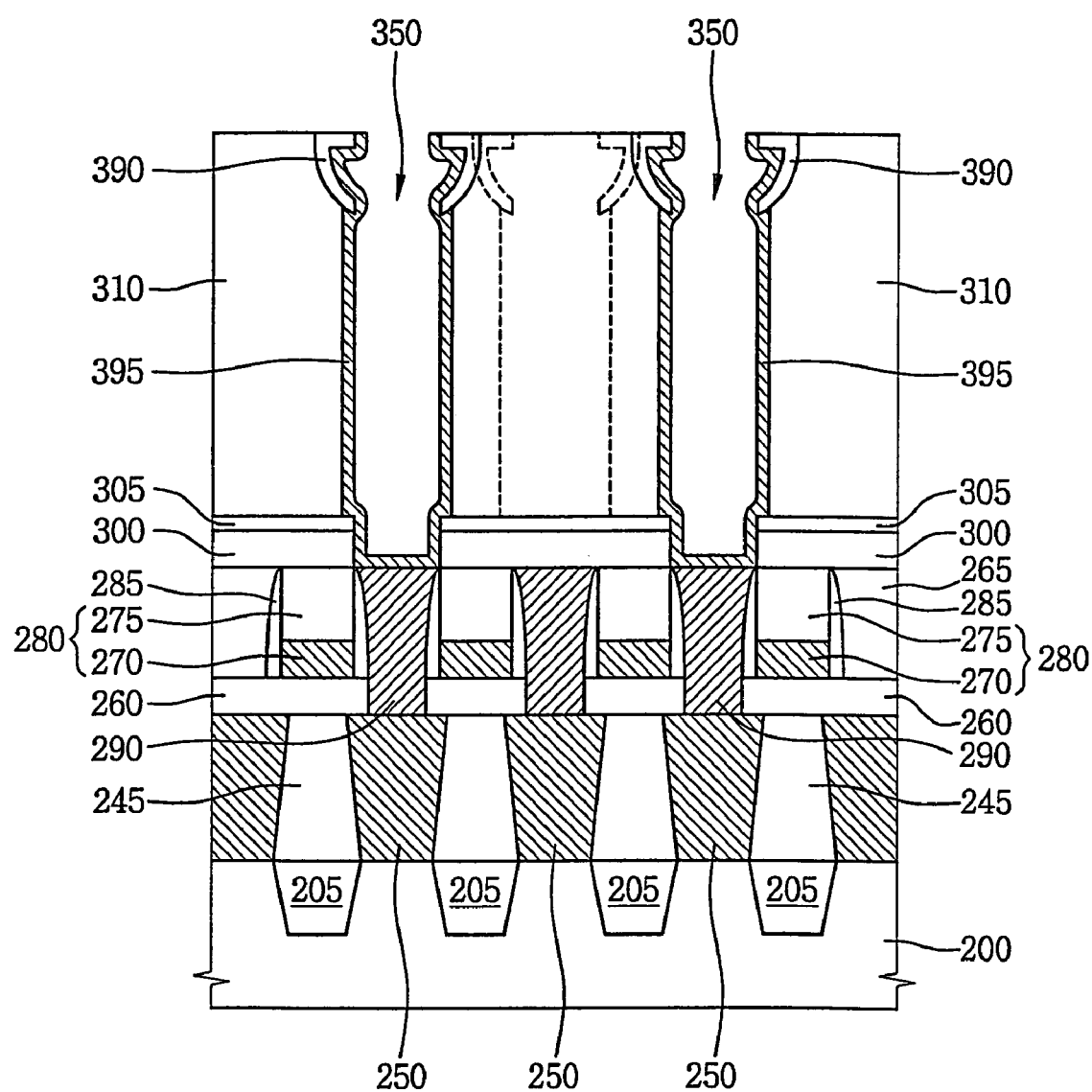
Figure 36:
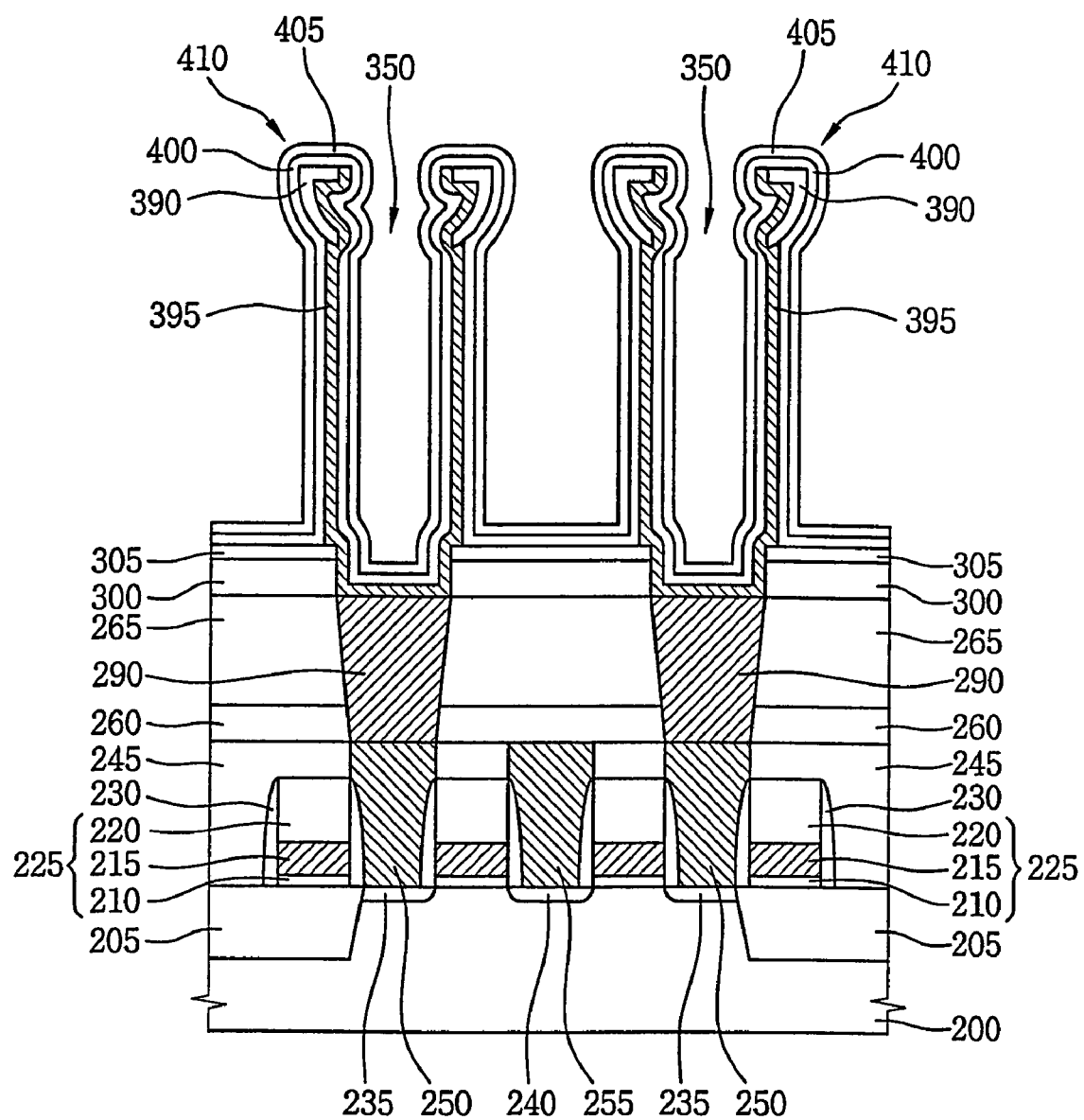
Figure 37:
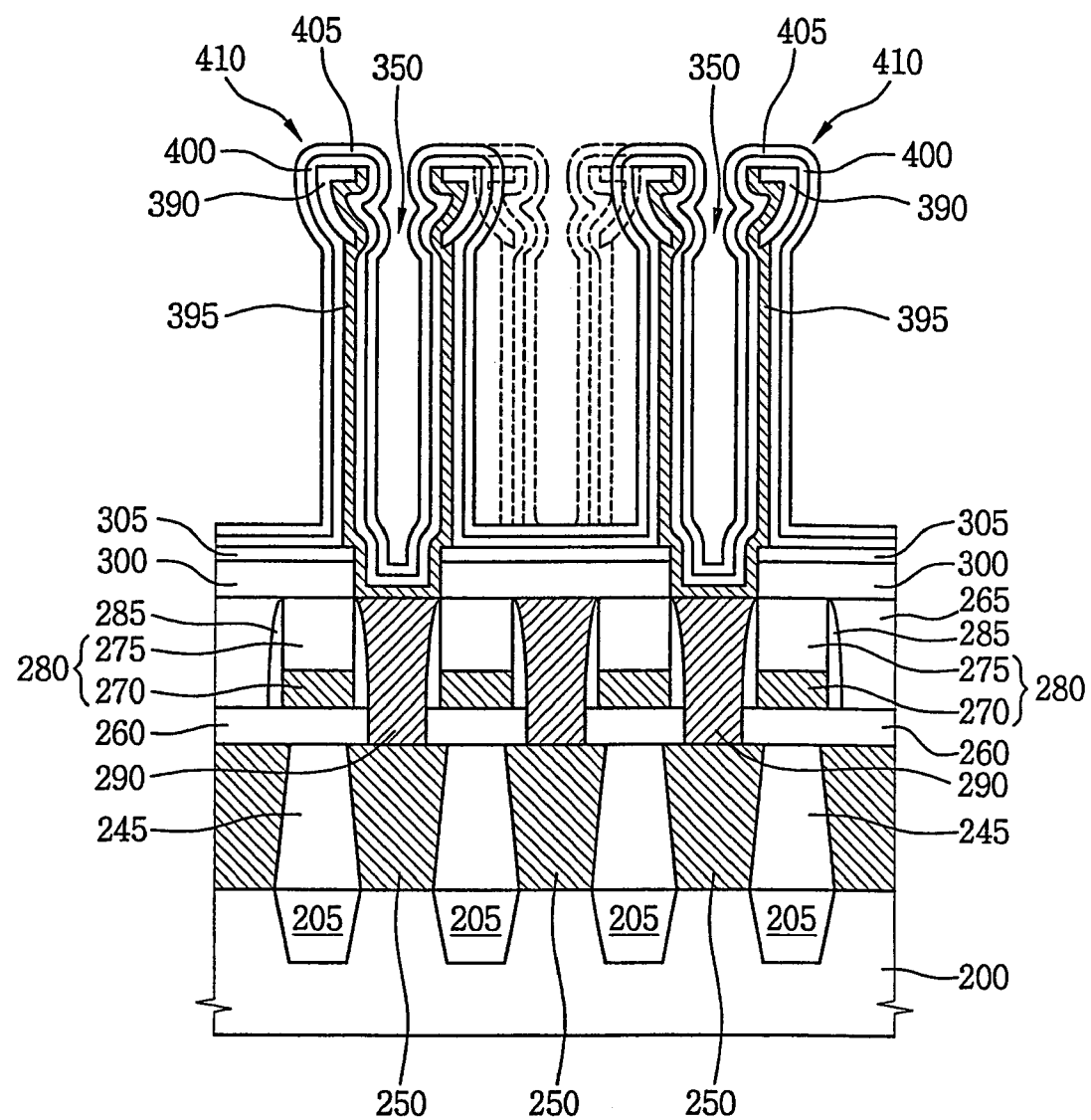

FIGS. 32 to 37 are cross sectional views illustrating a method of manufacturing a semiconductor device including capacitors in accordance with one embodiment of the present invention. In this embodiment, fifth contact holes 350 are formed through a mold layer 310 by a process substantially identical to that of the above-described method with reference to FIGS. 3 to 22. FIGS. 32, 34 and 36 are cross sectional views illustrating the semiconductor device taken along the first direction substantially parallel to the bit lines 280, and FIGS. 33, 35 and 37 are cross sectional views illustrating the semiconductor device taken along the second direction substantially parallel to the word lines 233.

FIGS. 32 and 33 are cross sectional views illustrating a step for forming a fifth conductive layer 355.

Referring to FIGS. 32 and 33, the fifth conductive layer 355 is formed on the exposed fourth pads 290, on the sidewalls of the extended fifth contact holes 350, on the storage node mask pattern 320, and beneath the bottom portions of the second insulation layer patterns 338. The fifth conductive layer 355 may be formed using conductive material such as polysilicon doped with impurities, titanium/titanium nitride or copper.

FIGS. 34 and 35 are cross sectional views illustrating steps for forming stabilizing members 390 and storage electrodes 395.

Referring to FIGS. 34 and 35, the fifth conductive layer 355 and the storage node mask pattern 320 are etched by a CMP process, an etch back process or a combination process of CMP and etch back until the mold layer 310 is exposed, thereby simultaneously forming the storage electrodes 395 and the stabilizing members 390 that encompass upper portions of the storage electrodes 395, respectively. Here, each of the stabilizing members 390 has a structure substantially identical to that of the second insulation layer pattern 338. That is, the stabilizing member 390 has a ring-shaped structure or a bowl-shaped structure including an opened bottom portion. An upper portion of the stabilizing member 390 is horizontally bent toward the fifth contact hole 350. Additionally, upper portions of the stabilizing member 390 is wider than a lower portion. A sidewall of the stabilizing member 390 is rounded by the predetermined curvature substantially identical to that of the second opening 330 shown in FIGS. 12 and 13.

According to the present embodiment, the stabilizing members 390 are more firmly attached to the storage electrodes 395 because the stabilizing members 390 and the storage electrodes 395 are mutually partially embedded in one another. This mechanical interaction is at a higher degree than the case of the stabilizing member 340 with the storage electrode 360. In other words, upper portions of the stabilizing members 390 partially embed the upper portions of the storage electrodes 395, and the upper portions of the storage electrodes 395 partially embed the sidewalls of the stabilizing members 390. As a result, bottom portions of the stabilizing members 390 are supported by the storage electrodes 395. Thus, the stabilizing members 390 are very firmly fixed to the upper portion of the storage electrodes 395.

FIGS. 36 and 37 are cross sectional views illustrating steps for forming the capacitors 410.

Referring to FIGS. 36 and 37, after the mold layer 310 is removed by a dry or wet etching process, dielectric layers 400 and plate electrodes 405 are subsequently formed on the storage electrodes 395 when the stabilizing members 390 are fixed to the storage electrodes 395 so that capacitors 410 are formed over the semiconductor substrate 200.

A fifth insulating interlayer (not shown) is formed on the capacitors 410 to electrically isolate the capacitors 410 from an upper wiring (not shown) successively formed thereon. When the upper wiring is formed on the fifth insulating interlayer, the semiconductor device including the capacitors 410 is completed.

FIGS. 38 to 45 are cross sectional views illustrating a method of manufacturing a semiconductor device including capacitors in accordance with another embodiment of the present invention. In the present embodiment, second openings 330 are formed at upper portions of a mold layer 310 by a process substantially identical to that of the above-described method with reference to FIGS. 3 to 13. FIGS. 38, 40, 42 and 44 are cross sectional views illustrating the semiconductor device taken along the first direction substantially parallel to the bit lines 280, and FIGS. 39, 41, 43 and 45 are cross sectional views illustrating the semiconductor device taken along the second direction substantially parallel to the word lines 233.

Figure 38:
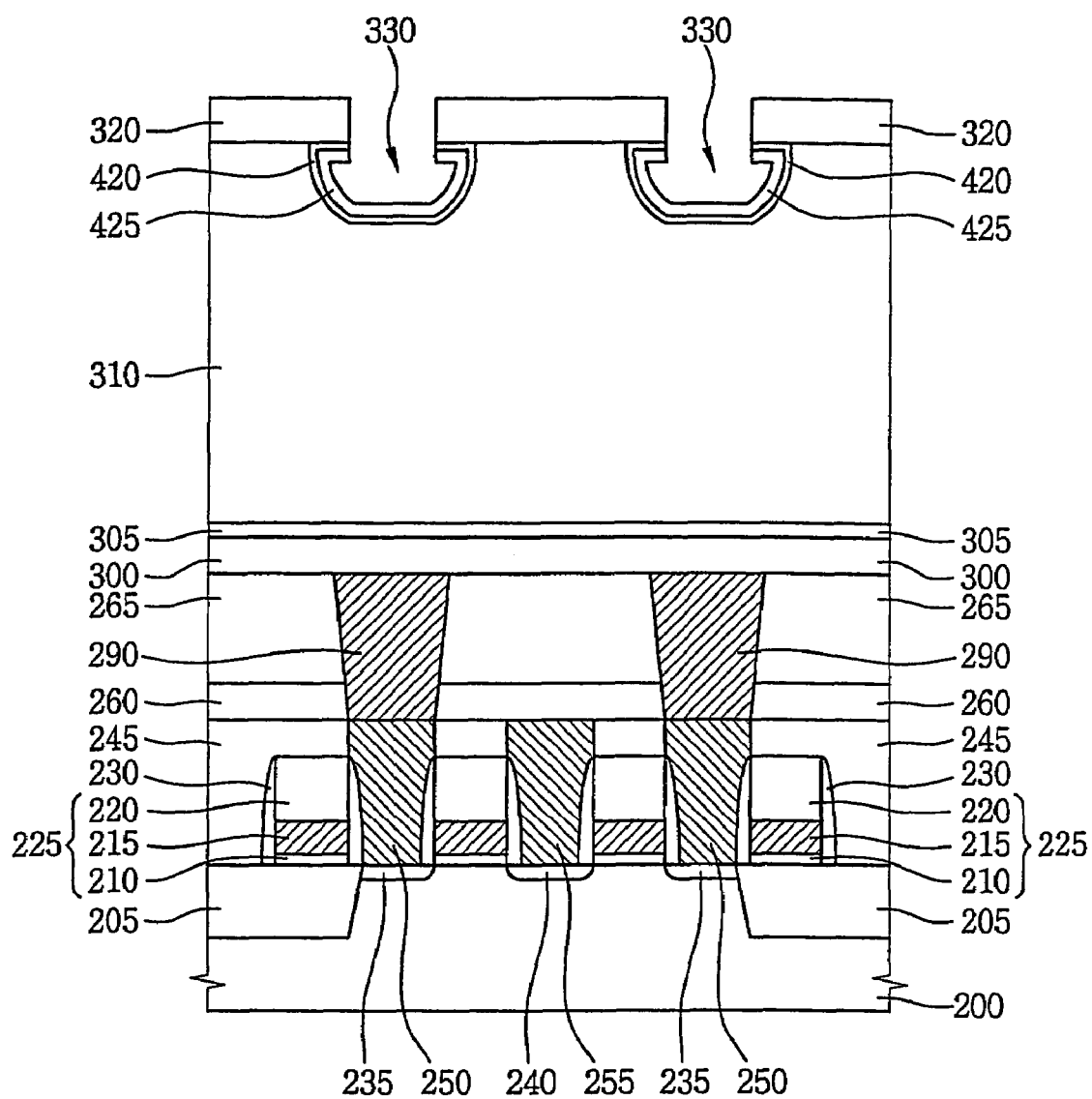
FIGS. 38 to 45 are cross-sectional views illustrating a method of a semiconductor device including capacitors in accordance with another embodiment of the present invention.
Figure 39:
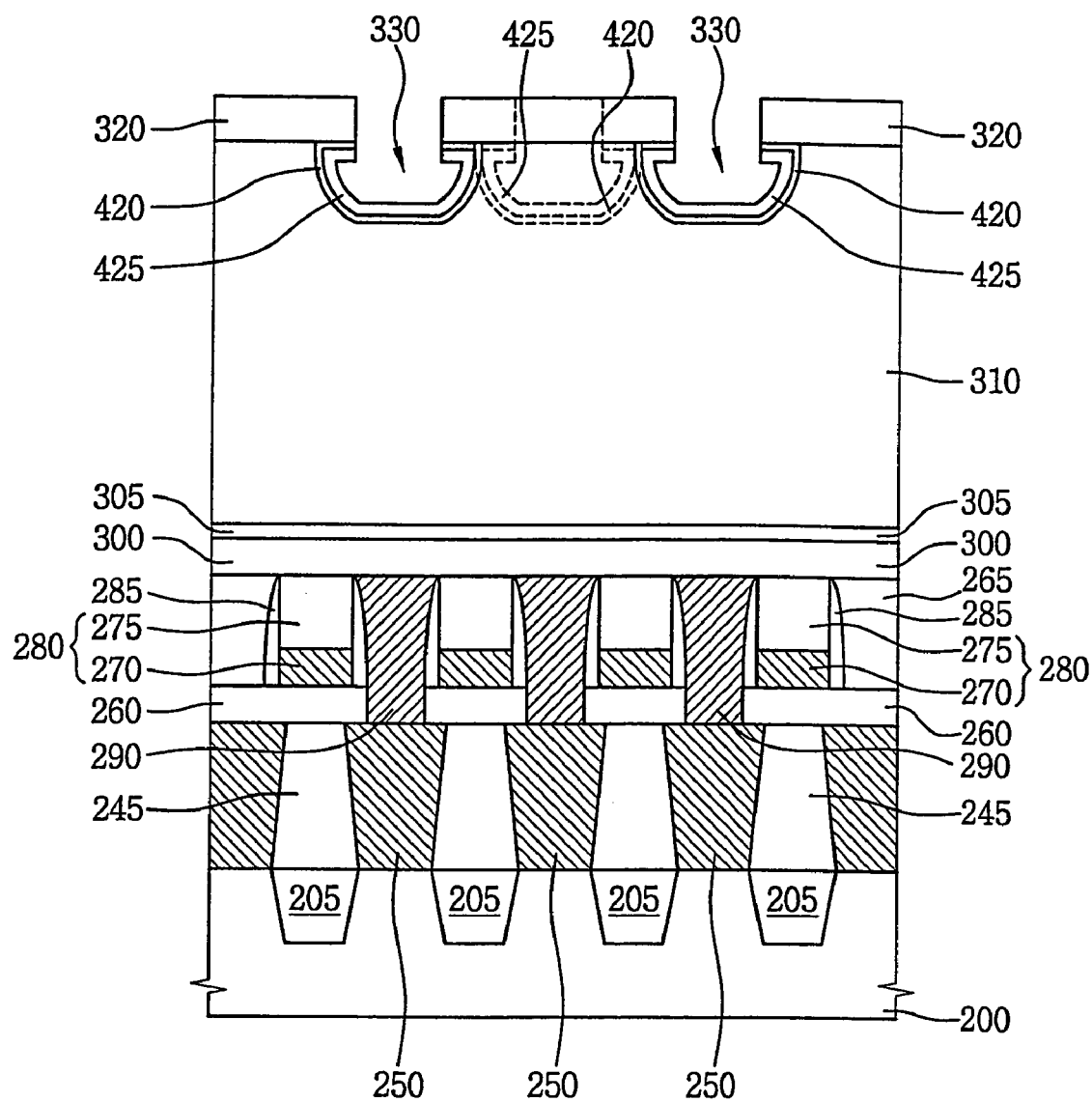

FIGS. 38 and 39 are cross sectional views illustrating steps for forming first protecting layer patterns 420 and first insulation layer patterns 425.

Referring to FIGS. 38 and 39, a protecting layer and a fourth insulation layer are successively formed on the storage node mask 320 and on the sidewalls and bottoms of the second openings 330 having the extended depth and width. The protecting layer may be formed using a material that has a relatively high resistance to the LAL solution. For example, the protecting layer includes metal oxide such as tantalum oxide. The protecting layer will be patterned to form protecting members 440 (see FIGS. 42 and 43). The fourth insulation layer may be formed using nitride such as silicon nitride, and will be patterned to form stabilizing members 445 (see FIGS. 42 and 43).

The protecting and fourth insulation layers are etched by a CMP process, an etch back process or a combination process of CMP and etch back until the storage node mask pattern 320 is exposed, thereby successively forming the first protecting layer patterns 420 and the first insulation layer patterns 425 on the sidewalls and bottoms of the second openings 330. The first protecting layer patterns 420 and the first insulation layer patterns 425 have ring-shaped cross sections or bowl structures with rounded sidewalls with predetermined curvatures in accordance with the structures of the second openings 330. Additionally, the first protecting layer patterns 420 and the first insulation layer patterns 425 are partially formed beneath the storage node mask pattern 320 so that upper portions of the first protecting layer patterns 420 and the first insulation layer patterns 425 are inwardly bent in a horizontal direction relative to the substrate 200. In this embodiment, because the protecting members 440 of metal oxide encompass the stabilizing members 445 of nitride, the stabilizing members 445 may not be damaged when the mold layer 310 is removed using the LAL solution. Hence, capacitors 480 (see FIGS. 44 and 45) may stably support one another by interposing the stabilizing members 445.

Figure 40:
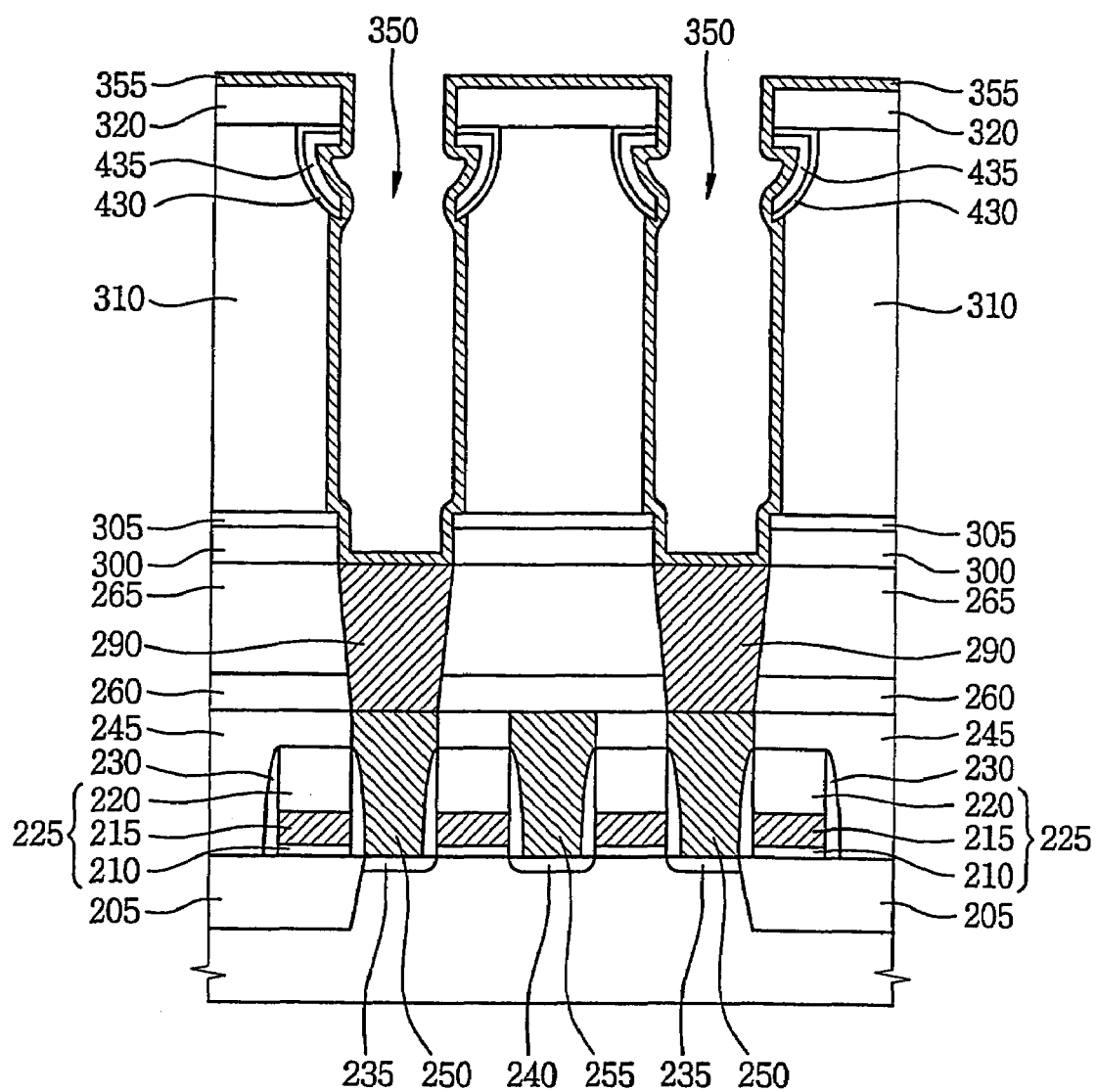
Figure 41:
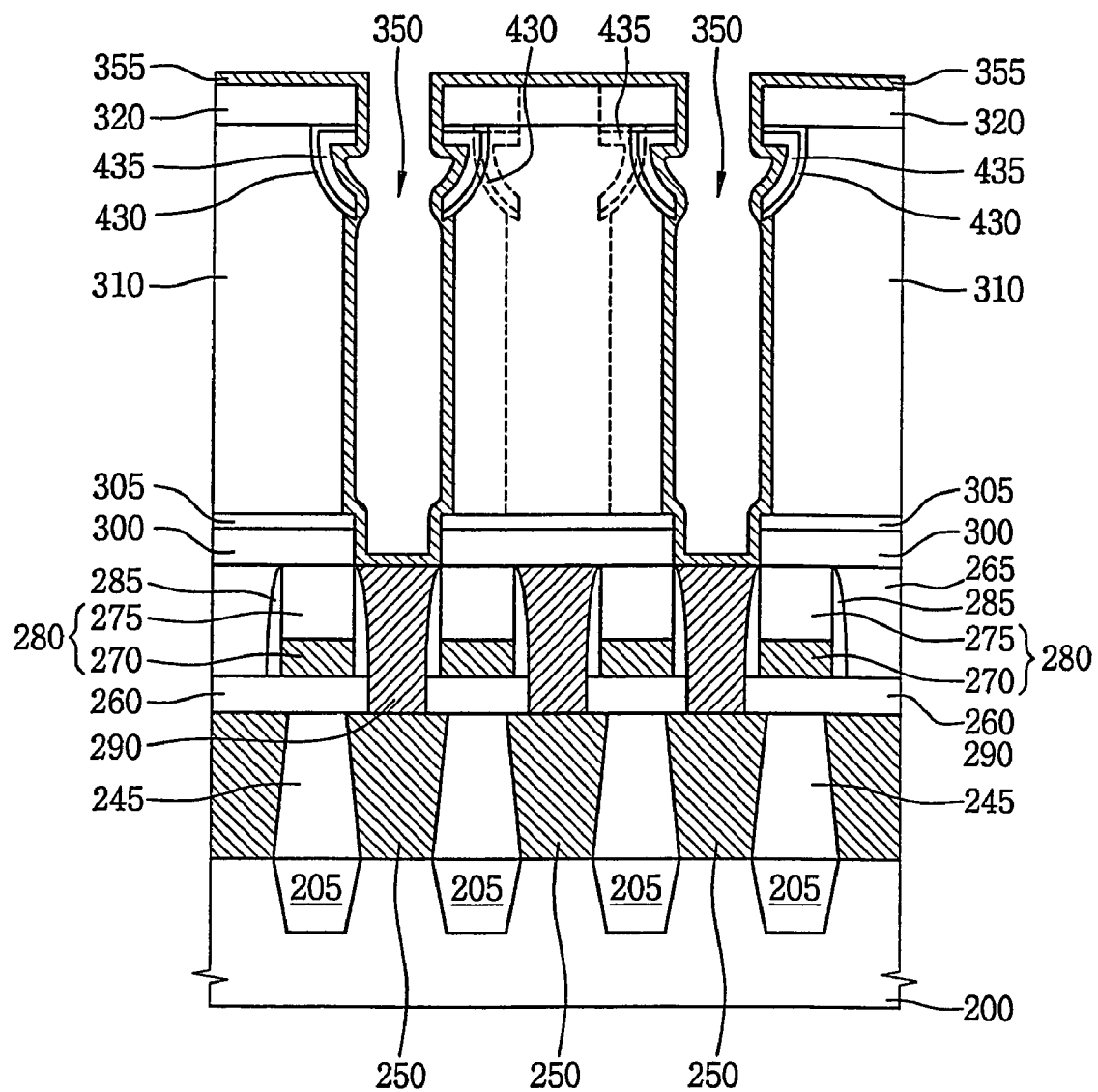

FIGS. 40 and 41 are cross sectional views illustrating steps for forming fifth contact holes 350 and a fifth conductive layer 355.

Referring to FIGS. 40 and 41, successively using the storage node mask pattern 320 as an etching mask, the first protecting layer patterns 420 and the first insulation layer patterns 425 on the bottoms of the second openings 330 are partially etched to thereby form second insulation layer patterns 435 and second protecting layer patterns 430 on the sidewalls of the second openings 330. Simultaneously, the mold layer 310, the etching stop layer 305, and the fourth insulating interlayer 300 are partially etched until the fourth pads 290 are exposed to form fourth contact holes (not shown) that expose the fourth pads 290. Here, the second insulation layer patterns 435 and the second protecting layer patterns 430 are positioned at upper portions of the fourth contact holes having first diameters. When the fourth contact holes are formed, the first protecting layer patterns 420 and the first insulating layer patterns 425 are partially etched to form the second protecting layer patterns 430 and the second insulation layer patterns 435 having ring-shaped structures or bowl structures that include opened bottom portions, respectively. As described above, the second protecting layer patterns 430 and the second insulation layer patterns 435 have rounded sidewalls with the predetermined curvature in accordance with the second openings 330. Upper portions of the second protecting layer patterns 430 and the second insulation layer patterns 435 are wider than lower portions of the second protecting layer patterns 430 and the second insulation layer patterns 435. Namely, the second protecting layer patterns 430 and the second insulation layer patterns 435 have extended upper portions, respectively. The upper portions of the second protecting layer patterns 430 and the second insulation layer patterns 435 are horizontally bent toward the fifth contact holes.

The semiconductor substrate 200 including the fourth contact holes is cleaned by the above-described cleaning process, thereby forming the fifth contact holes 350 that have extended second diameters. After the fifth contact holes 350 are formed through the mold layer 310, bottom portions of the second protecting layer patterns 430 and the second insulation layer patterns 435 are entirely or partially exposed through the fifth contact holes 350. These exposed bottom portions of the second protecting layer patterns 430 and the second insulation layer patterns 435 are supported by storage electrodes 450 (see FIGS. 42 and 43) as described above.

The fifth conductive layer 355 is formed on the fourth pads 290, on sidewalls of the fifth contact holes 350, on sidewalls of the second insulation layer patterns 435, and on the storage node mask pattern 320. The fifth conductive layer 355 is also formed beneath the exposed bottom portions of the second protecting layer patterns 430 and the second insulation layer patterns 435. The fifth conductive layer may be formed using conductive material such as doped polysilicon, titanium/titanium nitride, or copper. The second protecting layer patterns 430 and the second insulation layer patterns 435 are attached to the fifth conductive layer 355, and the second protecting layer patterns 430 and the second insulation layer patterns 435 are supported by the fifth conductive layer 355. Hence, the second protecting layer patterns 430 and the second insulation layer patterns 435 are firmly fixed to the fifth conductive layer 355.

Figure 42:
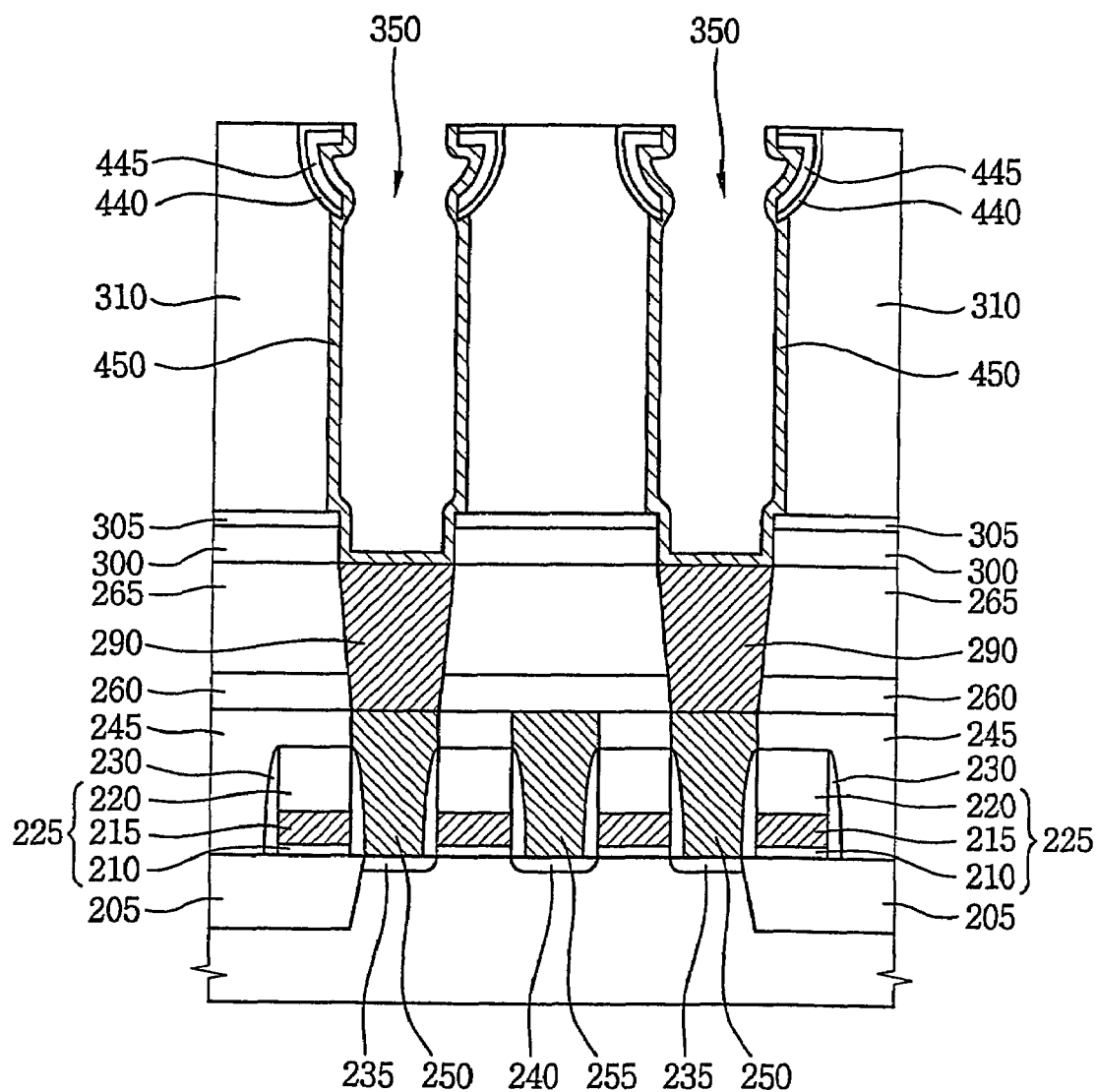
Figure 43:
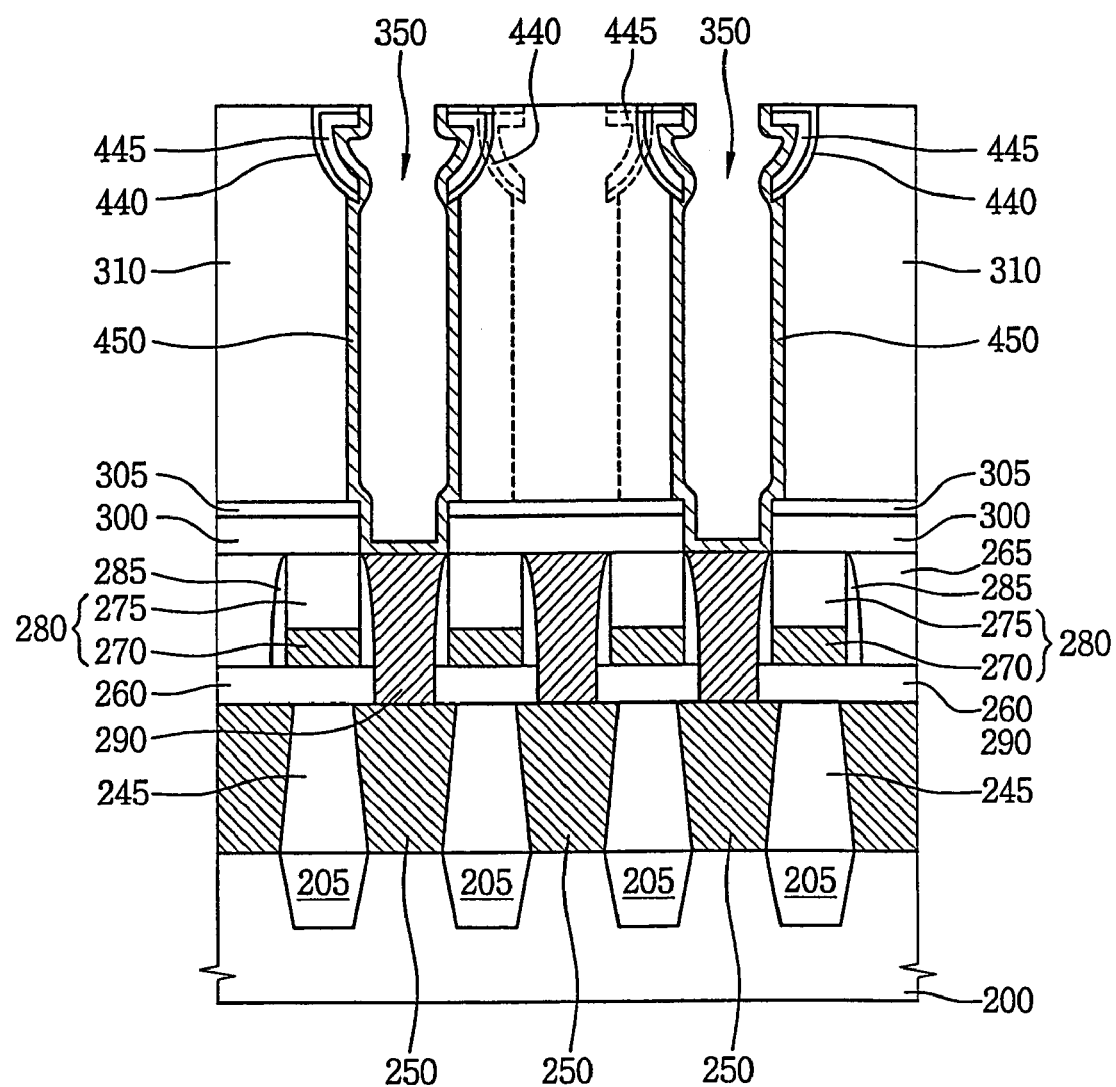

FIGS. 42 and 43 are cross sectional views illustrating steps for forming the protecting members 440, the stabilizing members 445 and the storage electrodes 450.

Referring to FIGS. 42 and 43, the storage node mask pattern 320 and the fifth conductive layer 355 are etched by a CMP process, an etch back process or a combination process of CMP and etch back until the mold layer 310 is exposed. Thus, the storage electrodes 450 are formed on the sidewalls of the fifth contact holes 335, and the stabilizing members 445 encompassing the storage electrodes 450 are simultaneously formed. Additionally, the protecting members 440 are simultaneously formed to encompass the stabilizing members 445. The stabilizing members 445 and the protecting members 440 of this embodiment have ring structures or bowl structures that have opened bottom portions and rounded sidewalls, respectively. As described above, the stabilizing members 445 of nitride are encompassed by the protecting members 440 of metal oxide, which have a good resistance relative to the LAL solution so that the stabilizing members 445 may be effectively protected without consuming the stabilizing members 445 in a subsequent etching process for removing the mold layer 310. Therefore, the capacitors 480 including the stabilizing members 445 and the protecting members 440 may not mechanically collapse toward one another.

Figure 44:
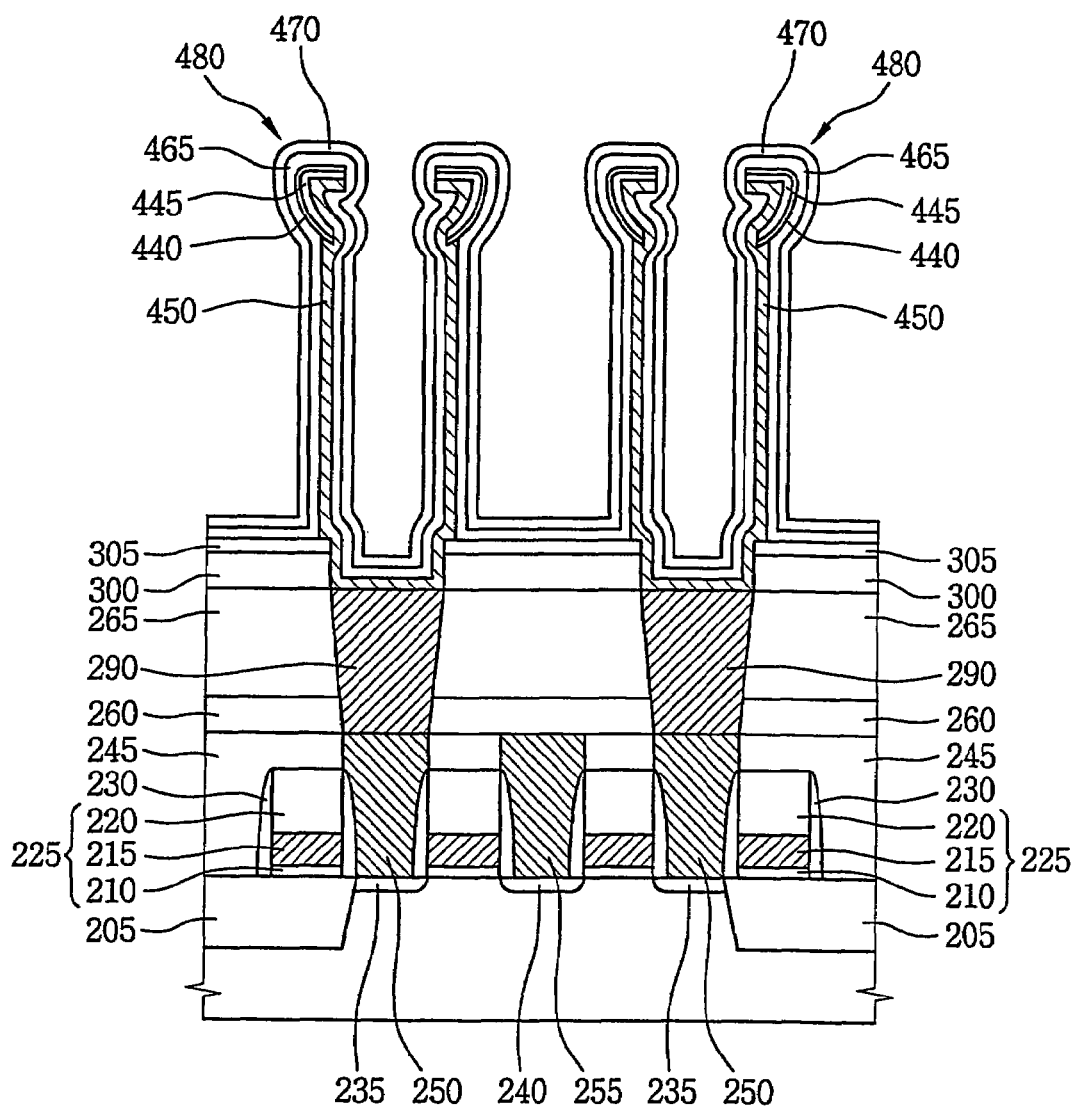
Figure 45:
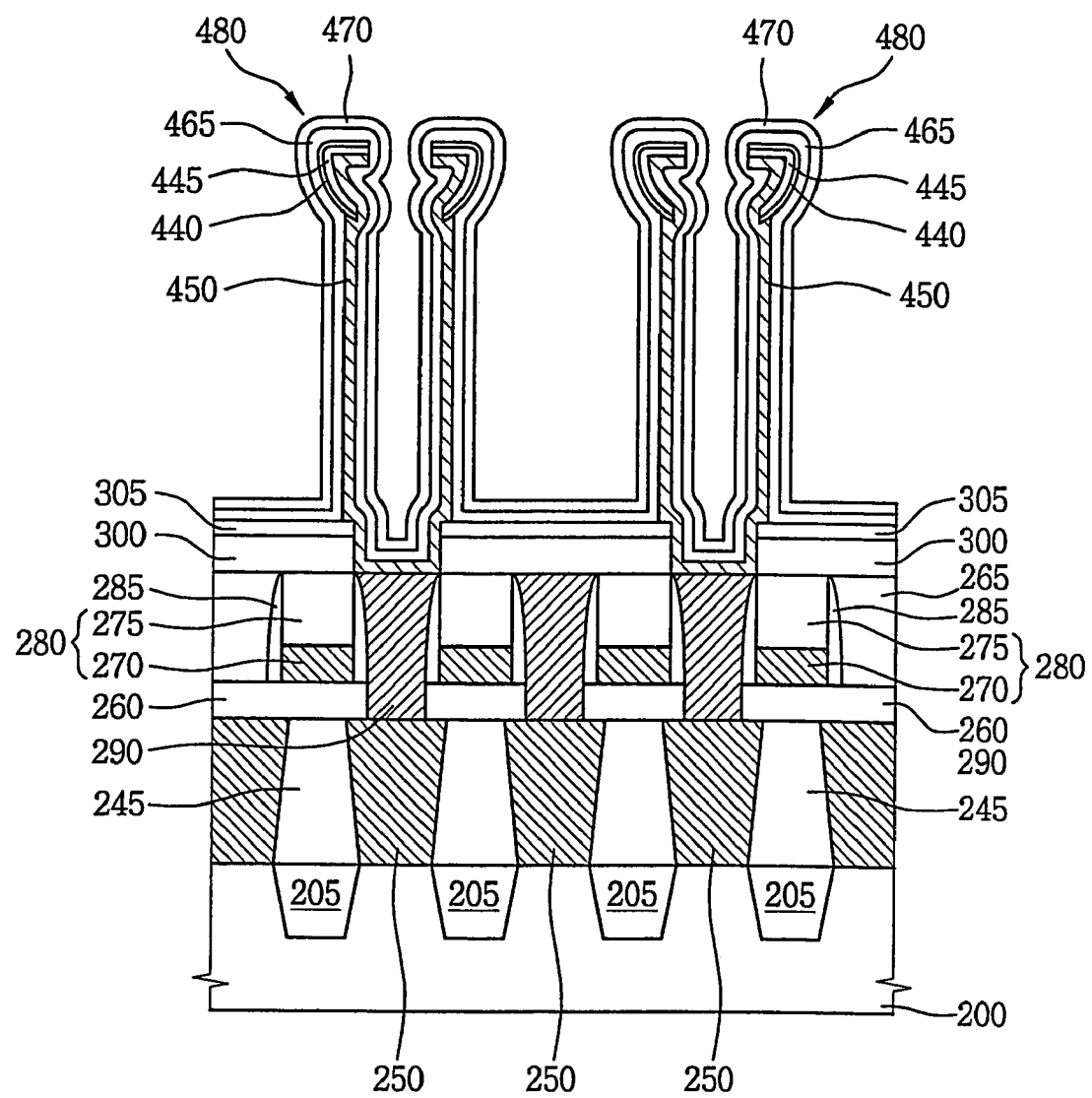

FIGS. 44 and 45 are cross sectional views illustrating steps for forming the capacitors 480.

Referring to FIGS. 44 and 45, after the mold layer 310 is removed by a wet etching process using LAL solution as an etching solution, dielectric layers 465 and plate electrodes 470 are subsequently formed on the storage electrodes 450 when the stabilizing members 445 and the protecting members 440 are fixed to the storage electrodes 450 so that capacitors 480 are formed over the semiconductor substrate 200.

A fifth insulating interlayer (not shown) is formed on the capacitors 480 to electrically isolate the capacitors 480 from an upper wiring (not shown) successively formed thereon. When the upper wiring is formed on the fifth insulating interlayer, the semiconductor device including the capacitors 480 is completed.

According to the present invention, stabilizing members are formed to encompass upper portions of cylindrical storage electrodes so that the storage electrodes of a unit memory cell are supported by one another. Thus, capacitors including the storage electrode and the stabilizing members may have improved structural stability without mechanical collapse of the capacitors when the capacitors have extremely high aspect ratio. As a result, a semiconductor device including the capacitors may have improved reliability, and throughput of a semiconductor manufacturing process may be increased.

Meanwhile, since the stabilizing members are formed using material that has a high resistance to an LAL solution, or protecting members enclosing the stabilizing members are formed using metal oxide that has a high resistance to an LAL solution, the storage electrodes may more stably support one another by interposing the stabilizing members without damage to the stabilizing members, thereby greatly increasing the structural stability of the capacitors.

In addition, the capacitors may have primarily improved capacitance because the stabilizing members having extended bowl structures, or ring structures, that enlarge the area of the storage electrodes. Furthermore, the storage electrodes are formed on sidewalls of contact holes having extended area by a cleaning process so that the storage electrodes have secondarily enlarged area. As a result, the capacitors including the storage electrodes may have greatly improved capacitance.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A capacitor comprising:
    a storage electrode including polysilicon doped with first impurities;
    a dielectric layer formed on the storage electrode;
    a plate electrode formed on the dielectric layer;
    a stabilizing member fixed to the storage electrode for structurally stabilizing the storage electrode, and including polysilicon doped with second impurities.

2. The capacitor of claim 1, wherein the stabilizing member is connected to an adjacent stabilizing member of an adjacent capacitor.

3. The capacitor of claim 2, wherein the stabilizing member and the adjacent stabilizing member are connected to each other along a diagonal direction relative to a direction where the storage electrode and an adjacent electrode are arranged.

4. The capacitor of claim 1, wherein the stabilizing member is fixed at an upper portion of the storage electrode.

5. The capacitor of claim 4, wherein the stabilizing member has an upper portion wider than a lower portion of the stabilizing member.

6. The capacitor of claim 5, wherein the storage electrode has a cylindrical shape.

7. The capacitor of claim 6, wherein the storage electrode has an upper portion wider than a lower portion of the storage electrode in accordance with the stabilizing member.

8. The capacitor of claim 7, wherein an inside of the stabilizing member is partially embedded in the storage electrode, and the lower portion of the stabilizing member is supported by the storage electrode.

9. The capacitor of claim 8, wherein the upper portion of the stabilizing member encompasses the storage electrode.

10. The capacitor of claim 5, wherein the stabilizing member encompasses the upper portion of the storage electrode.

11. The capacitor of claim 10, wherein the stabilizing member has a ring shape.

12. The capacitor of claim 10, wherein the stabilizing member has a bowl shape having an opened bottom portion.

13. The capacitor of claim 1, wherein the stabilizing member is resistant to an LAL solution.

14. The capacitor of claim 1, wherein the first impurities are P type impurities, and the second impurities are N type impurities.

15. The capacitor of claim 14, wherein the first impurities comprise phosphor(P) or arsenic(As), and the second impurities comprise boron(B) or gallium(Ga).

16. A capacitor comprising:

a cylindrical storage electrode;

a dielectric layer formed on the storage electrode;

a plate electrode formed on the dielectric layer; and a ring-shaped structure fixed to an upper portion of the storage electrode, wherein the ring-shaped structure has an extended upper portion wider than a lower portion of the ring-shaped structure, and wherein the ring-shaped structure and an adjacent ring-shaped structure of an adjacent capacitor are connected with each other along a diagonal direction relative to a direction where the storage electrode and an adjacent storage electrode are arranged.

17. The capacitor of claim 16, wherein a sidewall of the ring-shaped structure is partially embedded in the storage electrode, and the lower portion of the ring-shaped structure is supported by the storage electrode.

* * * * *